(12) United States Patent
Omata et al.

(10) Patent No.: US 8,985,173 B2
(45) Date of Patent: Mar. 24, 2015

(54) MANUFACTURING METHOD AND MANUFACTURING APPARATUS OF SEMICONDUCTOR SUBSTRATE

(75) Inventors: Takatsugu Omata, Isehara (JP); Tomoaki Moriwaka, Isehara (JP); Hideto Ohnuma, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 887 days.

(21) Appl. No.: 13/110,950

(22) Filed: May 19, 2011

(65) Prior Publication Data
US 2011/0214610 A1    Sep. 8, 2011

Related U.S. Application Data

(62) Division of application No. 12/350,984, filed on Jan. 9, 2009, now Pat. No. 7,947,570.

(30) Foreign Application Priority Data

Jan. 16, 2008    (JP) .................... 2008-007032

(51) Int. Cl.
*B32B 37/00*    (2006.01)
*H01L 21/18*    (2006.01)
*H01L 21/762*   (2006.01)

(52) U.S. Cl.
CPC ........ *H01L 21/187* (2013.01); *H01L 21/76254* (2013.01)
USPC ............................ 156/362; 156/499; 156/581

(58) Field of Classification Search
CPC .... B29C 65/78; B29C 65/7802; B29C 66/92; B29C 66/924
USPC ................. 156/228, 281, 362, 499, 580, 581, 156/583.1
See application file for complete search history.

(56) References Cited

U.S. PATENT DOCUMENTS

| | | | |
|---|---|---|---|
| 6,534,380 B1 | 3/2003 | Yamauchi et al. | |
| 6,893,311 B2 | 5/2005 | Lee et al. | |

(Continued)

FOREIGN PATENT DOCUMENTS

| | | |
|---|---|---|
| CN | 1447165 | 10/2003 |
| JP | 04-085839 | 3/1992 |

(Continued)

OTHER PUBLICATIONS

Chinese Office Action (Application No. 200910003311.2) Dated Oct. 26, 2012.

(Continued)

*Primary Examiner* — James Sells
(74) *Attorney, Agent, or Firm* — Eric J. Robinson; Robinson Intellectual Property Law Office, P.C.

(57) ABSTRACT

It is an object to provide a homogeneous semiconductor substrate in which defective bonding is reduced. Such a semiconductor substrate can be formed by the steps of: disposing a first substrate in a substrate bonding chamber which includes a substrate supporting base where a plurality of openings is provided, substrate supporting mechanisms provided in the plurality of openings, and raising and lowering mechanisms which raise and lower the substrate supporting mechanisms; disposing a second substrate over the first substrate so as not to be in contact with the first substrate; and bonding the first substrate to the second substrate by using the raising and lowering mechanisms to raise the substrate supporting mechanisms.

19 Claims, 25 Drawing Sheets

(56) References Cited

U.S. PATENT DOCUMENTS

| | | |
|---|---|---|
| 7,071,077 B2 | 7/2006 | Maleville et al. |
| 7,148,124 B1 | 12/2006 | Usenko |
| 7,426,951 B2 | 9/2008 | Lee et al. |
| 7,638,003 B2 | 12/2009 | Satoh et al. |
| 7,674,687 B2 | 3/2010 | Henley |
| 7,864,289 B2 | 1/2011 | Hwang et al. |
| 7,911,016 B2 | 3/2011 | Henley |
| 8,012,855 B2 | 9/2011 | Henley |
| 8,071,463 B2 | 12/2011 | Henley |
| 8,153,513 B2 | 4/2012 | Henley |
| 2003/0181124 A1 | 9/2003 | Lee et al. |
| 2006/0005920 A1* | 1/2006 | Muramoto et al. ........... 156/285 |
| 2007/0246450 A1 | 10/2007 | Cady et al. |
| 2007/0249098 A1 | 10/2007 | Cady et al. |
| 2008/0053619 A1* | 3/2008 | Nakayama et al. ........... 156/382 |
| 2008/0135127 A1* | 6/2008 | Hwang et al. ................... 141/65 |

FOREIGN PATENT DOCUMENTS

| | | |
|---|---|---|
| JP | 05-275300 | 10/1993 |
| JP | 05-326353 A | 12/1993 |
| JP | 08-069952 | 3/1996 |
| JP | 11-026334 A | 1/1999 |
| JP | 11-097379 | 4/1999 |
| JP | 2001-093787 A | 4/2001 |
| JP | 2004-327969 A | 11/2004 |
| JP | 2005-082443 | 3/2005 |
| JP | 2005-252244 A | 9/2005 |
| JP | 2007-189222 | 7/2007 |
| JP | 2009-507363 | 2/2009 |
| JP | 2009-534842 | 9/2009 |
| WO | WO-2007/014320 | 2/2007 |
| WO | WO-2007/127079 | 11/2007 |
| WO | WO-2007/127111 | 11/2007 |
| WO | WO-2008/014339 | 1/2008 |

OTHER PUBLICATIONS

Taiwanese Office Action (Application No. 98101376) Dated Mar. 31, 2014.

* cited by examiner

FIG. 1B
FIG. 1A
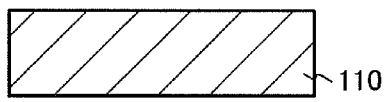
FIG. 1C
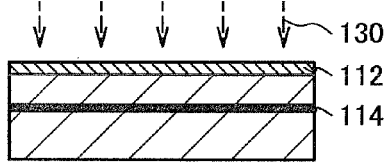
FIG. 1D
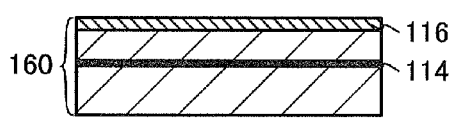
FIG. 1E
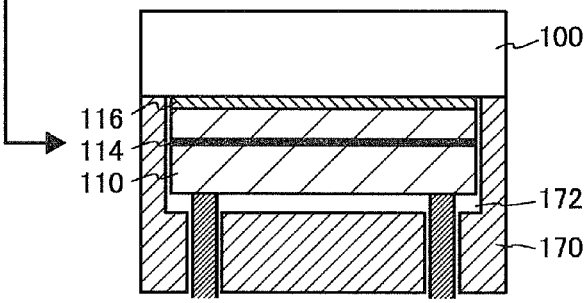
FIG. 1F
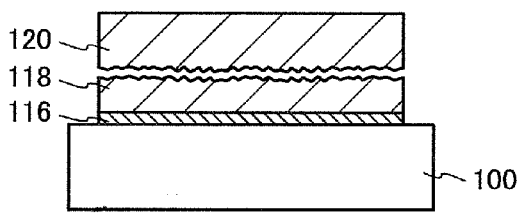

170
172
176
174

A    B 172
170
174
176
178
180

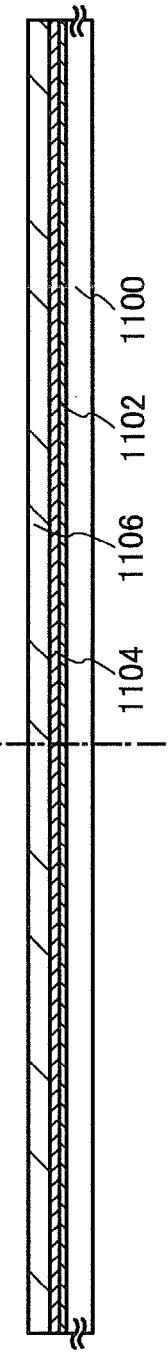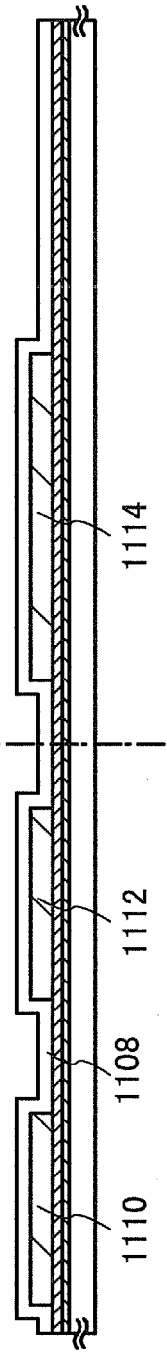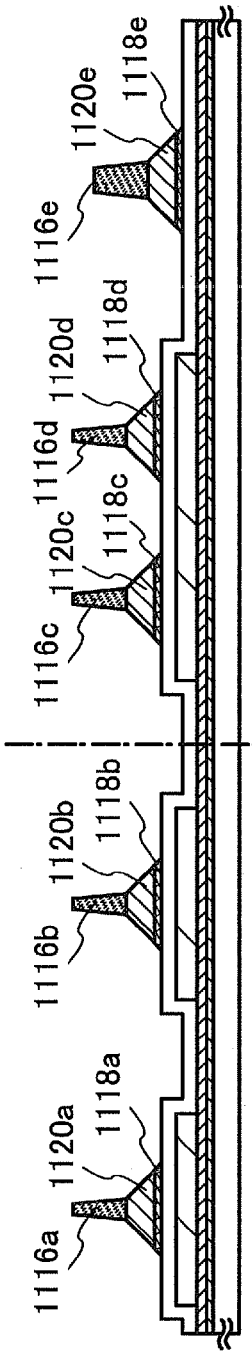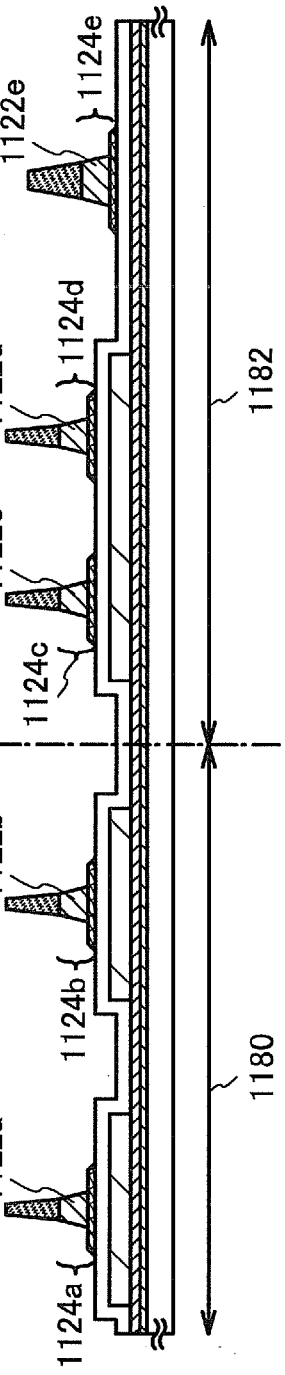

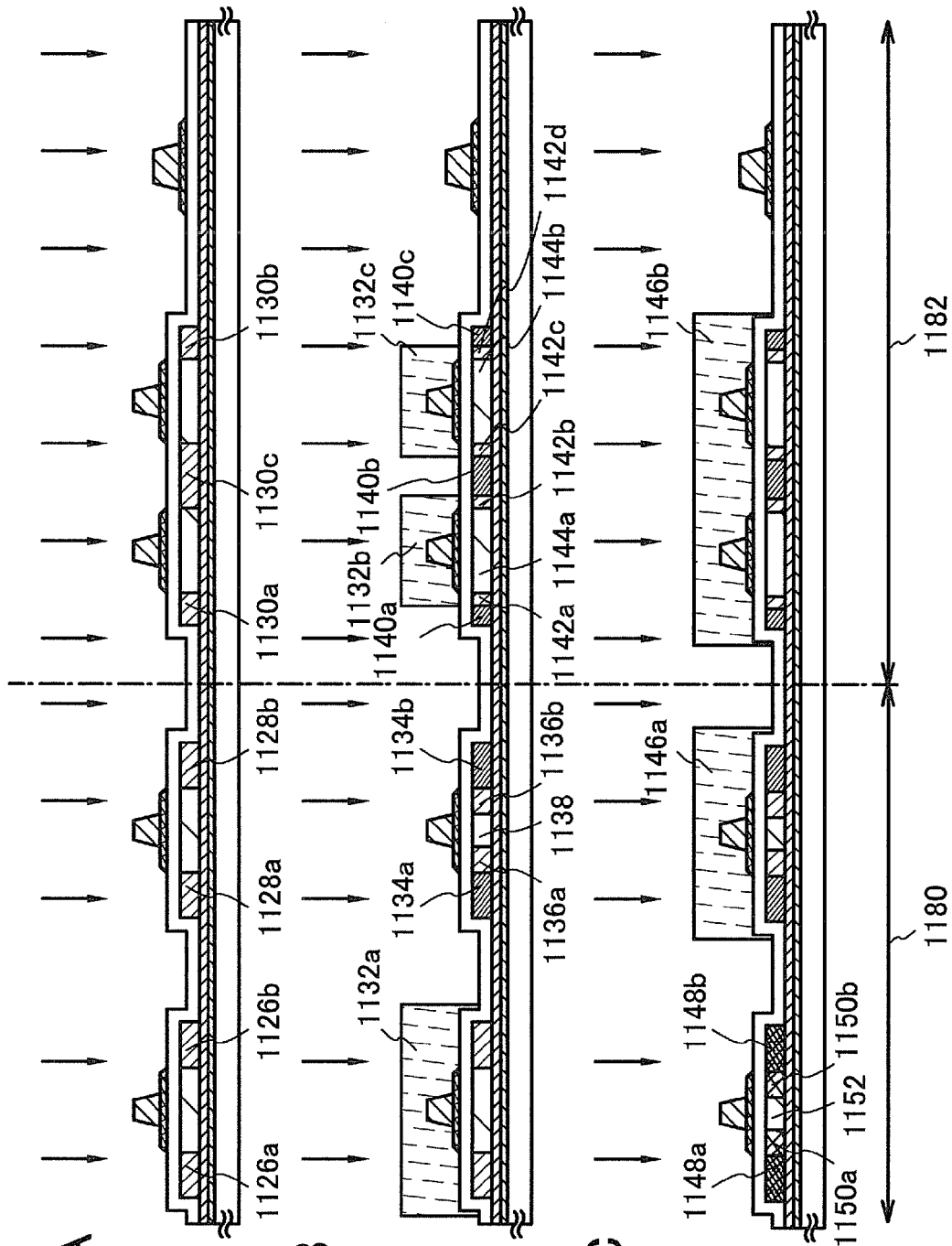

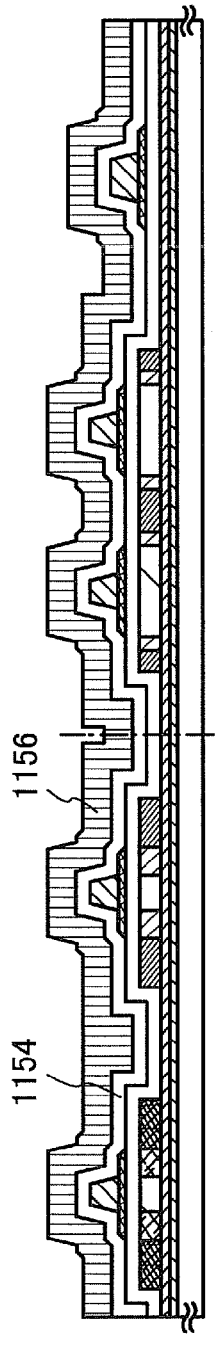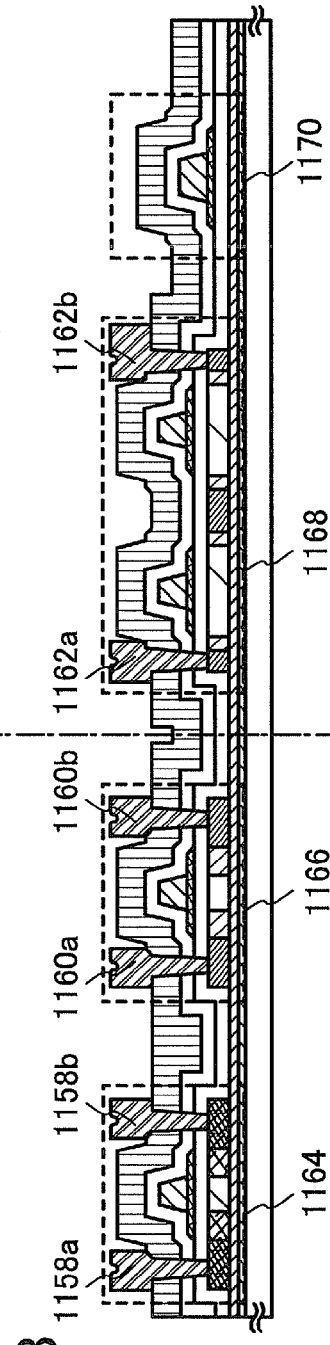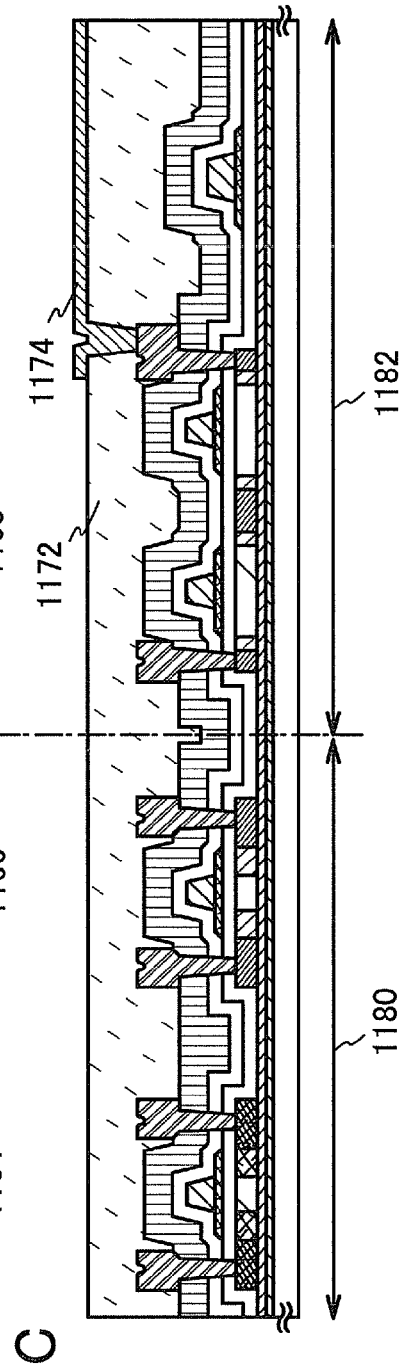
FIG. 13A
FIG. 13B
FIG. 13C

MANUFACTURING METHOD AND MANUFACTURING APPARATUS OF SEMICONDUCTOR SUBSTRATE

CROSS-REFERENCE TO RELATED APPLICATIONS

This application is a divisional of U.S. patent application Ser. No. 12/350,984, filed Jan. 9, 2009, now U.S. Pat. No. 7,947,570.

BACKGROUND OF THE INVENTION

1. Field of the Invention

The present invention relates to a manufacturing method and a manufacturing apparatus of a semiconductor substrate.

2. Description of the Related Art

In recent years, integrated circuits using an SOI (silicon on insulator) substrate, instead of using a bulk silicon substrate, have been developed. By utilizing characteristics of a thin single crystal silicon layer formed over an insulating layer, transistors formed in the integrated circuit can be electrically separated from each other completely. Further, each transistor can be formed as a fully-depleted transistor, and thus a semiconductor integrated circuit with high added value such as high integration, high speed driving, and low power consumption can be realized.

As a method for manufacturing an SOI substrate, a hydrogen-ion-implantation separation method in which hydrogen ion implantation and separation are combined is known. A typical process of a hydrogen-ion-implantation separation method will be described below.

First, hydrogen ions are implanted into a silicon substrate to form an ion implantation layer at a predetermined depth from the surface. Next, a silicon oxide film is formed by oxidizing another silicon substrate which serves as a base substrate. After that, the silicon substrate into which hydrogen ions are implanted is disposed in close contact with the silicon oxide film of the another silicon substrate, so that the two silicon substrates are bonded to each other. Then, by performing heat treatment, one of the silicon substrates is cleaved using the ion implantation layer as a cleavage plane.

There is a known method in which a single-crystal-silicon layer is formed over a glass substrate by using a hydrogen-ion-implantation separation method (e.g., Reference 1: Japanese Published Patent Application No. Hei 11-097379). In Reference 1, a separation plane is mechanically polished in order to remove a defect layer formed by ion implantation or a step which is several to several tens of nanometers in height in the separation plane.

SUMMARY OF THE INVENTION

As described above, as one of the problems in manufacturing a new semiconductor substrate by bonding substrates, defective bonding can be given. The bonding is performed by applying pressure to the substrates which are disposed in close contact with each other; however, the bonding state is largely changed depending on the state of bonded surfaces, the way of applying pressure in the bonding, or the like. For example, when the bonding is performed by applying even pressure to the entire surfaces of the substrates, since the bonding progresses from a plurality of regions at the same time, defective bonding due to trapping of air or a mismatch of the interface, or the like is likely to be generated.

Further, separation of the substrates after the bonding is also a serious problem. For example, when a silicon substrate is bonded to a glass substrate or the like which is easily bent, separation of the substrates is likely to be generated due to bending of the glass substrate in transfer after the bonding. This is caused by the difference in bending between the glass substrate and the silicon substrate.

These problems become more serious in the case of manufacturing a semiconductor substrate having a large area in which a plurality of silicon substrates is bonded to one base substrate. The larger the area of the semiconductor substrate is, the more silicon substrates need to be bonded, and the larger the area of the semiconductor substrate is, the more the base substrate is bent.

In view of the above-described problems, it is an object of the present invention to provide a homogeneous semiconductor substrate in which defective bonding is reduced. It is another object of the present invention to manufacture the semiconductor substrate with high yield and provide a manufacturing apparatus of the semiconductor substrate, which is suitable for the manufacturing method.

In the present invention, in order to solve the above-described problems, a semiconductor substrate is manufactured through the steps described below.

An aspect of the present invention is a manufacturing method of a semiconductor substrate, which includes the steps of: disposing a first substrate in a substrate arrangement region of a substrate bonding chamber having a substrate supporting base where a plurality of openings is provided in the substrate arrangement region, a substrate supporting mechanism which is provided in each of the plurality openings, a raising and lowering mechanism which raises and lowers the substrate supporting mechanism, and a position control mechanism which controls positions of the substrate supporting mechanism and the raising and lowering mechanism with respect to the substrate supporting base; disposing a second substrate over the first substrate so as not to be in contact with the first substrate; raising the first substrate by raising the substrate supporting mechanism, so that a distance between the first substrate and the second substrate is set to be less than or equal to a predetermined distance (for example, less than or equal to 1 mm); applying pressure to one of the corner portions of the first substrate with the use of the substrate supporting mechanism, so that the first substrate and the second substrate are bonded to each other from the one corner portion to which pressure is applied; and performing heat treatment at greater than or equal to 150° C. and less than or equal to 450° C. after the bonding and before transferring the first substrate and the second substrate.

In the above structure, a plurality of substrate arrangement regions may be provided in the substrate supporting base and the plurality of first substrates may be bonded to the second substrate. Further, in the above structure, pressure applied to one of the corner portions may be increased gradually.

Further, ultrasonic cleaning (including so-called megasonic cleaning with a frequency of 50 kHz to 5 MHz) and treatment using a chemical solution for attaching a hydrophilic group such as a hydroxyl group (for example, treatment using ozone water, or a mixed solution of ammonia water and a hydrogen peroxide solution (and water), or treatment using an oxidizer) are performed on (surfaces of) the first substrate and the second substrate, and then the first substrate and the second substrate can be bonded to each other.

Further, in the present invention, in order to solve the above-described problems, a manufacturing apparatus described below is provided.

An aspect of the present invention is a manufacturing apparatus of a semiconductor substrate, which includes a substrate supporting base where a plurality of openings is provided in an arrangement region of a first substrate; a supporting mechanism of the first substrate provided in each of the plurality of openings; a raising and lowering mechanism which changes a distance between the first substrate and a second substrate provided over the first substrate by raising and lowering the supporting mechanism; a position control mechanism which controls a relative positional relationship between the first substrate and the second substrate by controlling positions of the supporting mechanism and the raising and lowering mechanism with respect to the substrate supporting base; and a mechanism which performs heat treatment on the first substrate and the second substrate.

In the above, a plurality of arrangement regions of the first substrate may be provided in the substrate supporting base. Further, the raising and lowering mechanism is preferably a mechanism which can raise and lower the supporting mechanism provided in each of the plurality of openings independently. Further, the raising and lowering mechanism is preferably a mechanism which raises and lowers the supporting mechanism with the use of pressure of gas. Note that a portion of the supporting mechanism which is in contact with the first substrate can be formed using an elastic body.

Further, in the above, the manufacturing apparatus may include a treatment chamber where ultrasonic cleaning (including so-called megasonic cleaning with a frequency of 50 kHz to 5 MHz) and treatment using a chemical solution for attaching a hydrophilic group (for example, treatment using ozone water, or a mixed solution of ammonia water and a hydrogen peroxide solution (and water), or treatment using an oxidizer) are performed on the first substrate; a treatment chamber where ultrasonic cleaning (including so-called megasonic cleaning with a frequency of 50 kHz to 5 MHz) and treatment using a chemical solution for attaching a hydrophilic group (for example, treatment using ozone water, or a mixed solution of ammonia water and a hydrogen peroxide solution (and water), or treatment using an oxidizer) are performed on the second substrate; a transfer mechanism which transfers the first substrate; and a transfer mechanism which transfers the second substrate.

As described above, in the present invention, bonding is performed by applying pressure to one of the corner portions of the substrate. As a result of this, possibility of generation of defective bonding due to trapping of air, a mismatch of the interface, or the like can be reduced. Further, after the bonding and before transfer of the substrates, heat treatment is performed in order to strengthen the bonding of the substrates. As a result of this, separation of the substrates due to bending of the base substrate in transfer can be prevented. That is, by the manufacturing method and the manufacturing apparatus of the present invention, defective bonding can be reduced, so that a semiconductor substrate can be manufactured with high yield.

BRIEF DESCRIPTION OF THE DRAWINGS

In the accompanying drawings:

FIGS. 1A to 1F are views illustrating a manufacturing method of a semiconductor substrate;

FIGS. 11A to 11D are views illustrating manufacturing steps of a semiconductor device;

FIGS. 12A to 12C are views illustrating manufacturing steps of the semiconductor device;

FIGS. 13A to 13C are views illustrating manufacturing steps of the semiconductor device;

DETAILED DESCRIPTION OF THE INVENTION

Figure 2A:
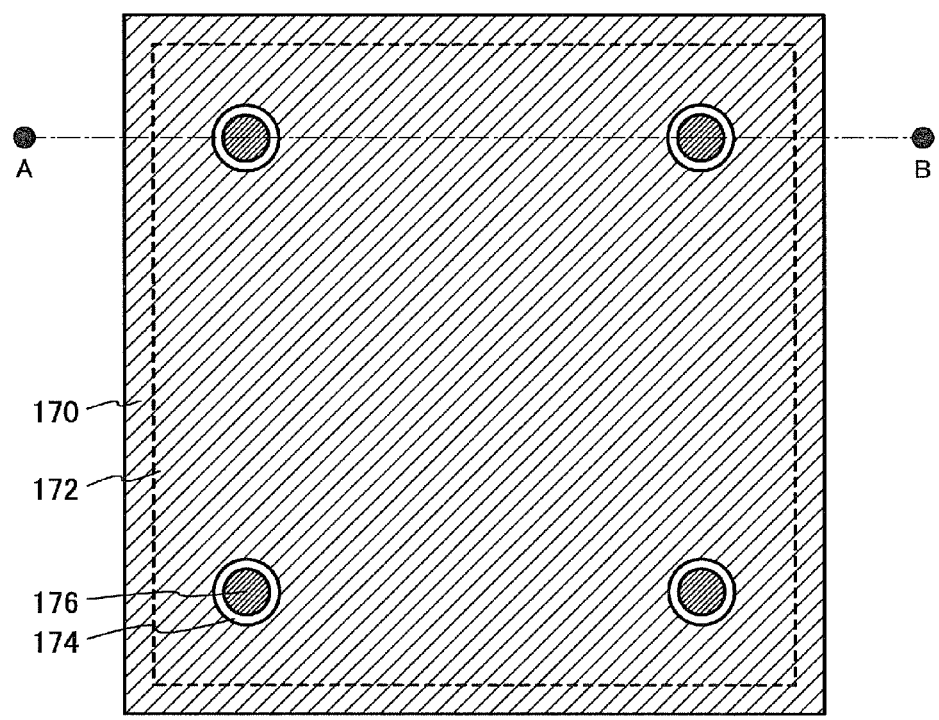
FIGS. 2A and 2B are views illustrating a manufacturing apparatus of the semiconductor substrate.

Embodiment modes of the present invention will be explained with reference to the drawings. However, the present invention is not limited to the following description. As is easily known to a person skilled in the art, the mode and the detail of the invention can be variously changed without departing from the spirit and the scope of the present invention. Therefore, the present invention is not interpreted as being limited to the following description of the embodiment modes. Note that in the structure of the present invention which is hereinafter described, the reference numerals denoting the same portions are used in common in different drawings. Further, in this specification, the semiconductor device indicates all the devices that operate by utilizing semiconductor characteristics.

Embodiment Mode 1

In this embodiment mode, an example of a manufacturing method of a semiconductor substrate of the present invention will be described with reference to FIGS. 1A to 1F, FIGS. 2A and 2B, FIGS. 3A to 3D, and FIGS. 4A to 4C.

First, a base substrate 100 is prepared (see FIG. 1A). As the base substrate 100, a light-transmitting glass substrate used for a liquid crystal display device or the like can be used. A substrate having a strain point of greater than or equal to 580° C. (preferably greater than or equal to 600° C.) may be preferably used as a glass substrate. Further, it is preferable that the glass substrate be a non-alkali glass substrate. As a material for the non-alkali glass substrate, a glass material such as aluminosilicate glass, aluminoborosilicate glass, or barium borosilicate glass is used, for example.

Note that, as the base substrate 100, in addition to the glass substrate, an insulating substrate which is formed of an insulating material, such as a ceramic substrate, a quartz substrate, or a sapphire substrate; a semiconductor substrate which is formed of a semiconductor material such as silicon; a conductive substrate which is formed of a conductive material such as metal or stainless steel; or the like can be used.

Although not shown in this embodiment mode, an insulating layer may be formed over a surface of the base substrate 100. By providing the insulating layer, even when an impurity (e.g. an alkali metal and an alkaline earth metal) is contained in the base substrate 100, the impurity can be prevented from being diffused into the semiconductor layer. The insulating layer may have a single-layer structure or a stacked-layer structure. As a material for the insulating layer, silicon oxide, silicon nitride, silicon oxynitride, silicon nitride oxide, aluminum oxide, aluminum nitride, aluminum oxynitride, aluminum nitride oxide, or the like can be given.

Note that in this specification, an oxynitride is a substance that contains more oxygen than nitrogen, and a nitride oxide is a substance that contains more nitrogen than oxygen. For example, silicon oxynitride is a substance including oxygen, nitrogen, silicon, and hydrogen in ranges of 50 at. % to 70 at. % inclusive, 0.5 at. % to 15 at. % inclusive, 25 at. % to 35 at. % inclusive, and 0.1 at. % to 10 at. % inclusive, respectively. Further, silicon nitride oxide is a substance including oxygen, nitrogen, silicon, and hydrogen in ranges of 5 at. % to 30 at. % inclusive, 20 at. % to 55 at. % inclusive, 25 at. % to 35 at. % inclusive, and 10 at. % to 25 at. % inclusive, respectively. The aforementioned ranges are ranges for cases measured using Rutherford backscattering spectrometry (RBS) and hydrogen forward scattering (HFS). Moreover, the total for the content ratio of the constituent elements does not exceed 100 at. %.

Next, a single crystal semiconductor substrate 110 is prepared (see FIG. 1B). A semiconductor substrate formed of a Group 4 element such as silicon or germanium, or a compound such as silicon germanium or silicon carbide can be used as the single crystal semiconductor substrate 110. Needless to say, a substrate made of a compound semiconductor such as gallium arsenide or indium phosphide may be used as well. In this embodiment mode, a single crystal silicon substrate is used as the single crystal semiconductor substrate 110. Although there is no limitation on the size or the shape of the single crystal semiconductor substrate 110, for example, it is preferable to process a circular semiconductor substrate of 8 inches (200 mm) in diameter, 12 inches (300 mm) in diameter, 18 inches (450 mm) in diameter or the like, into a rectangular shape and to use the processed substrate. Note that in this specification, the term "single crystal" indicates a crystal which has a regular crystal structure and crystal axes oriented in the same direction in all portions of the crystal. That is, it is not a matter of how many defects there are.

After cleaning the single crystal semiconductor substrate 110, an insulating layer 112 is formed over a surface of the single crystal semiconductor substrate 110. It is also possible that the insulating layer 112 is not provided; however, the insulating layer 112 is preferably provided in order to prevent contamination, surface damage, surface etching, or the like of the single crystal semiconductor substrate 110 due to ion irradiation. The thickness of the insulating layer 112 is preferably greater than equal to 0.5 nm and less than equal to 400 nm.

As a material of the insulating layer 112, an insulating material containing silicon or germanium as its composition, such as silicon oxide, silicon nitride, silicon oxynitride, silicon nitride oxide, germanium oxide, germanium nitride, germanium oxynitride, or germanium nitride oxide can be used. Further, a metal oxide such as aluminum oxide, tantalum oxide, or hafnium oxide; a metal nitride such as aluminum nitride; a metal oxynitride such as an aluminum oxynitride; or a metal nitride oxide such as an aluminum nitride oxide may also be used. The insulating layer 112 can be formed by a CVD method, a sputtering method, a method using oxidation (or nitridation) of the single crystal semiconductor substrate 110, or the like.

Next, an ion beam 130 including ions accelerated by an electric field is delivered to the single crystal semiconductor substrate 110 through the insulating layer 112, thereby forming a damaged region 114 in a region at a predetermined depth from the surface of the single crystal semiconductor substrate 110 (see FIG. 1C). The depth of the region where the damaged region 114 is formed can be controlled by the accelerating energy of the ion beam 130 and the incidence angle thereof. The damaged region 114 is formed in a region at a depth the same or substantially the same as the average penetration depth of ions.

Depending on the depth at which the damaged region 114 is formed, the thickness of the single crystal semiconductor layer which is separated from the single crystal semiconductor substrate 110 is determined. The depth at which the damaged region 114 is formed from the surface of the single crystal semiconductor substrate 110 is greater than or equal to 20 nm and less than or equal to 500 nm, and preferably greater than or equal to 30 nm and less than or equal to 200 nm.

An ion implantation apparatus or an ion doping apparatus can be used in order to irradiate the single crystal semiconductor substrate 110 with ions. In an ion implantation apparatus, a source gas is excited to produce ion species, the produced ion species are mass-separated, and ion species having a predetermined mass is implanted into a process object. In an ion doping apparatus, a process gas is excited to produce ion species, a process object is irradiated with the produced ion species which are not mass-separated. Note that an ion doping apparatus provided with a mass separator can perform ion irradiation with mass separation similarly to the ion implantation apparatus. In this specification, the use of either of an ion implantation apparatus and an ion doping apparatus is specified only when one of them definitely needs to be used, whereas in the case where there is no specific description, either of them may be used to perform ion irradiation.

The ion irradiation step in the case of using an ion doping apparatus can be performed in the following manner, for example.

Accelerating voltage: higher than or equal to 5 kV and lower than or equal to 100 kV (preferably equal to or higher than 30 kV and equal to or lower than 80 kV)

Dose: greater than or equal to $6\times10^{15}$ ions/cm$^2$ and less than or equal to $4\times10^{16}$ ions/cm$^2$ Beam current density: higher than or equal to 2 µA/cm$^2$ (preferably higher than or equal to 5 µA/cm$^2$, more preferably higher than or equal to 10 µA/cm$^2$)

In the case of using an ion doping apparatus, a gas containing hydrogen can be used as a source gas of the ion irradiation step. By using the gas, $H^+$, $H_2^+$, and $H_3^+$ can be produced as ion species. In the case where the gas is used as a source gas, it is preferable to perform irradiation with a large amount of $H_3^+$. Specifically, it is preferable that the ion beam 130 contain $H_3^+$ ions at a proportion of 70% or higher with respect to the total number of $H^+$, $H_2^+$, and $H_3^+$ ions. It is more preferable that the proportion of $H_3^+$ ions be higher than or equal to 80%. With a high proportion of $H_3^+$ in this manner, the damaged region 114 can contain hydrogen at a concentration of $1 \times 10^{20}$ atoms/cm$^3$ or higher. Accordingly, separation at the damaged region 114 can be performed easily. By irradiation with a larger amount of $H_3^+$ ions, ion irradiation efficiency is improved compared to the case of irradiation with $H^+$ ions and $H_2^+$ ions. That is, time required for ion irradiation can be shortened.

In the case of using an ion implantation apparatus, it is preferable to perform mass separation to implant $H_3^+$ ions. Needless to say, irradiation with $H^+$ ions and $H_2^+$ ions may be performed as well. Note that, since ion species are selected to perform irradiation in the case of using an ion implantation apparatus, ion irradiation efficiency is decreased compared to the case of using an ion doping apparatus, in some cases.

As the source gas in the ion irradiation step, instead of a gas containing hydrogen, one or more kinds of gas selected from a rare gas such as helium or argon, a halogen gas typified by a fluorine gas or a chlorine gas, and a halogen compound gas such as a fluorine compound gas (e.g., $BF_3$) can be used. When helium is used for a source gas, an ion beam 130 with a high proportion of $He^+$ ions can be formed without mass separation. With the use of such an ion beam 130, the damaged region 114 can be efficiently formed.

Further, an ion irradiation step may be performed plural times to form the damaged region 114. In this case, the same source gas may be used in all ion irradiation steps or a different source gas may be used for each ion irradiation step. For example, ion irradiation may be performed using a rare gas as a source gas, and then, ion irradiation may be performed using a gas containing hydrogen as a source gas. Alternatively, ion irradiation may be performed first using a halogen gas or a halogen compound gas, and then, ion irradiation may be performed using a gas containing hydrogen.

After formation of the damaged region 114, the insulating layer 112 is removed and an insulating layer 116 is newly formed (see FIG. 1D). The reason why the insulating layer 112 is removed is that the insulating layer 112 is likely to be damaged in the ion irradiation. Note that when damage to the insulating layer 112 is not a problem, the insulating layer 112 does not need to be removed. In this case, the insulating layer 116 may be newly formed over the insulating layer 112 or the insulating layer 116 is not necessarily formed.

As a material of the insulating layer 116, an insulating material containing silicon or germanium as its composition, such as silicon oxide, silicon nitride, silicon oxynitride, silicon nitride oxide, germanium oxide, germanium nitride, germanium oxynitride, or germanium nitride oxide can be used. A metal oxide such as aluminum oxide, tantalum oxide, or hafnium oxide; a metal nitride such as aluminum nitride; a metal oxynitride such as an aluminum oxynitride; or a metal nitride oxide such as an aluminum nitride oxide may also be used. The insulating layer 116 can be formed by a CVD method, a sputtering method, a method using oxidation (or nitridation) of the single crystal semiconductor substrate 110, or the like. Note that in this embodiment mode, the insulating layer 116 has a single-layer structure; however, the present invention is not interpreted as being limited thereto. The insulating layer 116 can also have a stacked-layer structure of two or more layers.

The surface of the insulating layer 116 preferably has high planarity because the insulating layer 116 is a layer related to bonding. For example, a layer including a surface which has an arithmetic mean roughness of less than or equal to 0.6 nm (preferably, less than or equal to 0.3 nm) and a root-mean-square roughness of less than or equal to 0.7 nm (preferably, less than or equal to 0.4 nm) is formed. As such an insulating layer 116, for example, a silicon oxide film formed by a chemical vapor deposition method using an organosilane gas can be used. Note that the structure illustrated in FIG. 1D is hereinafter referred to as a substrate 160 for convenience of explanation.

After that, the above-described base substrate 100 and the substrate 160 are bonded to each other (see FIG. 1E). Specifically, the surfaces of the base substrate 100 and the substrate 160 are cleaned by a method such as ultrasonic cleaning (including so-called megasonic cleaning with a frequency of 50 kHz to 5 MHz) and treatment is performed using a chemical solution for attaching a hydrophilic group (e.g., ozone water, a mixed solution of ammonia water and a hydrogen peroxide solution (and water), or an oxidizer). Then, the substrate 160 is disposed in a substrate arrangement region 172 of a substrate supporting base 170 so that the insulating layer 116 faces up, and the base substrate 100 is disposed over the substrate 160. Note that as the treatment which is performed on the surfaces of the base substrate 100 and the substrate 160, for example, oxygen plasma treatment can be given in addition to the treatment using chemical solution. Hereinafter, details of bonding will be described.

Figure 2B:
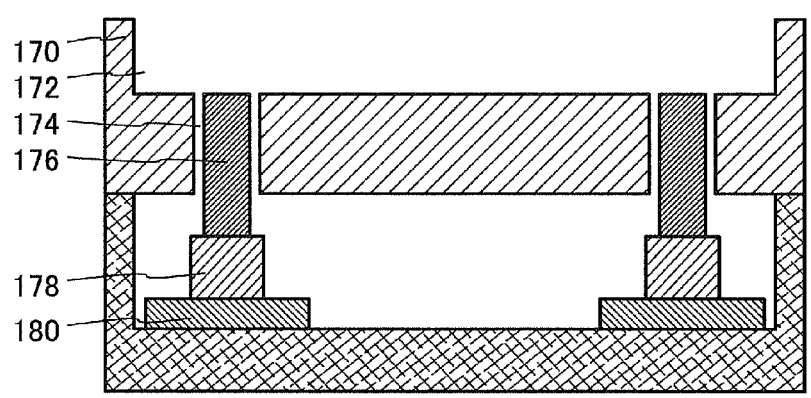

FIGS. 2A and 2B illustrate an example of an apparatus which can be used for bonding. FIG. 2A is a plane view of the apparatus and FIG. 2B is a cross-sectional view taken along a line A-B of FIG. 2A.

The apparatus illustrated in FIGS. 2A and 2B includes the substrate supporting base 170 and the substrate arrangement region 172 where the substrate 160 is disposed, an opening 174 which is provided in the substrate arrangement region 172, a substrate supporting mechanism 176 which is disposed in the opening 174, a raising and lowering mechanism 178 which raises and lowers the substrate supporting mechanism 176, a position control mechanism 180 which finely controls positions of the substrate supporting mechanism 176 and the raising and lowering mechanism 178, and the like.

Here, it is preferable that the opening 174 and the substrate supporting mechanism 176 (and attendant mechanisms such as the raising and lowering mechanism 178, the position control mechanism 180) be provided in a region corresponding to at least one of corner portions of the substrate 160. This is because bonding is performed by applying pressure to one of the corner portions of the substrate 160. Note that when the substrate 160 has a shape with no corners, such as a circular shape, the opening 174, the substrate supporting mechanism 176, and the like may be provided in a region corresponding to a peripheral portion of the substrate 160. That is, "one of the corner portions" can be simply read as "the peripheral portion".

Note that, although not illustrated in the figure, the apparatus preferably includes a heat treatment means. When the apparatus includes the heat treatment means, heat treatment can be performed right after bonding to strengthen the bonding. Of course, the heat treatment means may be provided outside the apparatus. Further, the substrate supporting mechanism 176 preferably has a mechanism which adsorbs the substrate 160. For example, a lift pin having an adsorption nozzle can be used as the substrate supporting mechanism.

Note that the apparatus of the present invention is not interpreted as being limited to the structure illustrated in FIGS. 2A and 2B. For example, although a groove (the substrate arrangement region 172) where the substrate is disposed is formed in the substrate supporting base 170, the groove is not necessarily formed as long as the base substrate 100 and the substrate 160 can be fixed. Further, in this embodiment mode, the substrate supporting mechanism 176 has a cylindrical shape; however, the shape of the substrate supporting mechanism 176 is not limited thereto. The shape, arrangement, or the like of the opening 174 can also be changed as appropriate.

Next, the procedure of bonding with the use of the apparatus illustrated in FIGS. 2A and 2B will be described with reference to FIGS. 3A to 3D. First, the substrate 160 is disposed in the substrate arrangement region 172 of the substrate supporting base 170 (see FIG. 3A). At this time, the substrate supporting mechanism 176 is raised to such a height that the substrate 160 and the substrate supporting base 170 are not in contact with each other (for example, such a height that a distance between the substrate 160 and the substrate supporting base 170 is approximately 1 mm to 3 mm) when the substrate 160 is disposed over the substrate supporting mechanism 176. Note that when the substrate supporting mechanism 176 has a mechanism which adsorbs the substrate 160, the substrate supporting mechanism 176 adsorbs the substrate 160, whereby a positional relationship between the substrate supporting mechanism 176 and the substrate 160 is fixed. In addition, FIG. 3A corresponds to a cross-sectional view taken along the line A-B in FIG. 2A.

After that, the position where the substrate 160 is bonded (the relative positional relationship between the base substrate 100 and the substrate 160) is adjusted finely by the position control mechanism 180. Note that the fine adjustment may be performed on the basis of a marker or the like which is put on the base substrate 100 after the base substrate 100 is disposed. In this case, for example, a method in which the position of the marker is detected using a camera for alignment can be used. For example, by using four direct acting actuators in combination as the position control mechanism 180, the fine adjustment can be performed in an x direction, a y direction and a θ direction.

Note that it is preferable to clean a surface of the substrate supporting base 170, or the like before the substrate 160 is disposed. Specifically, it is preferable to clean a portion which is in contact with the base substrate 100 or the substrate 160 in order to prevent the base substrate 100 and the substrate 160 from being contaminated in a bonding step.

Figure 3A:
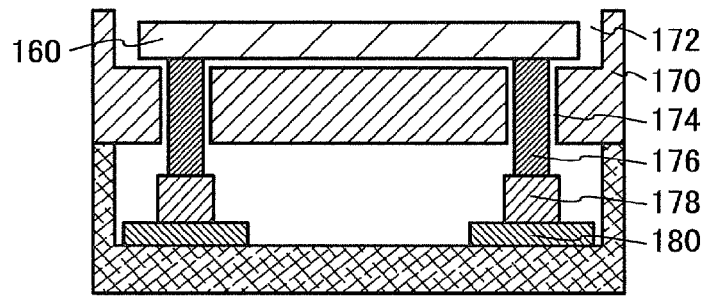
FIGS. 3A to 3D are views illustrating bonding of substrates.
Figure 3B:
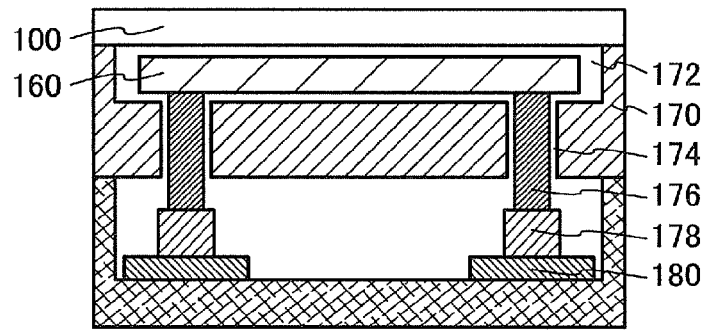

After that, the base substrate 100 is disposed over the substrate 160 (see FIG. 3B). In this embodiment mode, the base substrate 100 is disposed so as to be in contact with the substrate supporting base 170; however, the present invention is not limited thereto. For example, the base substrate 100 may be disposed using another mechanism for supporting the base substrate 100. In addition, a mechanism which prevents misalignment of the base substrate 100 may also be provided.

After the base substrate 100 is disposed, the substrate supporting mechanism 176 is raised, whereby a gap (a distance) between the base substrate 100 and the substrate 160 is reduced as much as possible. Specifically, for example, the gap may be less than or equal to 1 nm, preferably less than or equal to 0.8 mm, more preferably less than or equal to 0.5 mm. Note that the gap largely depends on the positioning accuracy of the raising and lowering mechanism 178, and thus, there is no particular limitation as long as the gap is reduced to the minimum value. The reason why the gap between the base substrate 100 and the substrate 160 is reduced as much as possible is to prevent generation of defective bonding due to bending of the substrate 160 in bonding. That is, it can be said that it is ideal to make the gap between the base substrate 100 and the substrate 160 almost zero (in other words, a state right before the base substrate 100 and the substrate 160 are brought into contact with each other).

Figure 3C:
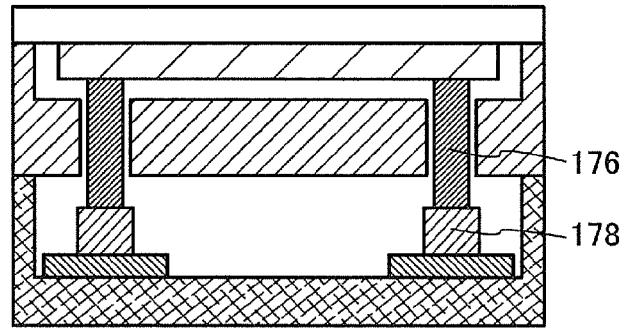

Next, pressure is applied to one of the corner portions of the substrate 160 using the substrate supporting mechanism 176 and bonding of the base substrate 100 and the substrate 160 is performed from the one of the corner portions to which the pressure is applied (see FIG. 3C). Specifically, the substrate supporting mechanism 176 corresponding to the one of the corner portions of the substrate 160 (hereinafter, referred to as "a pressurization substrate supporting mechanism") is raised further, the base substrate 100 and the substrate 160 are brought into contact with each other, and then pressure applied to the contact interface is increased gradually, whereby the bonding is performed. The reason why the pressure applied to the contact interface is increased gradually is that the probability of occurrence of defective bonding is increased when pressure is rapidly applied. In this manner, the bonding starts from the one of the corner portions, whereby bonding proceeds from a region where the bonding starts first to a periphery and the whole substrate 160 is finally bonded to the base substrate 100. Note that when a gap is provided between the base substrate 100 and the substrate 160, the substrate supporting mechanism 176 except the pressurization substrate supporting mechanism may be raised in accordance with rising of the pressurization substrate supporting mechanism. However, also in this case, it is important that the substrate supporting mechanism 176 except the pressurization substrate supporting mechanism does not apply pressure to the contact interface between the base substrate 100 and the substrate 160. Further, although not illustrated in the figure, it is preferable to provide a mechanism which prevents lifting of the base substrate 100 in bonding. As a mechanism for preventing lifting of the base substrate 100, for example, a fastener which presses the base substrate 100 against the substrate supporting base 170 can be given.

In order to gradually increase the pressure applied to the contact interface, for example, the substrate supporting mechanism 176 may be raised and lowered using a mechanism such as an air cylinder as the raising and lowering mechanism 178. The substrate supporting mechanism 176 is raised and lowered using air pressure, which can prevent pressure from being rapidly applied to the contact interface between the base substrate 100 and the substrate 160. Accordingly, the bonding can be performed favorably. Further, a portion of the substrate supporting mechanism 176 which is in contact with the substrate 160 may be formed using an elastic body. In this case as well, pressure can be prevented from being applied rapidly. Note that the bonding of the substrates in this embodiment mode is performed without rapid change in pressure, which is one of technical features; therefore, it is possible to employ other structures as appropriate as long as the bonding can be performed without rapid change in pressure. Thus, this embodiment mode is not construed as being limited to the above-described structure.

Note that the bonding is performed by van der Waals forces, hydrogen bonding, or the like and it is preferable to use a method of making best use of such a mechanism for bonding. For example, a method can be given in which before bonding is performed, treatment using a chemical solution for attaching a hydrophilic group (e.g., ozone water, a mixed solution of ammonia water and a hydrogen peroxide solution (and water), or an oxidizer), oxygen plasma treatment, or the like is performed on the surfaces of the base substrate 100 and the substrate 160, whereby the surfaces become hydrophilic. By the treatment, a hydrophilic group is attached to the surfaces of the base substrate 100 and the substrate 160; therefore, more hydrogen bonds can be formed at the bonding interface. That is, the bonding strength can be improved.

Note that an atmosphere in the bonding can be an air atmosphere, an inert atmosphere such as a nitrogen atmosphere, an atmosphere containing oxygen or ozone, or a reduced-pressure atmosphere. By performing bonding in an inert atmosphere or an atmosphere containing oxygen or ozone, it is possible to perform bonding by effectively using a hydrophilic group attached to the surfaces of the base substrate 100 and the substrate 160. On the other hand, bonding can also be performed in a reduced-pressure atmosphere. In this case, since an adverse effect due to a contaminant in the atmosphere can be reduced, the interface to be bonded can be kept clean. Further, trapping of air in bonding can be reduced.

Next, heat treatment is performed on the base substrate 100 and the substrate 160 which are bonded to each other, which leads to strong bonding. When a heat treatment means is provided in the apparatus, the heat treatment is performed using the heat treatment means, and even when the heat treatment means is not provided in the apparatus, it is preferable to avoid transferring the substrates as much as possible and perform heat treatment right after the bonding. This is because when the substrates are transferred before heat treatment and after the bonding, there is an extremely high possibility that the substrate 160 is separated due to bending of the base substrate 100, or the like. In this embodiment mode, a case where heat treatment is performed using the heat treatment means in the apparatus will be described.

The heat treatment can be performed by using heaters which are provided below the substrate 160 and above the base substrate 100. This is because when the heat treatment is performed on only one of the substrates which are bonded to each other, there is a high possibility that a temperature difference between the base substrate 100 and the substrate 160 is generated and the substrates are bent. On the other hand, when such bending of the substrates is not a problem, the heat treatment may be performed using one of the heaters provided below the substrate 160 and above the base substrate 100. The heating temperature needs to be less than or equal to the upper temperature limit of the base substrate and a temperature at which separation at the damaged region is not generated. For example, the heating temperature can be higher than or equal to 150° C. and lower than or equal to 450° C., preferably higher than or equal to 200° C. and lower than or equal to 400° C. The heat treatment time may be greater than or equal to one minute (preferably, greater than or equal to three minutes); however, optimal conditions may be set as appropriate in accordance with a relationship between the processing speed and the bonding strength. In this embodiment mode, heat treatment is performed at 200° C. for two hours. Note that only parts of the substrates to be bonded may be irradiated with a microwave, whereby local heat treatment is possible. Note that when there is no problem with the bonding strength of the substrates, the heat treatment may be omitted. In this case, the heat treatment means does not need to be provided in the apparatus.

Figure 3D:
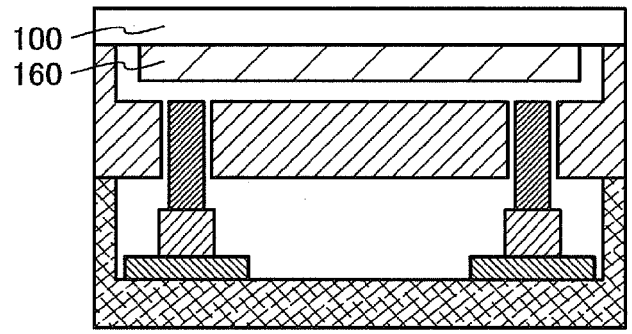

After that, the substrate supporting mechanism 176 is lowered, the substrate 160 and the substrate supporting mechanism 176 are separated from each other, and the bonding of the base substrate 100 and the substrate 160 is finished (see FIG. 3D).

Next, the base substrate 100 and the substrate 160 which are bonded to each other are taken out from the apparatus, and the substrate 160 is separated into the insulating layer 116 and a single crystal semiconductor layer 118, and a single crystal semiconductor substrate 120 (see FIG. 1F). The substrate 160 is separated by heat treatment. The heat treatment temperature can be set depending on the upper temperature limit of the base substrate 100. For example, when a glass substrate is used as the base substrate 100, the heat treatment temperature is preferably higher than or equal to 400° C. and lower than or equal to the strain point of glass. Note that in this embodiment mode, heat treatment is performed at 600° C. for two hours.

By performing the above-described heat treatment, volume change of microvoids formed in the damaged region 114 occurs, thereby generating a crack in the damaged region 114. As a result of this, the single crystal semiconductor substrate 110 is separated along the damaged region 114. Since the insulating layer 116 is bonded to the base substrate 100, the single crystal semiconductor layer 118 separated from the single crystal semiconductor substrate 110 remains over the base substrate 100. Further, since the bonding interface between the base substrate 100 and the insulating layer 116 is heated by this heat treatment, a covalent bond is formed at the bonding interface, so that the bonding strength between the base substrate 100 and the insulating layer 116 is further improved.

As described above, a semiconductor substrate which has the single crystal semiconductor layer 118 over the base substrate 100 is manufactured. The semiconductor substrate has a structure in which the insulating layer 116 and the single crystal semiconductor layer 118 are stacked in this order over the base substrate 100.

Defects due to the separation step or the ion irradiation step exist in the surface of the single crystal semiconductor layer 118, and planarity of the surface is damaged. It is difficult to form a gate insulating layer which is thin and has high withstand voltage on such a surface of the single crystal semiconductor layer 118 having low planarity (that is, having large unevenness). Therefore, planarization treatment is performed on the single crystal semiconductor layer 118. When there exist defects in the single crystal semiconductor layer 118, the local level density at the interface between the gate insulating layer and the single crystal semiconductor layer 118 is increased, which causes an adverse affect on performance and reliability of a transistor; therefore, treatment to decrease the defects of the single crystal semiconductor layer 118 is performed.

Figure 4A:
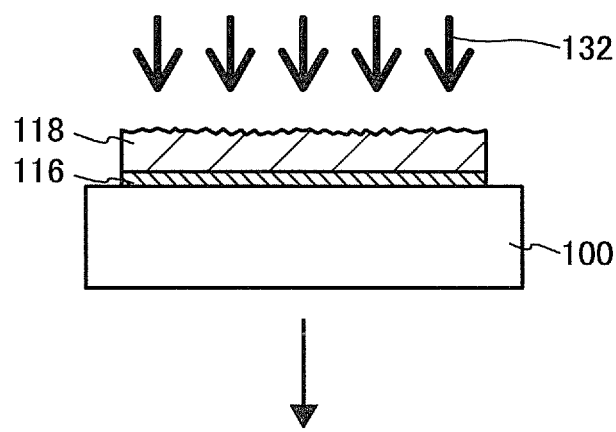
FIGS. 4A to 4C are views illustrating a manufacturing method of the semiconductor substrate.
Figure 4B:
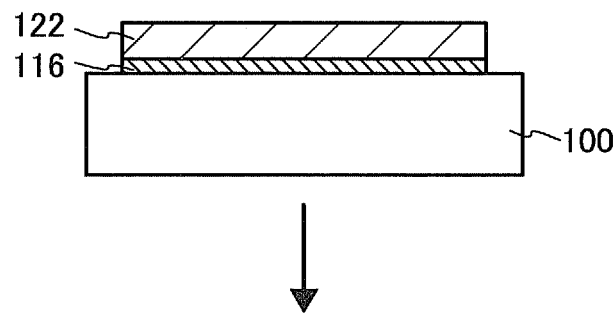
Figure 4C:
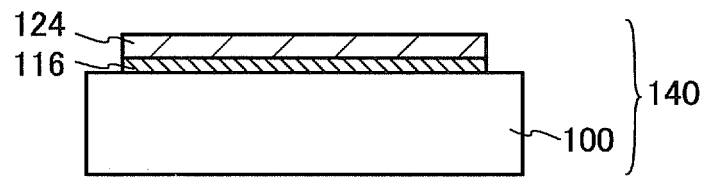

In this embodiment mode, improvement in planarity and reduction in defects of the single crystal semiconductor layer 118 can be realized by irradiation of the single crystal semiconductor layer 118 with laser light 132 (see FIG. 4A). By irradiation with the laser light 132 from the top surface side of the single crystal semiconductor layer 118, the top surface of the single crystal semiconductor layer 118 is melted. The single crystal semiconductor layer 118 is cooled and becomes solidified after the melting, whereby a single crystal semiconductor layer 122 of which the planarity of the top surface is improved can be obtained (see FIG. 4B). Note that even when laser light having relatively low energy density is used, reduction in defects can be effectively promoted by irradiation with the laser light 132 while heating the base substrate 100.

Note that it is preferable that the single crystal semiconductor layer 118 be partially melted by the irradiation with the laser light 132. This is because, if the single crystal semiconductor layer 118 is completely melted, it is microcrystallized due to disordered nucleation after being in a liquid phase, so that the crystallinity thereof decreases. On the other hand, by partial melting, crystal growth proceeds from a solid-phase part which is not melted. As a result of this, the defects in the semiconductor layer can be reduced. Here, "complete melting" means that the single crystal semiconductor layer 118 is melted to an interface with the insulating layer 116 and becomes a liquid state. On the other hand, "partial melting"

means in this case that an upper portion of the single crystal semiconductor layer 118 is melted and becomes a liquid phase but a lower portion thereof is not melted and remains in a solid phase.

For the laser irradiation, a pulsed laser is preferably used. This is because a pulsed laser light having high energy can be emitted instantaneously and a partially melting state can be formed easily. The repetition rate is preferably about greater than or equal to 1 Hz and less than or equal to 10 MHz, more preferably, greater than or equal to 10 Hz and less than or equal to 1 MHz. As the pulsed laser, an Ar laser, a Kr laser, an excimer (ArF, KrF, XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti: sapphire laser, a copper vapor laser, a gold vapor laser, or the like can be used. Note that the pulsed laser is preferably used for partial melting; however, the present invention should not be construed as being limited thereto. That is, the use of continuous wave lasers is not excluded. Note that as a continuous wave laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like can be given.

The wavelength of the laser light 132 needs to be a wavelength which is absorbed by the single crystal semiconductor layer 118. The wavelength may be determined in consideration of the skin depth of the laser light and the like. For example, the wavelength can be set in the range of greater than or equal to 250 nm and less than or equal to 700 nm. In addition, the energy density of the laser light 132 can be determined in consideration of the wavelength of the laser light 132, the skin depth of the laser light 132, the thickness of the single crystal semiconductor layer 118, or the like. The energy density of the laser light 132 may be set, for example, in the range of greater than or equal to 300 $mJ/cm^2$ and less than or equal to 800 $mJ/cm^2$. Note that the above-described energy density range is an example in the case where a XeCl excimer laser (wavelength: 308 nm) is used as a pulsed laser.

The irradiation with the laser light 132 can be performed in an atmosphere containing oxygen such as an air atmosphere or an inert atmosphere such as a nitrogen atmosphere or an argon atmosphere. In order to perform irradiation with the laser light 132 in an inert atmosphere, the irradiation with the laser light 132 may be performed in an airtight chamber while the atmosphere in the chamber may be controlled. In the case where the chamber is not used, an nitrogen atmosphere can be formed by blowing an inert gas such as a nitrogen gas to the surface which is irradiated with the laser light 132.

Note that in the inert atmosphere such as nitrogen, the planarity of the single crystal semiconductor layer 118 can be improved more effectively than the air atmosphere. In addition, in the inert atmosphere, generation of cracks and ridges can be suppressed more effectively than in the air atmosphere, and the applicable energy density range for the laser light 132 is widened. Note that irradiation with the laser light 132 may be performed in a reduced-pressure atmosphere. When irradiation with the laser light 132 is performed in a reduced-pressure atmosphere, the same effect as the irradiation in the inert atmosphere can be obtained.

After the irradiation with the laser light 132 is performed as described above, a step of thinning the single crystal semiconductor layer 122 may be performed. In order to thin the single crystal semiconductor layer 122 (etch back treatment), one of dry etching and wet etching or a combination of both of the etchings may be employed. For example, in the case where the single crystal semiconductor layer 122 is a layer formed using a silicon material, the single crystal semiconductor layer 122 can be thinned by dry etching treatment using $SF_6$ and $O_2$ as a process gas. As described above, a semiconductor substrate 140 having a thin single crystal semiconductor layer 124 can be manufactured (see FIG. 4C).

Note that in this embodiment mode, an example is described in which etching treatment is performed after the surface is planarized or the like by irradiation with the laser light; however, the present invention should not be construed as being limited thereto. For example, etching treatment may be performed before irradiation with the laser light. In this case, unevenness or defects of the surface of the semiconductor layer can be reduced to some extent by the etching treatment. Alternatively, the above-described etching treatment may be performed before and after the laser irradiation. Further alternatively, the laser irradiation and the etching treatment may be alternately repeated. By using laser irradiation and etching treatment in combination as described above, unevenness, defects, and the like of the surface of the semiconductor layer can be significantly reduced.

In addition, before or after the irradiation with the laser light 132 is performed, heat treatment may be performed at a temperature of lower than or equal to the upper temperature limit of the base substrate 100. Planarization treatment such as CMP (chemical mechanical polishing) may also be performed in addition to or instead of the above-described etching treatment or heat treatment.

In the present invention, bonding is performed by applying pressure to one of the corner portions of the substrate. As a result of this, possibility of generation of defective bonding due to trapping of air, a mismatch of the interface, or the like can be reduced. Further, after the bonding and before transfer of the substrates, heat treatment is performed in order to strengthen the bonding of the substrates. As a result of this, separation due to bending of the base substrate in transfer can be prevented. That is, by the above-described manufacturing method and manufacturing apparatus, defective bonding can be reduced, so that a semiconductor substrate can be manufactured with high yield.

Embodiment Mode 2

In this embodiment mode, a manufacturing method of a semiconductor substrate having a plurality of single crystal semiconductor layers will be described with reference to FIGS. 5A and 5B and FIGS. 6A to 6D. Note that there are many common points between the manufacturing method of a semiconductor substrate of this embodiment mode and the manufacturing method of a semiconductor substrate of Embodiment Mode 1. Therefore, in this embodiment mode, different points will be mainly described and the descriptions of the common points are partially omitted.

First, by the method described in Embodiment Mode 1, the base substrate 100 and the single crystal semiconductor substrate 110 are processed (see FIGS. 1A to 1D). Note that in this embodiment mode, a case will be described in which a plurality of single crystal semiconductor layers is provided over the base substrate 100. That is, it needs to be noted that since a plurality of single crystal semiconductor substrates 110 is used in the manufacturing method described in this embodiment mode, a plurality of processed single crystal semiconductor substrates 110 (that is, the substrates 160) is prepared.

After that, bonding of the base substrate 100 and the plurality of substrates 160 is performed (see FIG. 1E). Note that in FIG. 1E, bonding of one base substrate 100 and one substrate 160 is illustrated; however, in this embodiment mode, bonding of one base substrate 100 and the plurality of substrates 160 is performed.

Figure 5A:
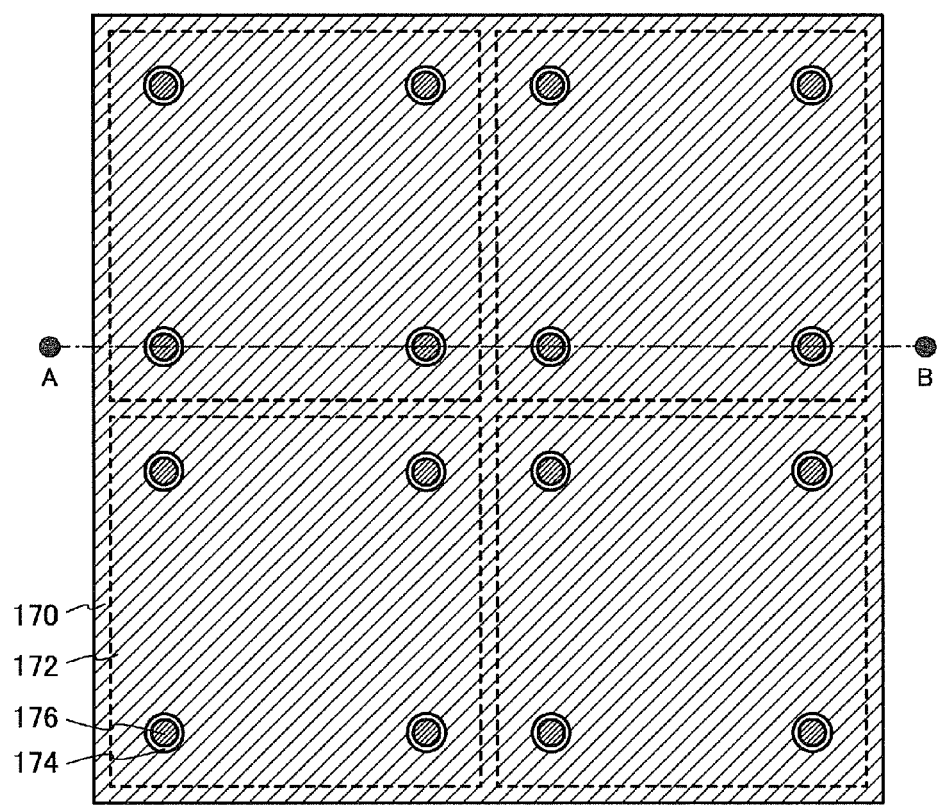
FIGS. 5A and 5B are views illustrating a manufacturing apparatus of the semiconductor substrate.
Figure 5B:
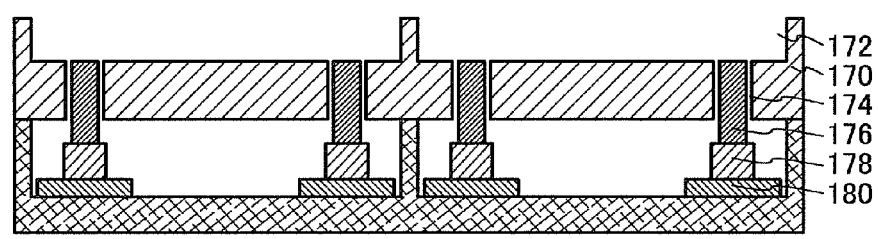

In FIGS. 5A and 5B, an example of an apparatus which can be used in the bonding in this embodiment mode is illustrated. FIG. 5A is a plane view of the apparatus and FIG. 5B is a cross-sectional view taken along a line A-B of FIG. 5A.

The apparatus illustrated in FIGS. 5A and 5B includes the substrate supporting base 170 and a plurality of substrate arrangement regions 172 where the substrates 160 are disposed, openings 174 provided in each of the substrate arrangement regions 172, substrate supporting mechanisms 176 provided in the openings 174, raising and lowering mechanisms 178 which raise and lower the substrate supporting mechanisms 176, position control mechanisms 180 which finely control positions of the substrate supporting mechanisms 176 and the raising and lowering mechanisms 178, and the like.

Here, it is preferable that the opening 174 and the substrate supporting mechanism 176 (also including the raising and lowering mechanism 178, the position control mechanism 180, and the like which are accompanied) be provided in a region corresponding to at least one of corner portions of the substrate 160. This is because bonding is performed by applying pressure to one of the corner portions of the substrate 160. Note that when the substrate 160 has a shape with no corners, such as a circular shape, the opening 174, the substrate supporting mechanism 176, or the like may be provided in a region corresponding to a peripheral portion of the substrate 160. That is, "one of the corner portions" can be simply read as "the peripheral portion".

Note that although not illustrated in the figure, the apparatus preferably includes a heat treatment means. When the apparatus includes the heat treatment means, heat treatment can be performed right after bonding to strengthen the bonding. Of course, the heat treatment means may be provided outside the apparatus. Further, the substrate supporting mechanism 176 preferably has a mechanism which adsorbs the substrate 160.

Note that the apparatus of the present invention should not be interpreted as being limited to the structure illustrated in FIGS. 5A and 5B. For example, a plurality of grooves (the substrate arrangement regions 172) where the substrates are disposed is formed in the substrate supporting base 170; however, the grooves are not necessarily formed as long as the base substrate 100 and the substrates 160 can be fixed. Further, in this embodiment mode, the substrate supporting mechanism 176 has a cylindrical shape; however, the shape of the substrate supporting mechanism 176 is not limited thereto. The shape, arrangement, or the like of the opening 174 can be also changed as appropriate.

Next, a procedure of bonding with the use of the apparatus illustrated in FIGS. 5A and 5B will be described with reference to FIGS. 6A to 6D. First, the substrate 160 is disposed in each of the plurality of substrate arrangement regions 172 of the substrate supporting base 170 (see FIG. 6A). At this time, the substrate supporting mechanisms 176 are raised to such a height that the substrates 160 and the substrate supporting base 170 are not in contact with each other (for example, such a height that a distance between the substrates 160 and the substrate supporting base 170 is approximately 1 mm to 3 mm) when the substrates 160 are disposed over the substrate supporting mechanisms 176. Note that the when substrate supporting mechanisms 176 have a mechanism which adsorbs the substrate, the substrate supporting mechanisms 176 adsorb the substrates 160, whereby a positional relationship between the substrate supporting mechanisms 176 and the substrates 160 is fixed. In addition, FIG. 6A corresponds to a cross-sectional view taken along the line A-B of FIG. 5A.

After that, the positions where the substrates 160 are bonded (the relative positional relationship between the base substrate 100 and the substrates 160) is adjusted finely by the position control mechanisms 180. Note that after the base substrate 100 is disposed, the fine adjustment can be performed on the basis of a marker or the like which is put on the base substrate 100. Alternatively, the fine adjustment may be performed in such a manner that the end portion of the base substrate 100 is adjusted to a marker, or the like provided on the substrate supporting base 170. For example, by using four direct acting actuators in combination as the position control mechanisms 180, the fine adjustment can be performed in an x direction, a y direction and a θ direction.

Note that it is preferable to clean a surface of the substrate supporting base 170, or the like before the substrates 160 are disposed. Specifically, it is preferable to clean a portion which is in contact with the base substrate 100 or the substrates 160 in order to prevent the base substrate 100 and the substrates 160 from being contaminated in a bonding step.

Figure 6A:
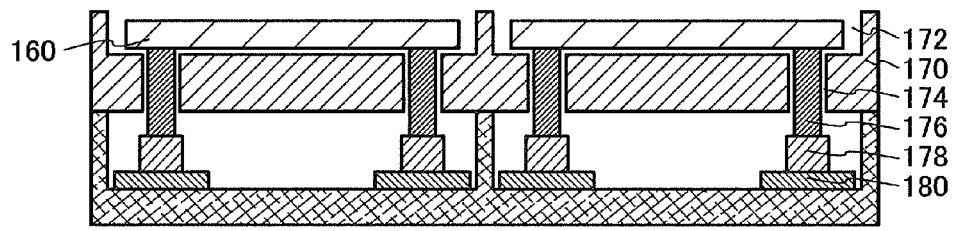
FIGS. 6A to 6D are views illustrating bonding of substrates.
Figure 6B:
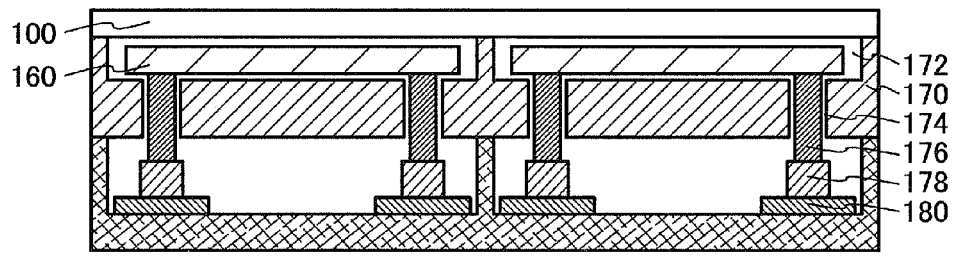

After that, the base substrate 100 is disposed over the plurality of substrates 160 (see FIG. 6B). In this embodiment mode, the base substrate 100 is disposed so as to be in contact with the substrate supporting base 170; however, the present invention is not limited thereto. For example, the base substrate 100 may be disposed using a mechanism which supports the base substrate 100 separately. In addition, a mechanism which prevents misalignment of the base substrate 100 may also be provided.

After the base substrate 100 is disposed, the substrate supporting mechanisms 176 are raised, whereby a gap (a distance) between the base substrate 100 and the substrates 160 is reduced as much as possible. Specifically, for example, the gap may be less than or equal to 1 mm, preferably less than or equal to 0.8 mm, more preferably less than or equal to 0.5 mm. Note that the gap largely depends on the positioning accuracy of the raising and lowering mechanisms 178, and thus, there is no particular limitation as long as the gap is reduced to the minimum value. The reason why the gap between the base substrate 100 and the substrates 160 is reduced as much as possible is to prevent generation of defective bonding due to bending of the substrates 160 in bonding. That is, it can be said that it is ideal to make the gap between the base substrate 100 and the substrates 160 almost zero (in other words, a state right before the base substrate 100 and the substrates 160 are brought into contact with each other).

Figure 6C:
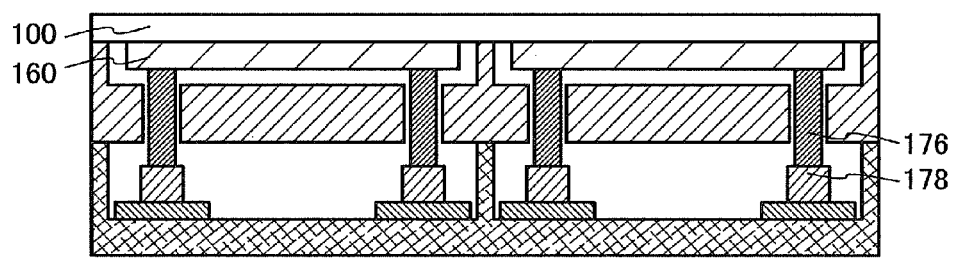

Next, pressure is applied to one of the corner portions of each of the plurality of substrates 160 using the substrate supporting mechanisms 176 and bonding of the base substrate 100 and the substrates 160 is performed from the one of the corner portions to which the pressure is applied (see FIG. 6C). Specifically, the substrate supporting mechanisms 176 each corresponding to one of the corner portions of each of the substrates 160 (hereinafter, referred to as "a pressurization substrate supporting mechanism") are raised further, the base substrate 100 and the substrates 160 are brought into contact with each other, and then pressure applied to the contact interface is increased gradually, whereby the bonding is performed. The reason why the pressure applied to the contact interface is increased gradually is that the probability of occurrence of defective bonding is increased when pressure is rapidly applied. In this manner, the bonding starts from one of the corner portions, whereby the bonding proceeds from a region where the bonding starts first to a periphery and the whole substrates 160 are finally bonded to the base substrate 100. Note that in applying pressure as described above, the substrate supporting mechanisms 176 except the pressurization substrate supporting mechanism may be raised in accordance with rising of the pressurization substrate supporting mechanism. However, also in this case, it is important that the substrate supporting mechanisms 176 except the pressurization substrate supporting mechanism do not apply pressure to the contact interface between the base substrate 100 and the substrates 160. Further, although not illustrated in the figure, it is preferable to provide a mechanism which prevents lifting of the base substrate 100 in bonding. As a mechanism which prevents lifting of the base substrate 100, for example, a mechanism for pressing the base substrate 100 against the substrate supporting base 170 can be given.

In order to gradually increase the pressure applied to the contact interface, for example, the substrate supporting mechanisms 176 may be raised and lowered using a mechanism such as an air cylinder as the raising and lowering mechanisms 178. The substrate supporting mechanisms 176 are raised and lowered using air pressure, which can prevent pressure from being rapidly applied to the contact interface between the base substrate 100 and the substrates 160. Accordingly, the bonding can be performed favorably. Further, a portion of the substrate supporting mechanisms 176 which is in contact with the substrates 160 may be formed using an elastic body. In this case as well, pressure can be prevented from being rapidly applied. Note that the bonding of the substrates in this embodiment mode is performed without rapid change in pressure, which is one of the technical features; therefore, it is possible to employ other structures as appropriate as long as the bonding can be performed without rapid change in pressure. Thus, this embodiment mode is not construed as being limited to the above-described structure.

Note that the bonding is performed by van der Waals forces or hydrogen bonding and it is preferable to use a method of making best use of such mechanism for bonding. For example, a method can be given in which before bonding is performed, treatment using a chemical solution for attaching a hydrophilic group (e.g., ozone water, a mixed solution of ammonia water and a hydrogen peroxide solution (and water), or an oxidizer), oxygen plasma treatment, or the like is performed on the surfaces of the base substrate 100 and the substrates 160, whereby the surfaces become hydrophilic. By the treatment, a hydrophilic group is attached to the surfaces of the base substrate 100 and the substrates 160; therefore, more hydrogen bonds can be formed at the bonding interface. That is, the bonding strength can be improved.

Note that an atmosphere in the bonding can be an air atmosphere, an inert atmosphere such as a nitrogen atmosphere, or a reduced-pressure atmosphere. When the bonding is performed in an inert atmosphere, it is possible to perform bonding by effectively using a hydrophilic group which is attached to the surfaces of the base substrate 100 and the substrates 160. On the other hand, the bonding can also be performed in a reduced-pressure atmosphere. In this case, since an adverse effect due to a contaminant in the atmosphere can be reduced, the interface to be bonded can be kept clean. Further, trapping of air in bonding can be reduced.

Next, heat treatment is performed on the base substrate 100 and the substrates 160 which are bonded to each other, which leads to strong bonding. When a heat treatment means is provided in the apparatus, the heat treatment is performed using the heat treatment means, and even when the heat treatment means is not provided in the apparatus, it is preferable to avoid transferring the substrates as much as possible and perform heat treatment right after the bonding. This is because when the substrates are transferred before heat treatment and after the bonding, there is an extremely high possibility that the substrates 160 are separated due to bending of the base substrate 100, or the like. In this embodiment mode, a case where heat treatment is performed using the heat treatment means in the apparatus will be described.

The heat treatment can be performed by using heaters which are provided below the substrates 160 and above the base substrate 100. This is because when the heat treatment is performed on only one of the substrates which are bonded to each other, there is a high possibility that a temperature difference between the base substrate 100 and the substrates 160 is generated and the substrates are bent. On the other hand, when such bending of the substrates is not a problem, the heat treatment may be performed using one of the heaters provided below the substrates 160 and above the base substrate 100. The heating temperature needs to be lower than or equal to the upper temperature limit of the base substrate and a temperature at which separation at the damaged region is not generated. For example, the heating temperature can be higher than or equal to 150° C. and lower than or equal to 450° C., preferably higher than or equal to 200° C. and lower than or equal to 400° C. The heat treatment time is preferably greater than or equal to one minute; however, optimal conditions may be set as appropriate in accordance with a relationship between the processing speed and the bonding strength. In this embodiment mode, heat treatment is performed at 200° C. for two hours. Note that only parts of the substrates to be bonded may be irradiated with a microwave, whereby local heat treatment is possible. Note that when there is no problem with the bonding strength of the substrates, the heat treatment may be omitted. In this case, the heat treatment means does not need to be provided in the apparatus.

Figure 6D:
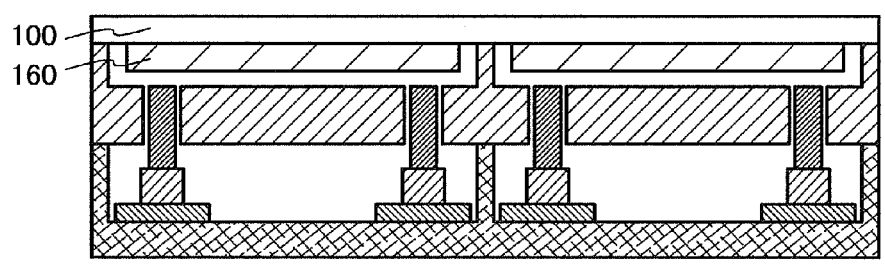

After that, the substrate supporting mechanisms 176 are lowered, the substrates 160 and the substrate supporting mechanisms 176 are separated from each other, and the bonding of the base substrate 100 and the plurality of substrates 160 is finished (see FIG. 6D). After that, separation (see FIG. 1F), laser irradiation (see FIG. 4A), planarization treatment, thinning treatment (see FIGS. 4B and 4C), and the like are performed on the substrates 160, whereby a semiconductor substrate in which a plurality of single crystal semiconductor layers is provided over the base substrate 100 is completed.

In this embodiment mode, heat treatment to strengthen the bonding of the base substrate and the single crystal semiconductor substrates is performed after the bonding of the substrates and before transfer of the substrates. As a result of this, a problem relating to separation due to bending of the base substrate can be resolved. Particularly, since the problem of separation becomes serious with sharp bending in transfer in the case of using a base substrate having a large area as described in this embodiment mode, it can be said that the structure of the present invention is extremely effective.

Note that in this embodiment mode, as an example, a structure is described in which the four substrates 160 are bonded to the one base substrate 100; however, the present invention is not limited thereto. The number of the substrates 160 bonded to the base substrate 100 can be set as appropriate in accordance with a relationship between the area of the base substrate 100 and the area of the substrates 160. This embodiment mode can be implemented in combination with Embodiment Mode 1 as appropriate.

Embodiment Mode 3

In this embodiment mode, another example of a manufacturing method of a semiconductor substrate having a single crystal semiconductor layer will be described with reference to FIGS. 7A to 7C. Note that in this embodiment mode, a state of bonding and an apparatus for bonding will be briefly described.

Figure 7A:
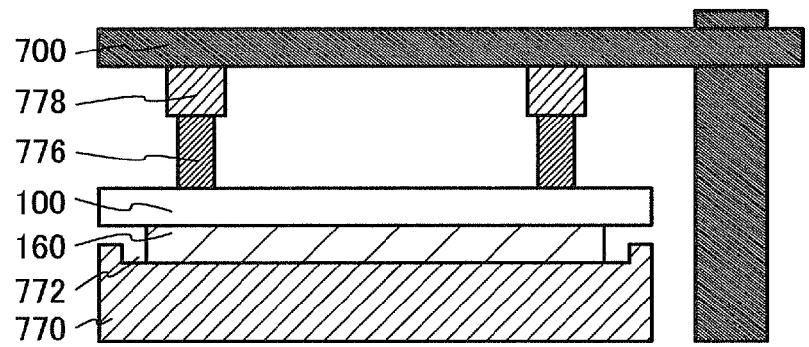
FIGS. 7A to 7C are views illustrating a manufacturing apparatus of the semiconductor substrate.

FIG. 7A illustrates an example of a state of bonding and an apparatus for bonding in this embodiment mode. Here, the substrate 160 is disposed in a substrate arrangement region 772 of a substrate supporting base 770 and the base substrate 100 is fixed with the use of a mechanism 700 having substrate supporting mechanisms 776 and raising and lowering mechanisms 778. Here, the substrate supporting mechanism 776 includes a mechanism which adsorbs the base substrate 100. That is, in FIG. 7A, the base substrate 100 is not in contact with the substrate supporting base 770. In bonding, the base substrate 100 is lowered by the substrate supporting mechanisms 776 and the raising and lowering mechanisms 778, whereby the base substrate 100 and the substrate 160 are brought into contact with each other, and then pressure is applied thereto. As a method for applying pressure, for example, a method is given in which pressure is applied to a region of the base substrate 100 corresponding to one of the corner portions of the substrate 160. Note that in this embodiment mode, the substrate supporting mechanism 776 has the mechanism which adsorbs the base substrate 100; however, the present invention is not limited thereto. For example, a mechanism which supports the base substrate 100 (not limited to a supporting mechanism by adsorption) and a mechanism which applies pressure may be provided separately. As an example of supporting the base substrate 100 without adsorption, a structure can be given in which the periphery of the base substrate 100 is held by an arm or the like.

Figure 7B:
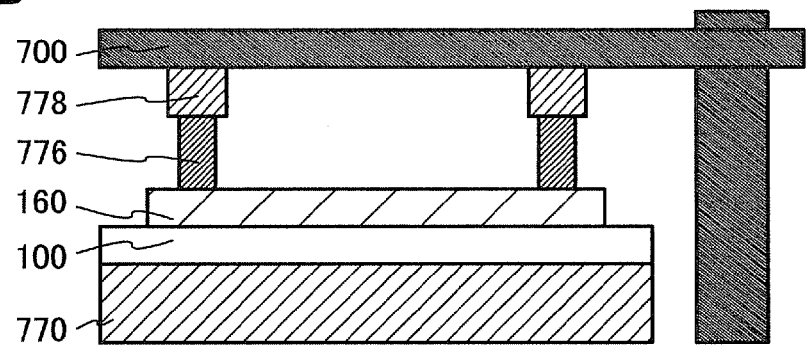

FIG. 7B illustrates another example of a state of bonding and an apparatus for bonding. FIG. 7B illustrates a structure in which the positional relationship between the base substrate 100 and the substrate 160 in FIG. 7A is changed. Specifically, the base substrate 100 is disposed over the substrate supporting base 770 and the substrate 160 is fixed with the use of the mechanism 700 having the substrate supporting mechanisms 776 and the raising and lowering mechanisms 778. A method for bonding is similar to that illustrated in FIG. 7A. The substrate 160 is lowered by the substrate supporting mechanisms 776 and the raising and lowering mechanisms 778, whereby the base substrate 100 and the substrate 160 are brought into contact with each other, and then pressure is applied thereto. By applying pressure to one of the corner portions of the substrate 160, bonding is formed. Note that in this embodiment mode, the substrate supporting mechanism 776 has a mechanism which adsorbs the substrate 160; however, the present invention is not limited thereto. For example, a mechanism which supports the substrate 160 and a mechanism which applies pressure may be provided separately.

Figure 7C:
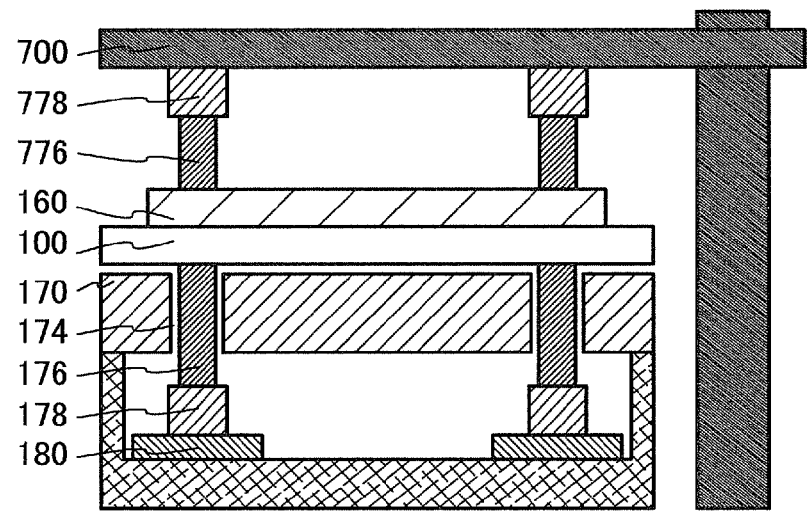

FIG. 7C illustrates a case of using the substrate supporting mechanisms 176 which support the base substrate 100 and the substrate supporting mechanisms 776 which support the substrate 160. Specifically, the base substrate 100 is disposed over the substrate supporting mechanisms 176, and the substrate 160 is fixed with the use of the mechanism 700 having the substrate supporting mechanisms 776 and the raising and lowering mechanisms 778. It can be said that this structure is a structure in which the apparatus described in Embodiment Mode 1 and the mechanism 700 illustrated in FIG. 7A or FIG. 7B in this embodiment mode are combined with each other. As to bonding, pressure is applied to a region corresponding to one of the corner portions of the substrate 160 as in FIGS. 7A and 7B. At this time, pressure may be applied with the use of the substrate supporting mechanism 776 on the substrate 160 side while the substrate supporting mechanisms 176 are fixed or with the use of the substrate supporting mechanism 176 while the substrate supporting mechanisms 776 are fixed. Of course, pressure can also be applied with the use of both of the substrate supporting mechanism 176 and the substrate supporting mechanism 776. Note that FIG. 7C illustrates the case where the base substrate 100 is disposed under the substrate 160; however, the positional relationship between the base substrate 100 and the substrate 160 may be changed.

Note that in this embodiment mode, a structure in which one base substrate 100 and one substrate 160 are bonded to each other is described for simplicity; however, as described in Embodiment Mode 2, the plurality of substrates 160 may be bonded to the one base substrate 100. This embodiment mode can be implemented in combination with Embodiment Mode 1 or 2, as appropriate.

Embodiment Mode 4

In this embodiment mode, a manufacturing method of a semiconductor substrate having a plurality of single crystal semiconductor layers will be described with reference to FIGS. 21A and 21B and FIGS. 22A to 22D. Note that there are many common points between the manufacturing method of a semiconductor substrate of this embodiment mode and the manufacturing method of a semiconductor substrate of Embodiment Mode 1. Therefore, in this embodiment mode, different points will be mainly described and the descriptions of the common points are partially omitted.

First, by the method described in Embodiment Mode 1, the base substrate 100 and the single crystal semiconductor substrate 110 are processed (see FIGS. 1A to 1D). Note that in this embodiment mode, a case will be described in which a plurality of single crystal semiconductor layers is provided over the base substrate 100. That is, it needs to be noted that since the plurality of single crystal semiconductor substrates 110 is used in the manufacturing method described in this embodiment mode, a plurality of processed single crystal semiconductor substrates 110 (that is, the substrates 160) is prepared.

After that, the base substrate 100 and the plurality of substrates 160 are bonded to each other. Note that in Embodiment Mode 1, one base substrate 100 and one substrate 160 are bonded to each other; however, in this embodiment mode, the plurality of substrates 160 are bonded to the one base substrate 100. Further, in Embodiment Modes 1 and 2, the base substrate 100 and the substrate 160 are bonded to each other in such a manner that the substrate 160 is raised; however, in this embodiment mode, bonding is performed in such a manner that the base substrate 100 is lowered.

Figure 21A:
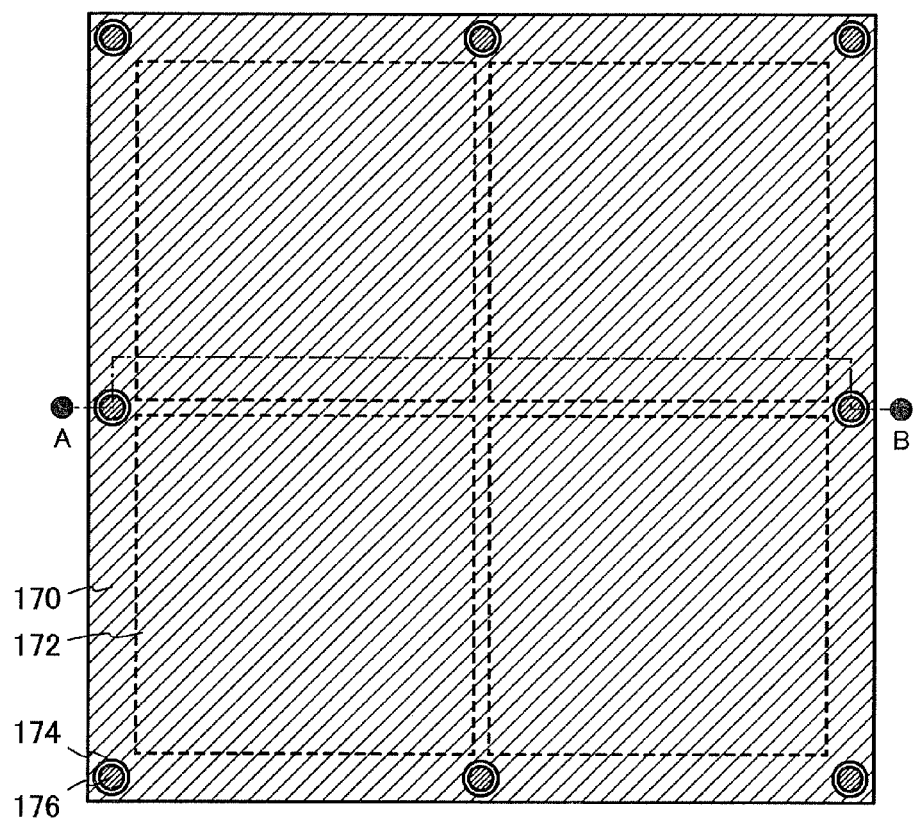
FIGS. 21A and 21B are views illustrating a manufacturing apparatus of the semiconductor substrate.
Figure 21B:
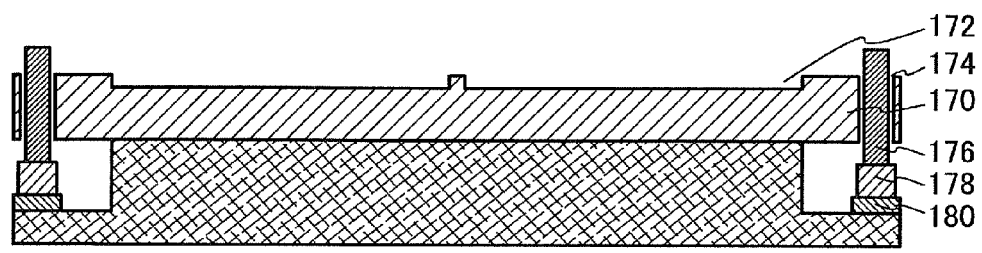

FIGS. 21A and 21B illustrate an example of an apparatus which can be used in bonding in this embodiment mode. FIG. 21A is a plane view of the apparatus and FIG. 21B is a cross-sectional view taken along a line A-B of FIG. 21A.

The apparatus illustrated in FIGS. 21A and 21B includes the substrate supporting base 170 and the plurality of substrate arrangement regions 172 where the substrates 160 are disposed, the openings 174 which are provided in the periphery of the plurality of substrate arrangement regions 172, the substrate supporting mechanisms 176 which are disposed in the openings 174, the raising and lowering mechanisms 178 which raise and lower the substrate supporting mechanisms 176, the position control mechanisms 180 which finely control positions of the substrate supporting mechanisms 176 and the raising and lowering mechanisms 178, and the like.

Note that in FIGS. 21A and 21B, the openings 174 and the substrate supporting mechanisms 176 (including the raising and lowering mechanisms 178, the position control mechanisms 180, and the like which are accompanied) are provided only in the periphery of the plurality of the substrate arrangement regions 172; however, the structure of the apparatus which can be used in this embodiment mode is not limited thereto and arrangement of the openings 174 and the substrate supporting mechanisms 176 can be changed as appropriate. For example, the openings 174 and the substrate supporting mechanisms 176 may be provided in the center of the substrate supporting base 170. It can be said that it is preferable to provide as many substrate supporting mechanisms 176 as possible in order to reduce bending of the base substrate. Although a plurality of grooves (the substrate arrangement regions 172) where the substrates are disposed is formed in the substrate supporting base 170, the grooves are not necessarily formed as long as the base substrate 100 and the substrates 160 can be fixed. Further, in this embodiment mode, the substrate supporting mechanism 176 has a cylindrical shape; however, the shape of the substrate supporting mechanism 176 is not limited thereto. The shape or the like of the opening 174 can be also changed as appropriate.

Note that although not illustrated in the figure, the apparatus preferably includes a heat treatment means. When the apparatus includes the heat treatment means, heat treatment can be performed right after bonding to strengthen the bonding. Of course, the heat treatment means may be provided outside the apparatus. Further, the substrate supporting mechanism 176 preferably has a mechanism which adsorbs the base substrate 100.

Next, the procedure of bonding with the use of the apparatus illustrated in FIGS. 21A and 21B will be described with reference to FIGS. 22A to 22D. First, the substrate 160 is disposed in each of the plurality of substrate arrangement regions 172 of the substrate supporting base 170 (see FIG. 22A). Note that FIG. 22A corresponds to a cross-sectional view taken along the line A-B of FIG. 21A.

Note that it is preferable to clean a surface of the substrate supporting base 170 or the like before the substrates 160 are disposed. Specifically, it is preferable to clean portions which are in contact with the base substrate 100 or the substrates 160 in order to prevent the base substrate 100 and the substrate 160 from being contaminated in a bonding step.

Figure 22A:
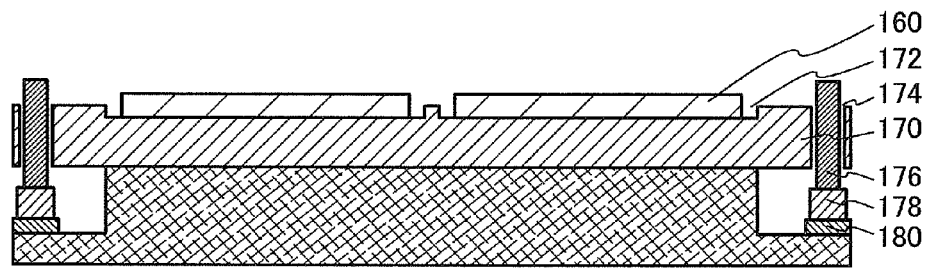
FIGS. 22A to 22D are views illustrating bonding of substrates.
Figure 22B:
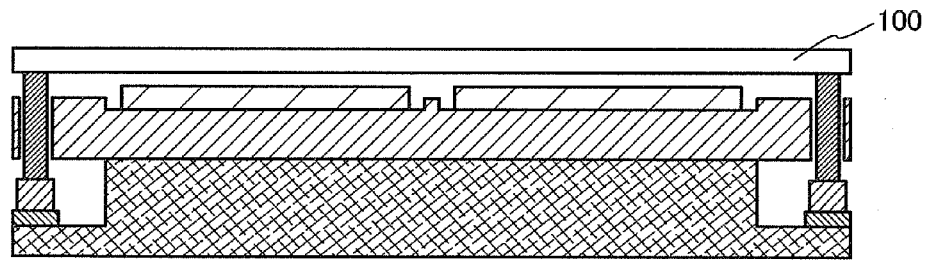
Figure 22C:
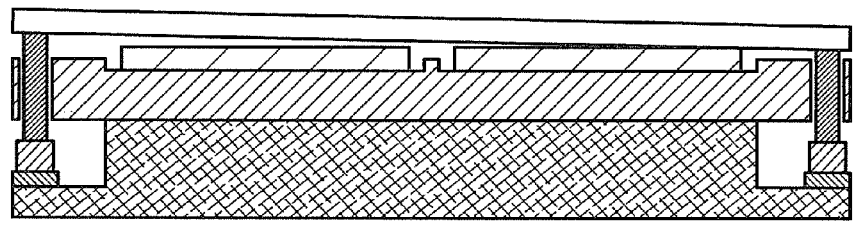
Figure 22D:
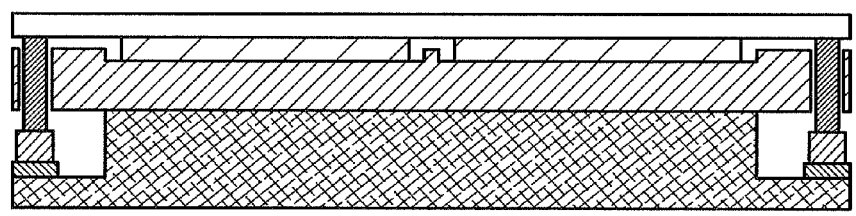

After that, the base substrate 100 is disposed over the plurality of substrates 160 (see FIG. 22B). Specifically, the base substrate 100 is disposed so as to be in contact with the substrate supporting mechanisms 176. Then, the position of the base substrate 100 is adjusted finely by the position control mechanisms 180. Note that the fine adjustment may be performed on the basis of the positions of the substrates 160, the substrate arrangement regions 172, or the like. For example, by using four direct acting actuators in combination as the position control mechanisms 180, the fine adjustment can be performed in an x direction, a y direction and a θ direction.

Next, the base substrate 100 is lowered with the use of the substrate supporting mechanisms 176. Here, the base substrate 100 is lowered with a slight inclination so that the base substrate 100 and the substrates 160 are in contact with each other at a point (or a line) (see FIGS. 22C and 22D). As a result of this, the base substrate 100 can be bonded by its own weight. Here, the speed of lowering the substrate supporting mechanisms 176 is preferably suited to the progress of the bonding. That is, after the base substrate 100 and the substrates 160 are in contact with each other at a point (or a line), the substrate supporting mechanisms 176 are lowered so that a region where the base substrate 100 and the substrates 160 are in contact with each other is widened in accordance with the speed at which a surface to be bonded is moved. By performing bonding in this manner, favorable bonding can be realized. Note that although not illustrated in the figure, the bonding may be performed by application of pressure from above a glass substrate.

Here, for example, a mechanism such as an air cylinder is preferably used as the raising and lowering mechanism 178. This is because the substrate supporting mechanisms 176 are raised and lowered using air pressure, which can prevent rapid change in pressure at the contact interfaces between the base substrate 100 and the substrates 160, and thus, the bonding can be performed favorably. Further, portions of the substrate supporting mechanisms 176 which are in contact with the substrates 160 may be formed using an elastic body. In this case as well, rapid change in pressure can be prevented. Note that the bonding of the substrates in this embodiment mode is performed without rapid change in pressure, which is one of the technical features; therefore, it is possible to employ other structures as appropriate as long as it is a structure in which the bonding can be performed without rapid change in pressure. Thus, this embodiment mode is not construed as being limited to the above-described structure.

Note that the bonding is formed by van der Waals forces or hydrogen bonding and it is preferable to use a method of making best use of such mechanism for bonding. For example, a method can be given in which before bonding is performed, treatment using a chemical solution for attaching a hydrophilic group (e.g., ozone water, a mixed solution of ammonia water and a hydrogen peroxide solution (and water), or an oxidizer), oxygen plasma treatment, or the like is performed on the surfaces of the base substrate 100 and the substrates 160, whereby the surfaces become hydrophilic. By this treatment, a hydrophilic group is attached to the surfaces of the base substrate 100 and the substrates 160; therefore, more hydrogen bonds can be formed at the bonding interfaces. That is, the bonding strength can be improved.

Note that an atmosphere in the bonding can be an air atmosphere, an inert atmosphere such as a nitrogen atmosphere, or a reduced-pressure atmosphere. By performing bonding in an inert atmosphere, it is possible to perform bonding by effectively using a hydrophilic group which is attached to the surfaces of the base substrate 100 and the substrates 160. On the other hand, bonding can also be performed in a reduced-pressure atmosphere. In this case, since an adverse effect due to a contaminant in the atmosphere can be reduced, the interface to be bonded can be kept clean. Further, trapping of air in bonding can be reduced.

Next, heat treatment is performed on the base substrate 100 and the substrates 160 which are bonded to each other, which leads to strong bonding. When a heat treatment means is provided in the apparatus, the heat treatment is performed using the heat treatment means, and even when the heat treatment means is not provided in the apparatus, it is preferable to avoid transferring the substrates as much as possible and perform heat treatment right after the bonding. This is because when the substrates are transferred before heat treatment and after the bonding, there is an extremely high possibility that the substrates 160 are separated due to bending of the base substrate 100, or the like. In this embodiment mode, a case where heat treatment is performed using the heat treatment means in the apparatus will be described.

The heat treatment can be performed by using heaters which are provided below the substrates 160 and above the base substrate 100. This is because when the heat treatment is performed on only one of the substrates which are bonded to each other, there is a high possibility that a temperature difference between the base substrate 100 and the substrates 160 is generated and the substrates are bent. On the other hand, when such bending of the substrates is not a problem, the heat treatment may be performed using one of the heaters provided below the substrates 160 and above the base substrate 100. The heating temperature needs to be less than or equal to the upper temperature limit of the base substrate and a temperature at which separation at the damaged region is not generated. For example, the heating temperature can be higher than or equal to 150° C. and lower than or equal to 450° C., preferably higher than or equal to 200° C. and lower than or equal to 400° C. The heat treatment time may be greater than or equal to one minute; however, optimal conditions may be set as appropriate in accordance with a relationship between the processing speed and the bonding strength. In this embodiment mode, heat treatment is performed at 200° C. for two hours. Note that only parts of the substrates to be bonded may be irradiated with a microwave, whereby local heat treatment is possible. Note that when there is no problem with the bonding strength of the substrates, the heat treatment may be omitted. In this case, the heat treatment means does not need to be provided in the apparatus.

After that, the base substrate 100 is separated from the substrate supporting mechanisms 176 and the bonding of the base substrate 100 and the plurality of substrates 160 is finished. Then, separation (see FIG. 1F), laser irradiation treatment (see FIG. 4A), planarization treatment, thinning treatment (see FIGS. 4B and 4C), and the like are performed on the substrates 160, whereby a semiconductor substrate in which the plurality of single crystal semiconductor layers is provided over the base substrate 100 is completed.

In this embodiment mode, heat treatment to strengthen the bonding of the base substrate and the single crystal semiconductor substrates is performed after the bonding of the substrates and before transfer of the substrates. As a result of this, a problem relating to separation due to bending of the base substrate can be resolved. Particularly, since the problem of separation becomes serious with sharp bending in transfer in the case of using a base substrate having a large area as described in this embodiment mode, it can be said that the structure of the present invention is extremely effective.

Note that in this embodiment mode, as an example, a structure is described in which the four substrates 160 are bonded to one base substrate 100; however, the present invention is not limited thereto. The number of the substrates 160 bonded to the base substrate 100 can be set as appropriate in accordance with a relationship between the area of the base substrate 100 and the area of the substrate 160. This embodiment mode can be implemented in combination with any of Embodiment Modes 1 to 3, as appropriate.

Embodiment Mode 5

In this embodiment mode, a manufacturing apparatus of a semiconductor substrate of the present invention will be described with reference to FIG. 8, FIG. 9, and FIG. 10. Note that in this embodiment mode, a manufacturing apparatus with which a series of steps of cleaning, bonding, and separating of substrates can be performed will be described.

Figure 8:
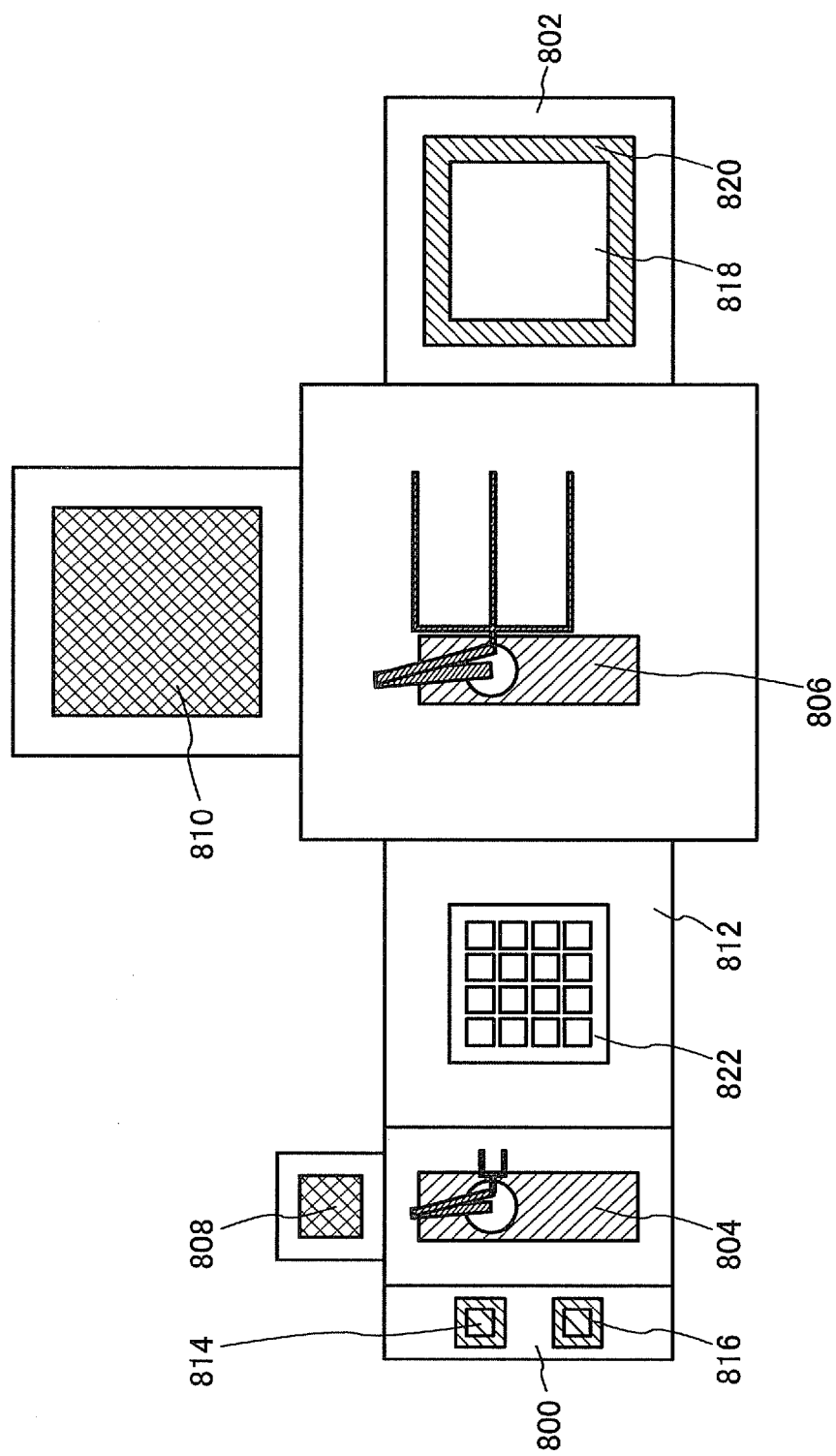
FIG. 8 is a view illustrating a manufacturing apparatus of the semiconductor substrate.

FIG. 8 illustrates an example of a manufacturing apparatus of a semiconductor substrate in this embodiment mode. The manufacturing apparatus of a semiconductor substrate illustrated in FIG. 8 includes a loader 800 for a single crystal semiconductor substrate, a loader 802 for a glass substrate, a transfer mechanism 804 for the single crystal semiconductor substrate, a transfer mechanism 806 for the glass substrate, a cleaning chamber 808 for the single crystal semiconductor substrate, a cleaning chamber 810 for the glass substrate, a bonding chamber 812, and the like. In the loader 800, a cassette 816 for providing a single crystal semiconductor substrate 814 is provided, and in the loader 802, a cassette 820 for providing a glass substrate 818 is provided. Note that the treatment described in Embodiment Mode 1 or the like is performed on the single crystal semiconductor substrate 814 and the glass substrate 818. Further, in the bonding chamber 812, a substrate supporting base 822 is provided. Note that in FIG. 8, the substrate supporting base 822 has regions where a plurality of single crystal semiconductor substrates is provided; however, the present invention is not limited thereto.

A manufacturing method of a semiconductor substrate with the use of the above-described manufacturing apparatus of a semiconductor substrate will be roughly described below.

First, the single crystal semiconductor substrate 814 provided in the cassette 816 is moved to the cleaning chamber 808 with the use of the transfer mechanism 804. Then, in the cleaning chamber 808, a surface of the single crystal semiconductor substrate 814 is cleaned by a method such as ultrasonic cleaning (including so-called megasonic cleaning with a frequency of 50 kHz to 5 MHz). After the cleaning, treatment is performed on the surface of the single crystal semiconductor substrate 814 using a chemical solution for attaching a hydrophilic group (e.g., ozone water, a mixed solution of ammonia water and a hydrogen peroxide solution (and water), or an oxidizer). Note that as the treatment which is performed on the surface of the single crystal semiconductor substrate 814, for example, oxygen plasma treatment can be given in addition to the chemical solution treatment.

Then, the single crystal semiconductor substrate 814 is moved to the substrate supporting base 822 with the use of the transfer mechanism 804 (for example, see FIG. 3A, FIG. 6A, FIG. 22A, or the like). Embodiment Modes 1 to 4 can be referred to for the detail of the substrate supporting base 822. Note that when the transfer mechanism 804 delivers the single crystal semiconductor substrate 814 to the substrate supporting mechanism, it is preferable that the substrate supporting mechanism be raised, and then the single crystal semiconductor substrate 814 be delivered so that the transfer mechanism 804 does not interfere with the substrate supporting base.

Along with the cleaning step and the delivering step described above, the glass substrate is cleaned. Specifically, the glass substrate 818 provided in the cassette 820 is moved to the cleaning chamber 810 with the use of the transfer mechanism 806. Then, in the cleaning chamber 810, the surface of the glass substrate 818 is cleaned by a method such as ultrasonic cleaning. After the cleaning, treatment is performed on the surface of the glass substrate 818 using a chemical solution for attaching a hydrophilic group (e.g., ozone water, a mixed solution of ammonia water and a hydrogen peroxide solution (and water), or an oxidizer).

Subsequently, a predetermined number of single crystal semiconductor substrates 814 are moved to the substrate supporting base 822, and then the glass substrate 818 is moved over the single crystal semiconductor substrates 814 with the use of the transfer mechanism 806. Note that the glass substrate 818 may be fixed by being in contact with the substrate supporting base 822 (for example, see FIG. 3B, FIG. 6B, or the like), or may be fixed over the single crystal semiconductor substrates 814 with the use of another supporting mechanism (for example, see FIG. 7A, FIG. 22B, or the like). Of course, the glass substrate 818 may also be fixed by the transfer mechanism 806 itself.

After that, the substrate supporting mechanisms are raised or lowered, whereby bonding of the single crystal semiconductor substrate 814 and the glass substrate 818 is performed (for example, see FIGS. 3C and 3D, FIGS. 6C and 6D, FIGS. 22C and 22D, or the like). Note that for the detail of the above-described bonding steps, Embodiment Modes 1 to 4 can be referred to as appropriate.

When the substrate supporting base 822 is provided with a heat treatment means, heat treatment is performed right after the above-described bonding. The bonding of the single crystal semiconductor substrate 814 and the glass substrate 818 can be strengthened by the heat treatment. Since the heat treatment is performed in order to prevent the substrates from being separated from each other, it is preferable to perform the heat treatment right after the bonding of the substrates and before the transfer of the substrates. In this sense, it can be said that the substrate supporting base 822 or the periphery thereof is preferably provided with the heat treatment means. Embodiment Mode 1, or the like can be referred to for the detail of the heat treatment.

Next, the substrates on which the heat treatment is performed are moved to the cassette 820 with the use of the transfer mechanism 806. Although the substrates are bent at this time, when the above-described heat treatment has been performed, separation of the substrates can be prevented. After that, heat treatment is further performed on the substrates, the single crystal semiconductor substrate is separated at the damaged region, and laser irradiation treatment or the like is performed on a single crystal semiconductor layer remaining after the separation, whereby the semiconductor substrate is completed. Note that in the structure illustrated in FIG. 8, heat treatment to separate the single crystal semiconductor substrate is performed with the use of another apparatus; however, the present invention is not limited thereto. The heat treatment means to separate the single crystal semiconductor substrate may also be provided in the above-described apparatus.

Figure 9:
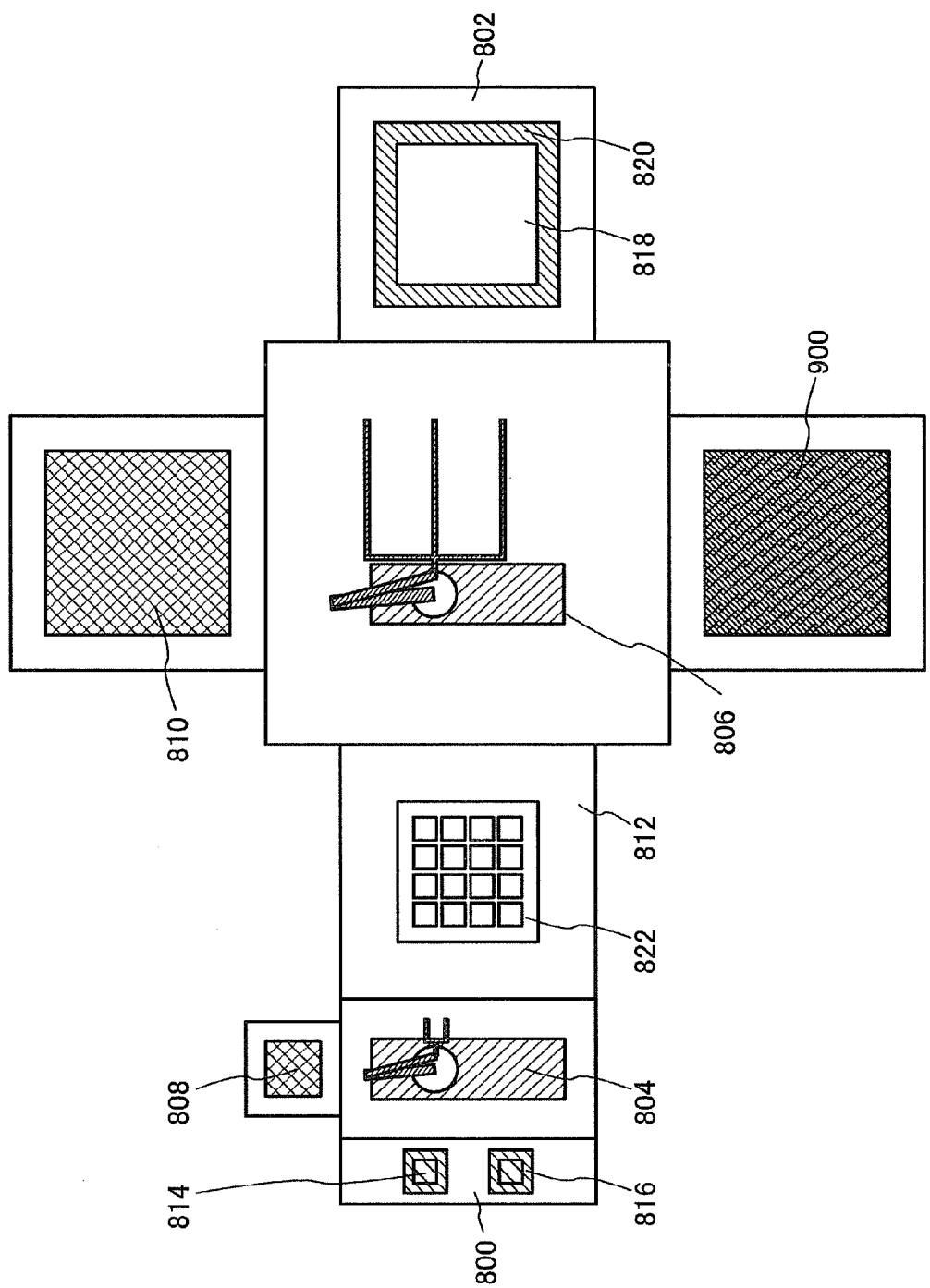
FIG. 9 is a view illustrating a manufacturing apparatus of the semiconductor substrate.

FIG. 9 illustrates another example of a manufacturing apparatus of a semiconductor substrate in this embodiment mode. A manufacturing apparatus of a semiconductor substrate illustrated in FIG. 9 has many portions which are the same as in the manufacturing apparatus illustrated in FIG. 8. Specifically, the loader 800, the loader 802, the transfer mechanism 804, the transfer mechanism 806, the cleaning chamber 808, the cleaning chamber 810, the bonding chamber 812, and the like are common in the manufacturing apparatus of FIG. 8 and the manufacturing apparatus of FIG. 9. On the other hand, the manufacturing apparatus of FIG. 9 has a heat treatment chamber 900, which is not included in the manufacturing apparatus of FIG. 8. The heat treatment chamber is used to perform heat treatment to separate the single crystal semiconductor substrate after the bonding.

A manufacturing method using the manufacturing apparatus illustrated in FIG. 9 is similar to that of FIG. 8. As a difference, heat treatment to separate the single crystal semiconductor substrate is given, which is performed in such a manner that the bonding of the substrates is strengthened, and then the substrates are moved to the heat treatment chamber 900 with the use of the transfer mechanism 806. Embodiment Mode 1 or the like can be referred to for the detail of a temperature condition or the like. Thus, by transferring the substrates after the bonding thereof is strengthened, the problem of separation of the substrates can be significantly reduced.

Figure 10:
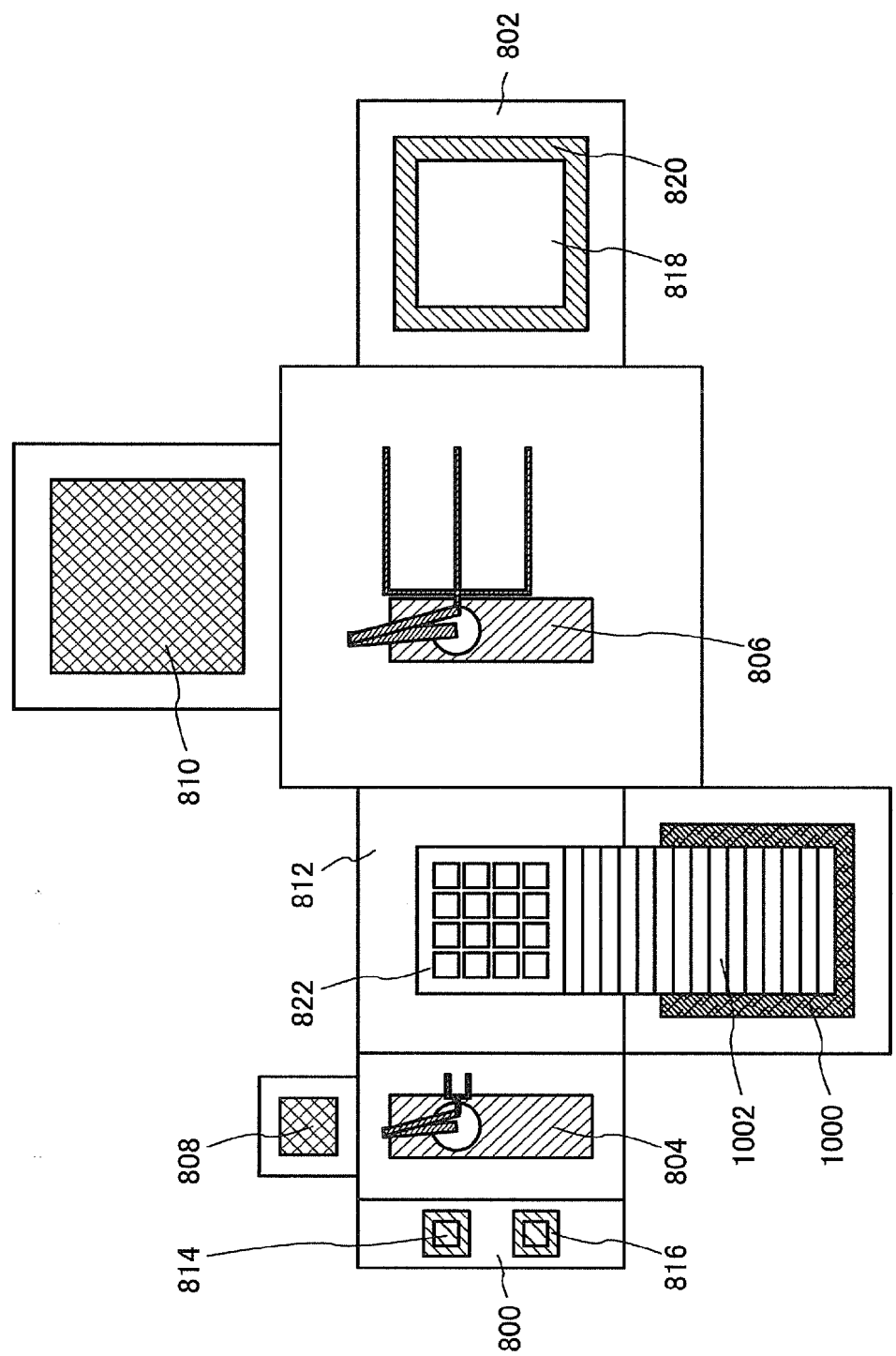
FIG. 10 is a view illustrating a manufacturing apparatus of the semiconductor substrate.

FIG. 10 illustrates another example of a manufacturing apparatus of the semiconductor substrate in this embodiment mode. The manufacturing apparatus of the semiconductor substrate illustrated in FIG. 10 also has many portions which are the same as the manufacturing apparatus illustrated in FIG. 8. Note that the manufacturing apparatus illustrated in FIG. 10 has a heat treatment chamber 1000 which is not included in the manufacturing apparatus illustrated in FIG. 8. The heat treatment chamber is a chamber in which heat treatment to strengthen the bonding and separate the single crystal semiconductor substrate is performed. In addition, the manufacturing apparatus illustrated in FIG. 10 has a transfer mechanism 1002 which connects the heat treatment chamber 1000 and the substrate supporting base 822 to each other, such as a conveyer belt or a roller-carrying mechanism (a mechanism in which a plurality of columnar objects which rotates is arranged to transfer the substrates).

In the manufacturing apparatus illustrated in FIG. 10, after the bonding and before performing heat treatment to strengthen the bonding, the substrates are moved to the heat treatment chamber 1000. As in this case, when the substrates are transferred before strengthening the bonding, the problem of separation of the substrates due to bending thereof becomes serious. The manufacturing apparatus illustrated in FIG. 10 includes the transfer mechanism 1002 such as a conveyer belt or a roller-carrying mechanism in order to solve this problem. By using such a transfer mechanism, bending of the substrates can be suppressed as compared to the case of using a transfer mechanism involving up-and-down movement, such as the transfer mechanism 804 or the transfer mechanism 806. Note that the substrates may be transferred while being provided over the substrate supporting base 822. Of course, only the substrates after the bonding may also be transferred. Further, the transfer mechanism 1002 is not limited to a conveyer belt or a roller-carrying mechanism as long as it can suppress bending of the substrates.

After that, heat treatment to strengthen the bonding and separate the single crystal semiconductor substrate is performed in the heat treatment chamber 1000. This embodiment mode can be implemented in combination with any of Embodiment Modes 1 to 4, as appropriate.

Embodiment Mode 6

In this embodiment mode, an example of a manufacturing method of a semiconductor device using a semiconductor substrate of the present invention will be described with reference to FIGS. 11A to 11D, FIGS. 12A to 12C, FIGS. 13A to 13C, and FIGS. 14A and 14B. Note that a liquid crystal display device will be described as an example of a semiconductor device in this embodiment mode; however, a semiconductor device manufactured using the semiconductor substrate of the present invention is not limited to a liquid crystal display device.

First, a semiconductor substrate manufactured by the method described in Embodiment Mode 1, or the like is prepared (see FIG. 11A). Here, description is made using a structure in which an insulating layer 1102, an insulating layer 1104 and a single crystal semiconductor layer 1106 are sequentially provided over a base substrate 1100; however, the present invention is not limited thereto.

Next, the single crystal semiconductor layer 1106 is patterned into a desired shape, thereby forming island-shaped semiconductor layers. As etching processing in patterning, either dry etching (plasma etching or the like) or wet etching can be used. For treating a large-area substrate, plasma etching is more suitable. As an etching gas, a fluorine-based gas or a chlorine-based gas such as $CF_4$, $NF_3$, $Cl_2$, or $BCl_3$ may be used, and an inert gas such as He or Ar may be added thereto as appropriate. Further, in the case of applying etching processing by atmospheric pressure discharge, local discharge processing can be realized, whereby etching can be performed without forming a mask layer over an entire surface of the substrate.

Note that it is preferable to employ a structure in which the insulating layer 1102 and the insulating layer 1104 are left without being etched. The insulating layer 1102 and the insulating layer 1104 are left so that impurity elements (e.g., an alkali metal such as sodium or potassium; an alkaline earth metal such as magnesium or calcium; or a transition metal such as iron, copper, or nickel) contained in the base substrate 1100 can be prevented from entering the single crystal semiconductor layer.

After the single crystal semiconductor layer 1106 is patterned, a p-type impurity such as boron, aluminum, or gallium may be added in order to control a threshold voltage. For example, as a p-type impurity, boron can be added at a concentration of greater than or equal to $5 \times 10^{16}$ atoms/cm$^3$ and less than or equal to $1 \times 10^{18}$ atoms/cm$^3$.

Next, a gate insulating layer 1108 which covers the island-shaped single crystal semiconductor layers is formed (see FIG. 11B). Note that for convenience, the island-shaped single crystal semiconductor layers which are formed by patterning are referred to as single crystal semiconductor layers 1110, 1112, and 1114 here. The gate insulating layer 1108 is formed of a silicon-containing insulating film by a plasma CVD method, a sputtering method, or the like, at a thickness of greater than or equal to 10 nm and less than or equal to 150 nm. In specific, the gate insulating layer 1108 may be formed from a material such as an oxide material or a nitride material of silicon, which is typified by silicon nitride, silicon oxide, silicon oxynitride, and silicon nitride oxide. Note that the gate insulating layer 1108 may have a single-layer structure or a stacked-layer structure. Further, a thin silicon oxide film with a thickness of greater than or equal to 1 nm and less than or equal to 100 nm, preferably greater than or equal to 1 nm and less than or equal to 10 nm, more preferably greater than or equal to 2 nm and less than or equal to 5 nm may be formed between the single crystal semiconductor layer and the gate insulating layer. In order to form a gate insulating film having less leakage current at a low temperature, a rare gas element such as argon may be contained in a reaction gas.

Next, a first conductive film and a second conductive film, which serve as gate electrode layers, are stacked over the gate insulating layer 1108. The first conductive film may be formed at a thickness of about greater than or equal to 20 nm and less than or equal to 100 nm, and the second conductive film may be formed at a thickness of about greater than or equal to 100 nm and less than or equal to 400 nm. The first and second conductive films can be formed by a sputtering method, an evaporation method, a CVD method, or the like. The first and second conductive films may be formed of an element selected from tantalum, tungsten, titanium, molybdenum, aluminum, copper, chromium, neodymium, or the like; an alloy material or a compound material including any of those elements as its main component; or the like. Further, for the first and second conductive films, a semiconductor film typified by a polycrystalline silicon film doped with an impurity element such as phosphorus; an AgPdCu alloy film; or the like may be used. Note that although a conductive layer with a two-layer structure is described in this embodiment mode, the present invention is not limited thereto. Alternatively, a stacked-layer structure including three or more layers or a single-layer structure may be employed.

Then, masks 1116a, 1116b, 1116c, 1116d, and 1116e are formed from a resist material by a photolithography method. Then, the first conductive film and the second conductive film are processed into a desired shape with the use of the masks to form first gate electrode layers 1118a, 1118b, 1118c, and 1118d, a first conductive layer 1118e, and conductive layers 1120a, 1120b, 1120c, 1120d, and 1120e (see FIG. 11C).

Here, an inductively coupled plasma (ICP) etching method is used, and etching conditions (e.g., the amount of electric power applied to a coiled electrode layer, the amount of electric power applied to an electrode layer on the substrate side, and the electrode temperature on the substrate side) are regulated as appropriate, whereby etching can be performed so as to obtain a desired tapered shape. An angle and the like of the tapered shape may also be controlled by the shape of the masks. Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used for the etching gas, as appropriate. In this embodiment mode, the second conductive film is etched using an etching gas containing $CF_4$, $Cl_2$, and $O_2$, and then, the first conductive film is continuously etched using an etching gas containing $CF_4$ and $Cl_2$.

Next, the conductive layers 1120a, 1120b, 1120c, 1120d, and 1120e are processed into a desired shape using the masks 1116a, 1116b, 1116c, 1116d, and 1116e. At this time, etching is performed under an etching condition in which the selectivity of the second conductive film, which forms the conductive layers, to the first conductive film, which forms the first gate electrode layers and the first conductive layer, is high. By the etching, second gate electrode layers 1122a, 1122b, 1122c, and 1122d, and a second conductive layer 1122e are formed. In this embodiment mode, each of the second gate electrode layers and the second conductive layer has a tapered shape, and a taper angle of each of the second gate electrode layers and the second conductive layer is larger than a taper angle of each of the first gate electrode layers and the first conductive layer. Note that a "taper angle" refers to an angle formed by the meeting of a bottom surface with a side surface of an object. Thus, when the taper angle is 90°, the conductive layer has a perpendicular side surface to the bottom surface. With each taper angle set to a degree of less than 90°, a film to be stacked thereover adequately covers the conductive layer; thus, defects can be reduced. Note that in this embodiment mode, $Cl_2$, $SF_6$, and $O_2$ are used as an etching gas for forming the second gate electrode layers and the second conductive layer.

Through the aforementioned steps, gate electrode layers 1124a and 1124b can be formed in a peripheral driver circuit region 1180, and gate electrode layers 1124c and 1124d and a conductive layer 1124e can be formed in a pixel region 1182 (see FIG. 11D). Note that the masks 1116a, 1116b, 1116c, 1116d, and 1116e are removed after the aforementioned steps.

Next, an impurity element imparting n-type conductivity is added using the gate electrode layers 1124a, 1124b, 1124c, and 1124d as masks, thereby forming first n-type impurity regions 1126a, 1126b, 1128a, 1128b, 1130a, 1130b, and 1130c (see FIG. 12A). In this embodiment mode, doping is performed by using phosphine (PH$_3$) as a doping gas containing an impurity element. Here, doping is performed so that phosphorus (P) that is an impurity element imparting n-type conductivity is contained in the first n-type impurity regions at a concentration of approximately greater than or equal to $1 \times 10^{16}$ atoms/cm$^3$ and less than or equal to $5 \times 10^{19}$ atoms/cm$^3$.

Next, a mask 1132a which covers the single crystal semiconductor layer 1110 and masks 1132b and 1132c which cover part of the single crystal semiconductor layer 1114 are formed. An impurity element imparting n-type conductivity is added using the masks 1132a, 1132b, and 1132c, and the second gate electrode layer 1122b as masks. Accordingly, second n-type impurity regions 1134a and 1134b; third n-type impurity regions 1136a and 1136b; second n-type impurity regions 1140a, 1140b, and 1140c; and third n-type impurity regions 1142a, 1142b, 1142c, and 1142d are formed. In this embodiment mode, doping is performed by using phosphine ($PH_3$) as a doping gas containing an impurity element. Here, doping is performed so that phosphorus (P) that is an impurity element imparting n-type conductivity is contained in the second n-type impurity regions at a concentration of approximately greater than or equal to $1\times10^{17}$ atoms/cm$^3$ and less than or equal to $1\times10^{21}$ atoms/cm$^3$. An impurity element which imparts n-type conductivity is added to the third n-type impurity regions 1136a and 1136b so as to contain the impurity element imparting n-type conductivity at a concentration which is the same as or substantially the same as or at a slightly higher concentration than that of the third n-type impurity regions 1142a, 1142b, 1142c, and 1142d. In addition, channel formation regions 1138, 1144a, and 1144b are formed (see FIG. 12B).

Each of the second n-type impurity regions is a high-concentration impurity region and functions as a source or a drain. On the other hand, each of the third n-type impurity regions is a low-concentration impurity region and functions as a so-called LDD (lightly doped drain) region. Each of the third n-type impurity regions 1136a and 1136b is formed in a region overlapping with the first gate electrode layer 1118b. Accordingly, an electric field in the vicinity of a source or a drain can be relieved, and reduction of on-state current due to hot carriers can be prevented. On the other hand, each of the third n-type impurity regions 1142a, 1142b, 1142c, and 1142d does not overlap with the gate electrode layer 1124c or 1124d; thus, an effect of reducing off-state current can be obtained.

Next, the masks 1132a, 1132b, and 1132c are removed, and a mask 1146a which covers the single crystal semiconductor layer 1112 and a mask 1146b which covers the single crystal semiconductor layer 1114 are formed. An impurity element imparting p-type conductivity is added using the masks 1146a and 1146b and the gate electrode layer 1124a as masks. Accordingly, first p-type impurity regions 1148a and 1148b, and second p-type impurity regions 1150a and 1150b are formed. In this embodiment mode, doping is performed using diborane ($B_2H_6$) as a doping gas containing an impurity element. Here, boron (B) which is an impurity element imparting p-type conductivity is added to the first p-type impurity regions and the second p-type impurity regions at a concentration of approximately greater than or equal to $1\times10^{18}$ atoms/cm$^3$ and less than or equal to $5\times10^{21}$ atoms/cm$^3$. Further, a channel formation region 1152 is formed (see FIG. 12C).

Each of the first p-type impurity regions is a high-concentration impurity region and functions as a source or a drain. On the other hand, each of the second p-type impurity regions is a low-concentration impurity region and functions as a so-called LDD (lightly doped drain) region.

Subsequently, the masks 1146a and 1146b are removed. After the masks are removed, an insulating film may be formed so as to cover the side surfaces of the gate electrode layers. The insulating film can be formed by a plasma CVD method or a low-pressure CVD (LPCVD) method. Heat treatment, intense light irradiation, laser irradiation, or the like may be performed to activate the impurity elements.

Subsequently, an interlayer insulating layer which covers the gate electrode layers and the gate insulating layer is formed. In this embodiment mode, a stacked-layer structure of insulating films 1154 and 1156 is employed (see FIG. 13A). A silicon nitride oxide film is formed as the insulating film 1154 with a thickness of 100 nm and a silicon oxynitride film is formed as the insulating film 1156 with a thickness of 900 nm. Although the two-layer structure is employed in this embodiment mode, a single-layer structure or a stacked-layer structure including three or more layers may be employed. In this embodiment mode, the insulating films 1154 and 1156 are successively formed by a plasma CVD method without being exposed to the air. Note that materials for the insulating films 1154 and 1156 are not limited to the above-described material.

The insulating films 1154 and 1156 can also be formed using a material selected from silicon oxide, silicon nitride, aluminum oxide, aluminum nitride, aluminum oxynitride, aluminum nitride oxide containing more nitrogen than oxygen, diamond-like carbon (DLC), a carbon film containing nitrogen, and other substances containing an inorganic insulating material. Further, a siloxane resin may be used as well. Note that a siloxane resin is a resin containing a Si—O—Si bond. Siloxane is composed of a skeleton formed by the bond of silicon (Si) and oxygen (O). An organic group (such as an alkyl group and an aryl group) or a fluoro group may be used as a substituent. A fluoro group may be included in the organic group. Alternatively, an organic insulating material such as polyimide, acrylic, polyamide, polyimide amide, benzocyclobutene, or polysilazane can be used.

Next, contact holes (openings) that reach the single crystal semiconductor layers and the gate electrode layer are formed in the insulating films 1154 and 1156 and the gate insulating layer 1108, using a mask formed using a resist material. Etching may be performed once or a plurality of times depending on the selectivity of materials to be used. In this embodiment mode, first etching is performed under a condition that selectivity of the insulating film 1156 that is a silicon oxynitride film to each of the insulating film 1154 that is a silicon nitride oxide film and the gate insulating layer 1108 can be obtained; thus, the insulating film 1156 is removed. Next, the insulating film 1154 and the gate insulating layer 1108 are removed by second etching, and openings each of which reaches a source or a drain are formed.

Then, a conductive film is formed so as to cover the openings, and the conductive film is etched. Accordingly, source or drain electrode layers 1158a, 1158b, 1160a, 1160b, 1162a, and 1162b which are each electrically connected to part of a source or drain region are formed. For each source or drain electrode layer, one or a plurality of elements selected from aluminum, tantalum, titanium, molybdenum, tungsten, neodymium, chromium, nickel, platinum, gold, silver, copper, magnesium, scandium, cobalt, zinc, niobium, silicon, phosphorus, boron, arsenic, gallium, indium, and tin; a compound or an alloy material that contains any of the above-mentioned elements as its main component (for example, indium tin oxide (ITO), indium zinc oxide (IZO), indium tin oxide to which silicon oxide has been added (ITSO), zinc oxide, aluminum-neodymium (Al—Nd), magnesium-silver (Mg—Ag), or the like); a material that is a combination of any of these compounds; or the like can be used. Alternatively, a silicide (for example, aluminum-silicon, molybdenum-silicon, or nickel silicide), a nitrogen-containing compound (for example, titanium nitride, tantalum nitride, or molybdenum nitride), silicon (Si) that is doped with an impurity element such as phosphorus (P), or the like can be used.

Through the above steps, a p-channel thin film transistor 1164 and an n-channel thin film transistor 1166 are formed in the peripheral driver circuit region 1180, and an n-channel thin film transistor 1168 and a capacitor wiring 1170 are formed in the pixel region 1182 (see FIG. 13B).

Next, an insulating film 1172 is formed as a second interlayer insulating layer. The insulating film 1172 can be formed from a material selected from silicon oxide, silicon nitride, silicon oxynitride, silicon nitride oxide, aluminum oxide, aluminum nitride, aluminum oxynitride, aluminum nitride oxide containing more nitrogen than oxygen, aluminum oxide, diamond-like carbon (DLC), carbon containing nitrogen, phosphosilicate glass (PSG), borophosphosilicate glass (BPSG), polysilazane, or other substances containing an inorganic insulating material. Further, a siloxane resin may be used as well. Alternatively, an organic insulating material such as polyimide, acrylic, polyamide, polyimide amide, or benzocyclobutene can be used.

Next, a contact hole is formed in the insulating film 1172 of the pixel region 1182 to form a pixel electrode layer 1174 (see FIG. 13C). The pixel electrode layer 1174 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, or metal such as tungsten, molybdenum, zirconium, hafnium, vanadium, niobium, tantalum, chromium, cobalt, nickel, titanium, platinum, aluminum, copper, or silver, or an alloy or a metal nitride thereof.

A conductive composition including a conductive high molecule (also referred to as a conductive polymer) can be used for the pixel electrode layer 1174. A thin film of a conductive composition preferably has a sheet resistance of less than or equal to 10000 Ω/sq. When a thin film of a conductive composition is formed as a pixel electrode layer having a light-transmitting property, light transmittance is preferably greater than or equal to 70% at a wavelength of 550 nm. In addition, the resistance of the conductive high molecule which is contained in the conductive composition is preferably less than or equal to 0.1 Ω·cm.

As the conductive high molecule, a so-called π electron conjugated conductive high molecule can be used. For example, polyaniline and a derivative thereof, polypyrrole and a derivative thereof, polythiophene and a derivative thereof, a copolymer of those materials, and the like can be given.

Specific examples of the conjugated conductive high molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The above conductive high molecule may be used alone, or an organic resin may be added thereto in order to adjust the characteristics of the films.

Furthermore, by doping a conductive composition with an acceptor type dopant or a donor type dopant, an oxidation-reduction potential of a conjugated electron of a conjugated conductive high molecule may be changed, whereby electrical conductivity may be adjusted.

The conductive composition as described above is dissolved in water or an organic solvent (e.g., an alcohol-based solvent, a ketone-based solvent, an ester-based solvent, a hydrocarbon-based solvent, or an aromatic-based solvent), so that a thin film which serves as the pixel electrode layer 1174 can be formed by an application method, a coating method, a droplet discharge method (also referred to as an ink-jet method), a printing method, or the like.

Figure 14A:
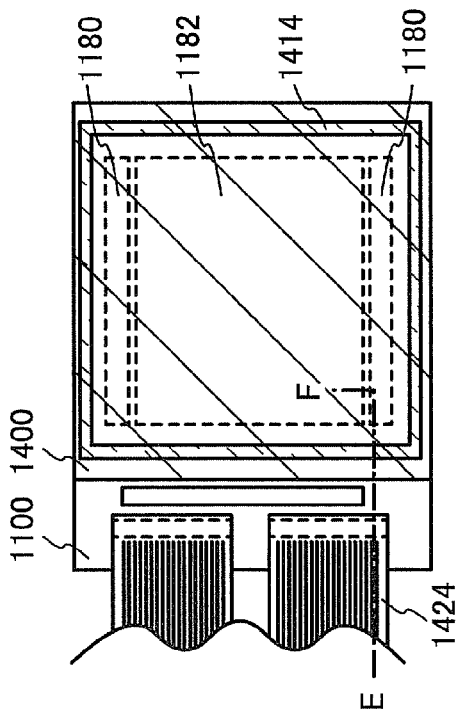
FIGS. 14A and 14B are a plane view and a cross-sectional view of the semiconductor device, respectively.
Figure 14B:
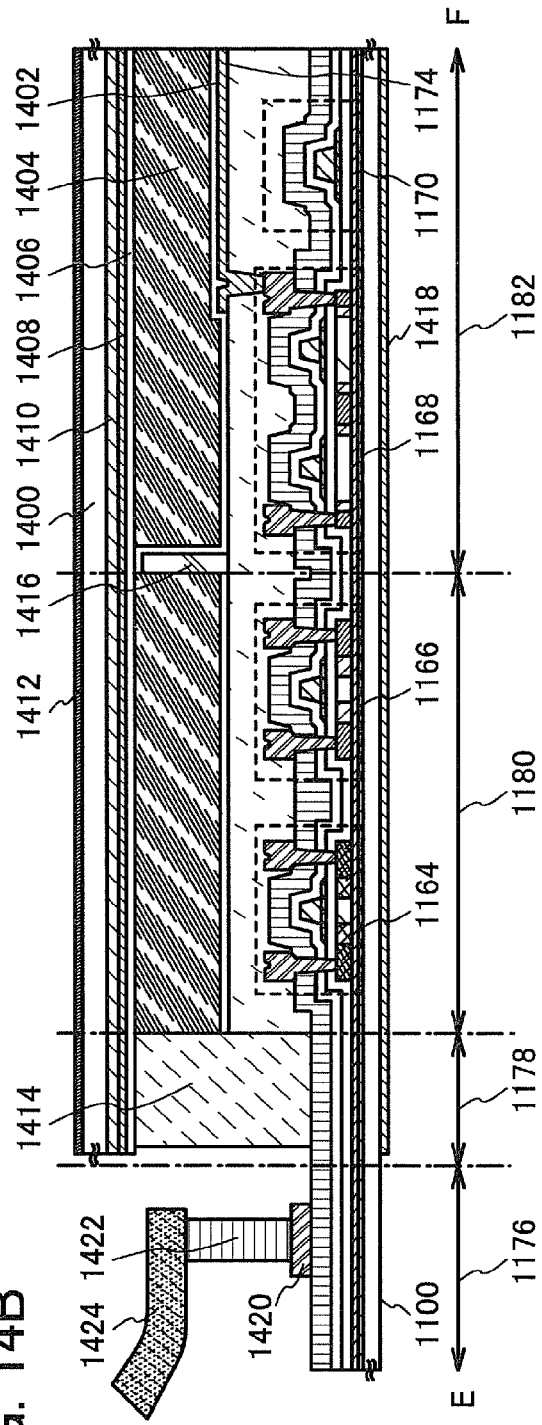

Subsequently, an insulating layer 1402 referred to as an alignment film is formed to cover the pixel electrode layer 1174 and the insulating film 1172 (see FIG. 14B). The insulating layer 1402 can be formed by a screen printing method or an offset printing method. Note that FIGS. 14A and 14B illustrate a plan view and a cross-sectional view of a semiconductor device, respectively. FIG. 14A is a plan view of a semiconductor device, and FIG. 14B is a cross-sectional view taken along line E-F of FIG. 14A. The semiconductor device includes an external terminal connection region 1176, a sealing region 1178, the peripheral driver circuit region 1180, and the pixel region 1182.

After forming the insulating layer 1402, rubbing treatment is performed. An insulating layer 1406 which serves as an alignment film can be formed in a manner similar to the insulating layer 1402.

Then, a counter substrate 1400 is attached to the base substrate 1100 with a sealing material 1414 and a spacer 1416 interposed therebetween, and a liquid crystal layer 1404 is provided in a gap therebetween. Note that the counter substrate 1400 is provided with the insulating layer 1406 which serves as an alignment film, a conductive layer 1408 which serves as a counter electrode, a coloring layer 1410 which serves as a color filter, a polarizer 1412 (also referred to as a polarizing plate), or the like. Note that although the base substrate 1100 is provided with a polarizer 1418 (a polarizing plate) in this embodiment mode, the present invention is not limited thereto. For example, a polarizer may be provided on one side in a reflective type liquid crystal display device.

Subsequently, an FPC 1424 is connected to a terminal electrode layer 1420 that is electrically connected to the pixel region, with an anisotropic conductive layer 1422 interposed therebetween. The FPC 1424 has a function of transmitting a signal from the external. The liquid crystal display device can be manufactured by the above-described process.

In this embodiment mode, a liquid crystal display device is manufactured using a semiconductor substrate described in Embodiment Mode 1, or the like. Therefore, a semiconductor element which serves as switching of the liquid crystal, a semiconductor element of a driver circuit region, or the like can be manufactured using a single crystal semiconductor layer which is bonded favorably. Accordingly, since the characteristics of the semiconductor element are improved, display characteristics of the liquid crystal display device are greatly improved. Further, since reliability of the semiconductor element is improved, reliability of the liquid crystal display device is also improved.

Note that in this embodiment mode, a method for manufacturing a liquid crystal display device is described; however, a semiconductor device formed using the semiconductor substrate of the present invention is not limited thereto. This embodiment mode can be implemented in combination with any of Embodiment Modes 1 to 5 as appropriate Embodiment Mode 7

In this embodiment mode, a semiconductor device having a light-emitting element related to the present invention (an electroluminescence display device) will be described. Note that as to a method for manufacturing transistors which are used for a peripheral circuit region, a pixel region, and the like, it is possible to refer to Embodiment Mode 6; thus, the details are omitted.

As to a semiconductor device having a light-emitting element, any one of bottom emission, top emission, and dual emission can be employed. In this embodiment mode, a semiconductor device employing bottom emission will be described with reference to FIGS. 15A and 15B; however, the present invention is not limited thereto.

Figure 15A:
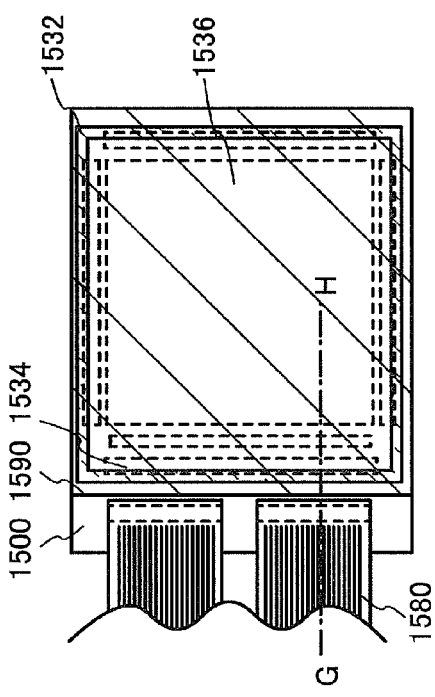
FIGS. 15A and 15B are a plane view and a cross-sectional view of the semiconductor device, respectively.
Figure 15B:
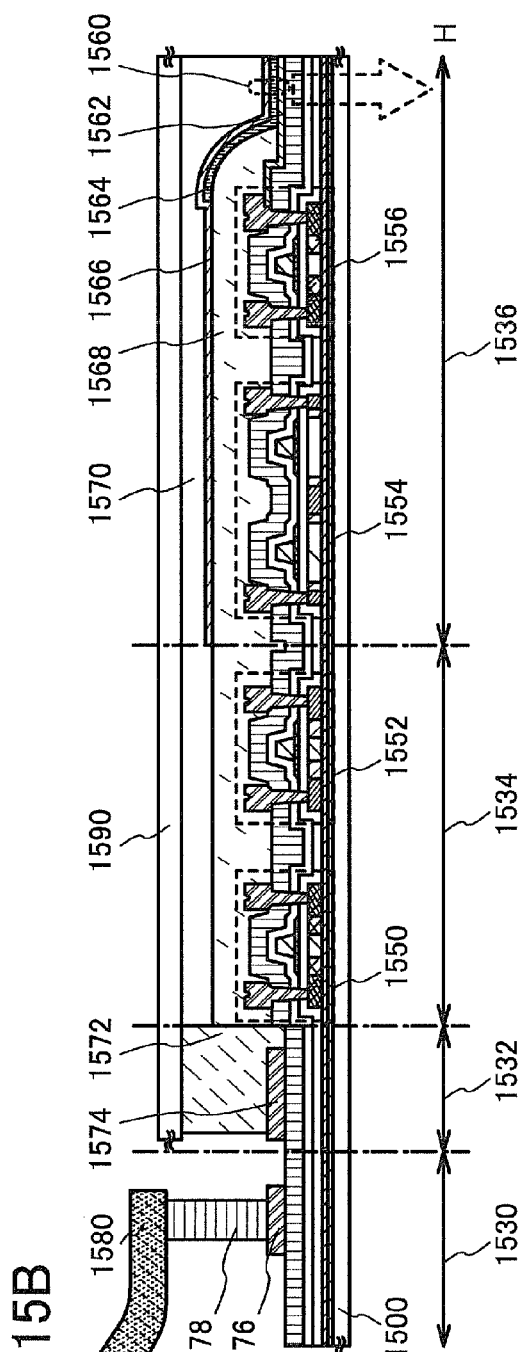

In a semiconductor device illustrated in FIGS. 15A and 15B, light is emitted downwardly (in a direction indicated by an arrow). Here, FIG. 15A is a plan view of the semiconductor device, and FIG. 15B is a cross-sectional view taken along line G-H of FIG. 15A. In FIGS. 15A and 15B, the semiconductor device includes an external terminal connection region 1530, a sealing region 1532, a driver circuit region 1534, and a pixel region 1536.

The semiconductor device illustrated in FIGS. 15A and 15B includes an element substrate 1500, thin film transistors 1550, 1552, 1554, and 1556, a light-emitting element 1560, an insulating layer 1568, a filler 1570, a sealant 1572, a wiring layer 1574, a terminal electrode layer 1576, an anisotropic conductive layer 1578, an FPC 1580, a sealing substrate 1590, and the like. Note that the light-emitting element 1560 includes a first electrode layer 1562, a light-emitting layer 1564, and a second electrode layer 1566.

As the first electrode layer 1562, a light-transmitting conductive material is used so that light emitted from the light-emitting layer 1564 can be transmitted. On the other hand, as the second electrode layer 1566, a conductive material which can reflect light emitted from the light-emitting layer 1564 is used.

As the first electrode layer 1562, indium oxide containing tungsten oxide, indium zinc oxide containing tungsten oxide, indium oxide containing titanium oxide, indium tin oxide containing titanium oxide, or the like can be used. Of course, indium tin oxide (ITO), indium zinc oxide (IZO), indium tin oxide to which silicon oxide is added (ITSO), or the like may also be used.

A conductive composition containing a conductive high molecule (also referred to as a conductive polymer) can also be used as the first electrode layer 1562. Note that as to the details, it is possible to refer to Embodiment Mode 6; thus, the descriptions are omitted here.

As the second electrode layer 1566, a conductive film formed of titanium, tungsten, nickel, gold, platinum, silver, copper, tantalum, molybdenum, aluminum, magnesium, calcium, lithium, or an alloy thereof may be used. A substance having high reflectivity in a visible region is preferable, and an aluminum film is used in this embodiment mode.

Note that in the case of employing each of top emission and dual emission, the design of the electrode layers may be changed, as appropriate. Specifically, in the case of top emission, the first electrode layer 1562 is formed using a reflective material, and the second electrode layer 1566 is formed using a light-transmitting material. In the case of dual emission, the first electrode layer 1562 and the second electrode layer 1566 may be formed using a light-transmitting material. Note that in the case of bottom emission and top emission, a structure may be employed in which one electrode layer is formed using a light-transmitting material and the other electrode layer is formed in a stacked-layer structure of a light-transmitting material and a light-reflecting material. The material that can be used for the electrode layers is similar to the material in the case of bottom emission; thus, the descriptions are omitted here.

Note that even a material like metal which has no light-transmitting property can transmit light when it has a small thickness (approximately greater than or equal to 5 nm and less than or equal to 30 nm). Accordingly, an electrode layer which transmits light can also be formed using the above-described light-reflecting material.

The sealing substrate 1590 may be provided with a color filter (a coloring layer). The color filter (a coloring layer) can be formed by an evaporation method or a droplet discharge method. Alternatively, a color conversion layer may be used.

In this embodiment mode, an electroluminescence display device is manufactured using the semiconductor substrate described in Embodiment Mode 1, or the like. Therefore, a semiconductor element which serves as switching of the light emission of the electroluminescence display device, a semiconductor element of a driver circuit region of the electroluminescence display device, or the like can be manufactured using a single crystal semiconductor layer which is bonded favorably. Accordingly, since characteristics of the semiconductor element are improved, display characteristics of the electroluminescence display device are also improved. Further, since reliability of the semiconductor element is improved, reliability of the electroluminescence display device is also improved.

Note that in this embodiment mode, an electroluminescence display device is described; however, a semiconductor device formed using the semiconductor substrate of the present invention is not limited thereto. This embodiment mode can be implemented in combination with any of Embodiment Modes 1 to 6, as appropriate.

Embodiment Mode 8

In this embodiment mode, another example of a semiconductor device of the present invention will be described with reference to FIGS. 16 and 17. Note that a microprocessor and an electronic tag are given as examples in this embodiment mode; however, the semiconductor device of the present invention is not limited thereto.

Figure 16:
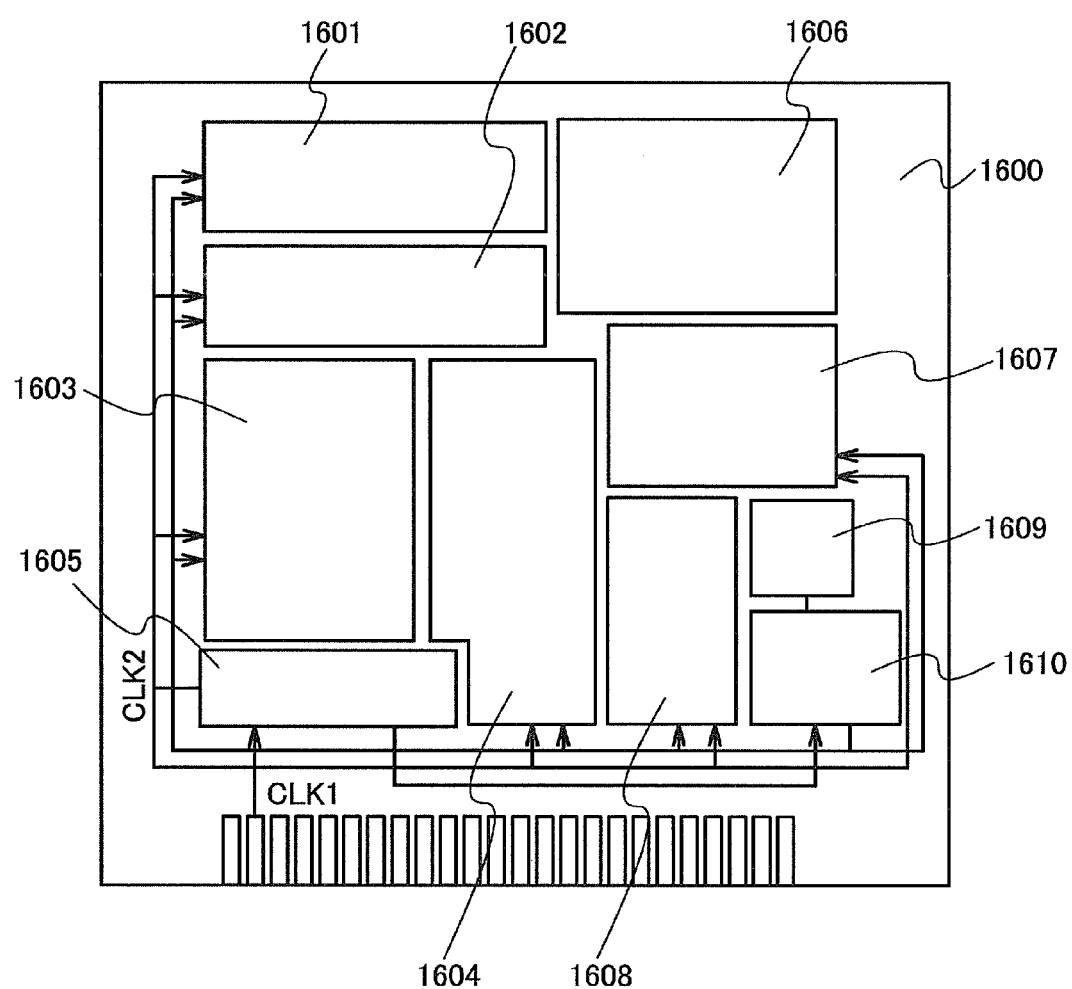
FIG. 16 is a view illustrating a structure of the semiconductor device.
Figure 17:
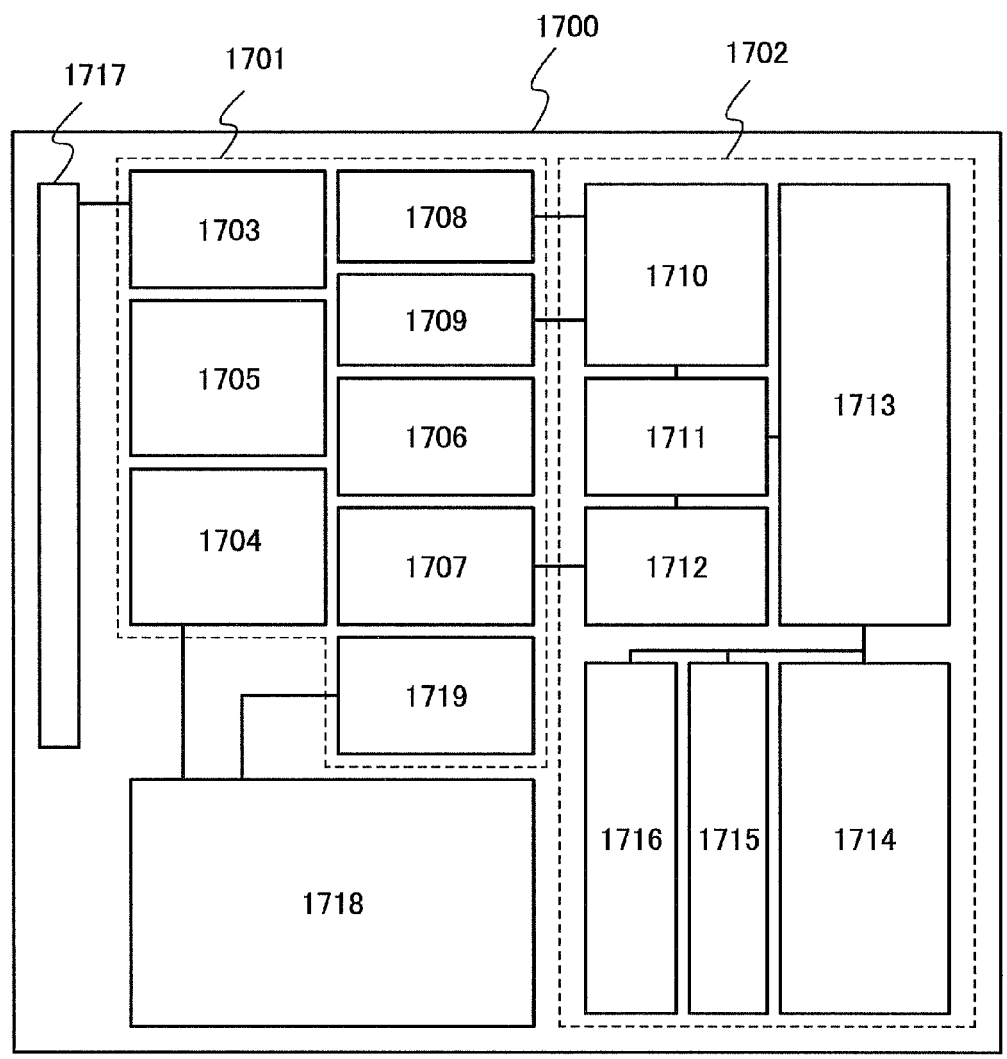
FIG. 17 is a view illustrating a structure of the semiconductor device.

FIG. 16 illustrates an example of a structure of a microprocessor of the present invention. A microprocessor 1600 in FIG. 16 is manufactured using the semiconductor substrate of the present invention. This microprocessor 1600 has an arithmetic logic unit (ALU) 1601, an ALU controller 1602, an instruction decoder 1603, an interrupt controller 1604, a timing controller 1605, a register 1606, a register controller 1607, a bus interface (Bus I/F) 1608, a read-only memory (ROM) 1609, and a ROM interface (ROM I/F) 1610.

An instruction input to the microprocessor 1600 through the bus interface 1608 is input to the instruction decoder 1603, decoded therein, and then input to the ALU controller 1602, the interrupt controller 1604, the register controller 1607, and the timing controller 1605. The ALU controller 1602, the interrupt controller 1604, the register controller 1607, and the timing controller 1605 conduct various controls based on the decoded instruction. In specific, the ALU controller 1602 generates signals for controlling the operation of the ALU 1601. While the microprocessor 1600 is executing a program, the interrupt controller 1604 processes an interrupt request from an external input/output device or a peripheral circuit based on its priority or the like. The register controller 1607 generates an address of the register 1606, and reads and writes data from and to the register 1606 in accordance with the state of the microprocessor 1600. The timing controller 1605 generates signals for controlling timing of operation of the ALU 1601, the ALU controller 1602, the instruction decoder 1603, the interrupt controller 1604, and the register controller 1607.

For example, the timing controller 1605 is provided with an internal clock generator for generating an internal clock signal CLK2 based on a reference clock signal CLK1, and supplies the internal clock signal CLK2 to the above-mentioned various circuits. Note that the structure of the microprocessor 1600 illustrated in FIG. 16 is merely an example, and can be changed as appropriate depending on the uses.

In this embodiment mode, a microprocessor is manufactured using a semiconductor substrate described in Embodiment Mode 1, or the like. Accordingly, characteristics of the semiconductor element are improved, which contributes to improvement in performance of the microprocessor. Further, since reliability of the semiconductor element is improved, reliability of the microprocessor is also improved.

Next, an example of a semiconductor device having an arithmetic function and capable of contactless data transmission and reception is described with reference to FIG. 17. FIG. 17 illustrates an example of a wireless tag which transmits and receives signals to/from an external device by wireless communication. Note that the wireless tag of the present invention includes a central processing unit (CPU), so to speak, a miniaturized computer. A wireless tag 1700 has an analog circuit portion 1701 and a digital circuit portion 1702. The analog circuit portion 1701 has a resonance circuit 1703 with a resonance capacitor, a rectifier circuit 1704, a constant voltage circuit 1705, a reset circuit 1706, an oscillator circuit 1707, a demodulator circuit 1708 and a modulator circuit 1709. The digital circuit portion 1702 has an RF interface 1710, a control register 1711, a clock controller 1712, a CPU interface 1713, a CPU 1714, a RAM 1715, and a ROM 1716.

The operation of the wireless tag 1700 having such a structure is described below. When an antenna 1717 receives a signal from outside, an induced electromotive force is generated in the resonance circuit 1703 based on the signal. A capacitor portion 1718 is charged with the induced electromotive force which has passed through the rectifier circuit 1704. This capacitor portion 1718 is preferably formed using a capacitor such as a ceramic capacitor or an electric double layer capacitor, or the like. The capacitor portion 1718 may be formed over the same substrate as the wireless tag 1700 or may be attached as another component to a substrate that partially constitutes the wireless tag 1700.

The reset circuit 1706 generates a signal for resetting and initializing the digital circuit portion 1702. For example, a signal that rises after an increase in power supply voltage is generated as the reset signal. The oscillator circuit 1707 changes the frequency and duty ratio of a clock signal in response to a control signal generated by the constant voltage circuit 1705. The demodulator circuit 1708 having a low pass filter binarizes changes in amplitude of an amplitude-modulated (ASK) reception signals, for example. The modulator circuit 1709 varies the amplitude of an amplitude-modulated (ASK) transmission signal and transmits the signal. The modulator circuit 1709 varies the resonance point of the resonance circuit 1703, thereby varying the amplitude of communication signals. The clock controller 1712 generates a control signal for changing the frequency and duty ratio of a clock signal in accordance with the power supply voltage or a consumption current of the CPU 1714. The power supply voltage is monitored by the power management circuit 1719.

A signal that is input to the wireless tag 1700 from the antenna 1717 is demodulated by the demodulator circuit 1708, and then divided into a control command, data, and the like by the RF interface 1710. The control command is stored in the control register 1711. The control command includes a reading instruction of data stored in the ROM 1716, a writing instruction of data to the RAM 1715, an arithmetic instruction to CPU 1714, and the like. The CPU 1714 accesses the ROM 1716, the RAM 1715, and the control register 1711 via the CPU interface 1713. The CPU interface 1713 has a function to generate an access signal for any one of the ROM 1716, the RAM 1715, and the control register 1711 based on an address requested by the CPU 1714.

As an arithmetic method of the CPU 1714, a method may be employed in which the ROM 1716 stores an operating system (OS) and a program is read and executed at the time of starting operation. Alternatively, a method may be employed in which an arithmetic circuit is formed and an arithmetic process is conducted using hardware. In a method in which both hardware and software are used, a method can be employed in which the circuit dedicated to arithmetic conducts part of process and the CPU 1714 conducts the other part of the arithmetic process by using a program.

In this embodiment mode, a wireless tag is manufactured using a semiconductor substrate described in Embodiment Mode 1, or the like. Accordingly, characteristics of the semiconductor element are improved, which contributes to improvement in performance of the wireless tag. Further, since reliability of the semiconductor element is improved, reliability of the wireless tag is also improved.

Note that this embodiment mode can be implemented in combination with any of Embodiment Modes 1 to 7, as appropriate.

Embodiment Mode 9

In this embodiment mode, an electronic device using a semiconductor device of the present invention, particularly using a display device will be described with reference to FIGS. 18A to 18H and FIGS. 19A to 19C.

As electronic devices manufactured using the semiconductor device (particularly, display device), the following can be given: a camera such as a video camera or a digital camera, a goggle type display (a head mounted display), a navigation system, an audio reproducing device (car audio set, or the like), a computer, a game machine, a portable information terminal (mobile computer, a cellular phone, a portable game machine, an e-book reader, or the like), and an image reproducing device provided with a recording medium (specifically, a device provided with a display that can reproduce a recording medium such as a digital versatile disc (DVD) and display the image), and the like.

Figure 18A:
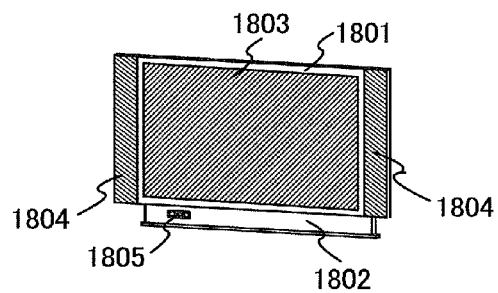
FIGS. 18A to 18H are views each illustrating an electronic appliance including the semiconductor device.

FIG. 18A illustrates a television set or a monitor of a personal computer. The television set or monitor of a personal computer includes a housing 1801, a support stand 1802, a display portion 1803, speaker portions 1804, video input terminals 1805, and the like. The semiconductor device of the present invention is used for the display portion 1803. According to the present invention, high-reliable and high-performance television sets or high-reliable and high-performance monitors of personal computers can be provided.

Figure 18B:
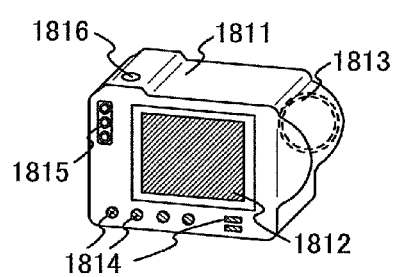

FIG. 18B illustrates a digital camera. On the front side part of a main body 1811, an image receiver 1813 is provided, and on the top side part of the main body 1811, a shutter button 1816 is provided. Furthermore, on the back side part of the main body 1811, a display portion 1812, operation keys 1814, and an external connection port 1815 are provided. The semiconductor device of the present invention is used for the display portion 1812. According to the present invention, high-reliable and high-performance digital cameras can be provided.

Figure 18C:
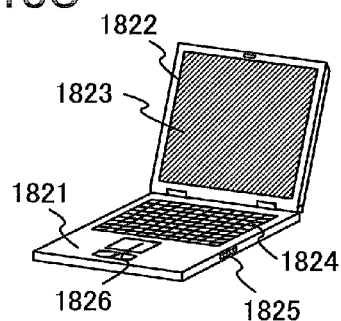

FIG. 18C illustrates a notebook personal computer. In a main body 1821, a keyboard 1824, an external connection port 1825, and a pointing device 1826 are provided. Furthermore, a housing 1822 that has a display portion 1823 is attached to the main body 1821. The semiconductor device of the present invention is used for the display portion 1823. According to the present invention, high-reliable and high-performance notebook personal computers can be provided.

Figure 18D:
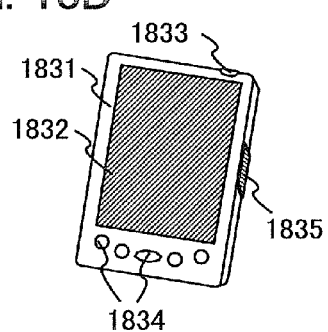

FIG. 18D illustrates a mobile computer that includes a main body 1831, a display portion 1832, a switch 1833, operation keys 1834, an infrared port 1835, and the like. Furthermore, an active matrix display device is provided in the display portion 1832. The semiconductor device of the present invention is used for the display portion 1832. According to the present invention, high-reliable and high-performance mobile computers can be provided.

Figure 18E:
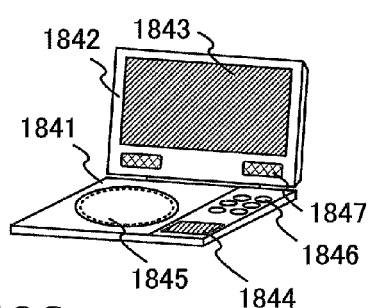

FIG. 18E illustrates an image reproducing device. In a main body 1841, a display portion 1844, a storage media reader 1845, and operation keys 1846 are provided. Furthermore, a housing 1842 that has speaker portions 1847 and a display portion 1843 is attached to the main body 1841. The semiconductor device of the present invention is used for each of the display portion 1843 and the display portion 1844. According to the present invention, high-reliable and high-performance image reproducing devices can be provided.

Figure 18F:
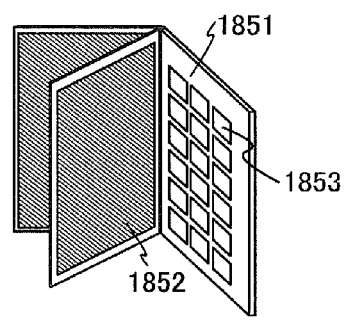

FIG. 18F illustrates an electronic book reader. In a main body 1851, operation keys 1853 are provided. Furthermore, a plurality of display portions 1852 is attached to the main body 1851. The semiconductor device of the present invention is used for the display portion 1852. According to the present invention, high-reliable and high-performance electronic book readers can be provided.

Figure 18G:
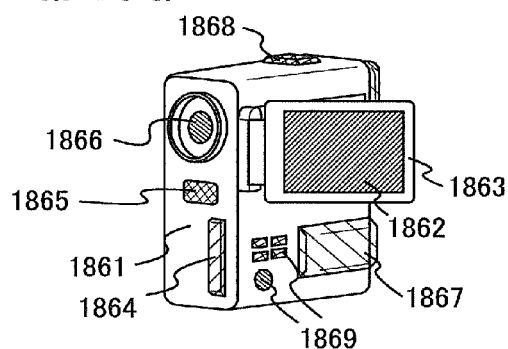

FIG. 18G illustrates a video camera. In a main body 1861, an external connection port 1864, a remote control receiver 1865, an image receiver 1866, a battery 1867, an audio input portion 1868, operation keys 1869 are provided. Furthermore, a housing 1863 that has a display portion 1862 is attached to the main body 1861. The semiconductor device of the present invention is used for the display portion 1862. According to the present invention, high-reliable and high-performance video cameras can be provided.

Figure 18H:
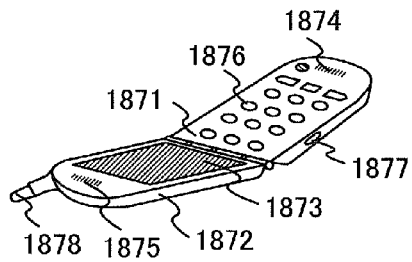

FIG. 18H illustrates a mobile phone, which includes a main body 1871, a housing 1872, a display portion 1873, an audio input portion 1874, an audio output portion 1875, operation keys 1876, an external connection port 1877, an antenna 1878, and the like. The semiconductor device of the present invention is used for the display portion 1873. According to the present invention, high-reliable and high-performance mobile phones can be provided.

Figure 19A:
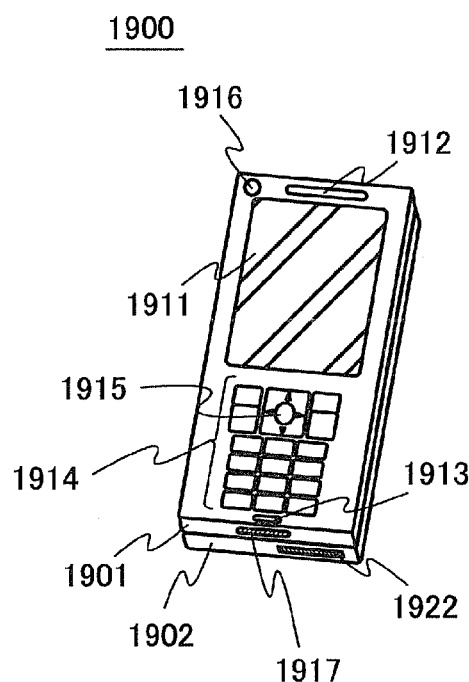
FIGS. 19A to 19C are views illustrating an electronic appliance including the semiconductor device.
Figure 19B:
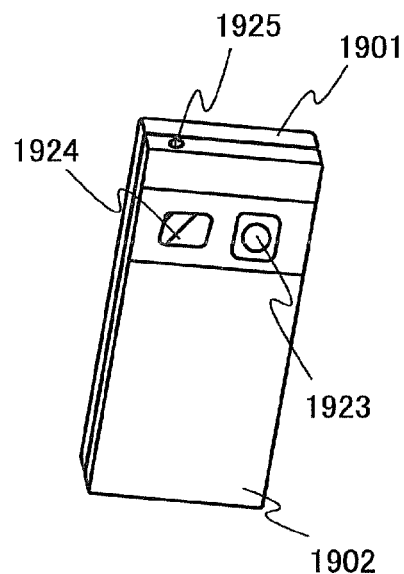
Figure 19C:
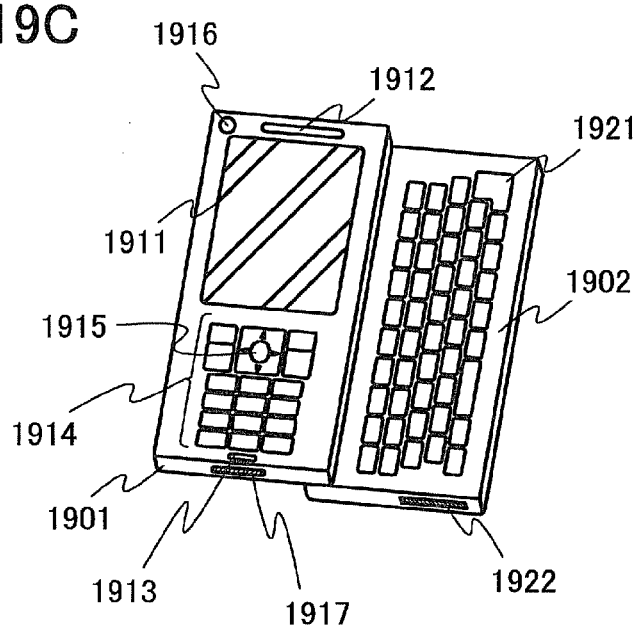
Figure 20A:
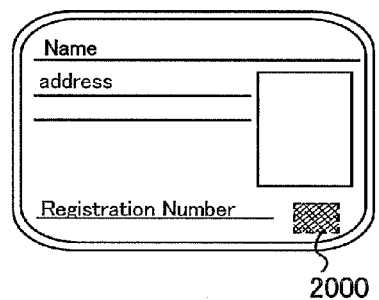
FIGS. 20A to 20F are views each illustrating a use mode of the semiconductor device.
Figure 20B:
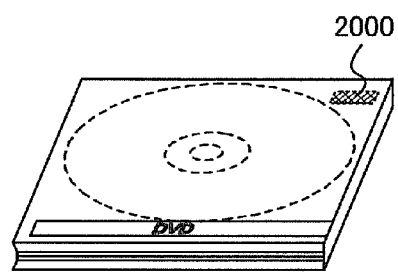
Figure 20C:
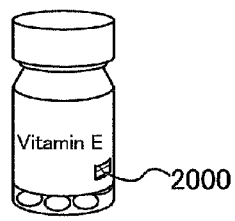
Figure 20D:
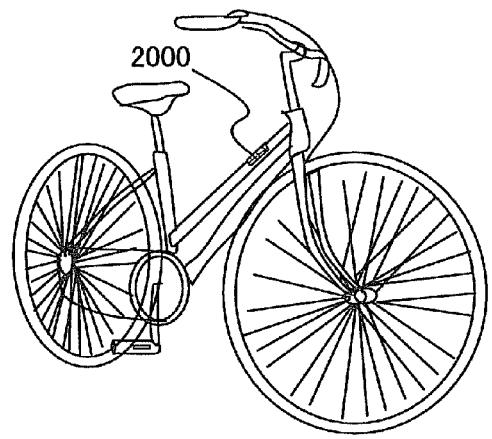
Figure 20E:
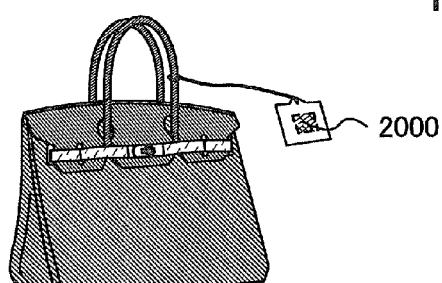
Figure 20F:
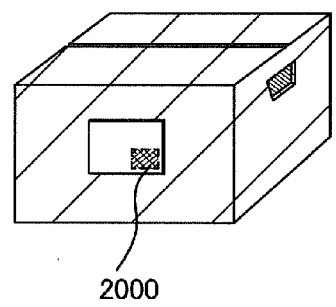

FIGS. 19A to 19C illustrate a structural example of a portable electronic device 1900 having functions as a telephone and an information terminal. FIG. 19A is a front view, FIG. 19B is a back view, and FIG. 19C is a developed view. The portable electronic device 1900 has functions as both a telephone and an information terminal and is an electronic device so-called a smartphone which is capable of various data processing in addition to voice call.

The portable electronic device 1900 includes housings 1901 and 1902. The housing 1901 is provided with a display portion 1911, a speaker 1912, a microphone 1913, operation keys 1914, a pointing device 1915, a lens 1916 for camera, an external connection terminal 1917, and the like. The housing 1902 is provided with a keyboard 1921, an external memory slot 1922, a lens 1923 for camera, a light 1924, an earphone terminal 1925, and the like. Moreover, an antenna is built into the housing 1901. In addition to the above-described structure, a non-contact IC chip, a small size memory device, or the like can be built therein.

A semiconductor device of the present invention is incorporated in the display portion 1911. An image displayed (and direction in which the image is displayed) in the display portion 1911 variously changes depending on a use mode of the portable electronic device 1900. Moreover, since the display portion 1911 and the lens 1916 for camera are provided on the same surface, voice call (so-called videophone) with images can be possible. Note that the speaker 1912 and the microphone 1913 can be used not only for voice call but also for recording, reproducing, or the like. In the case where a still image and a moving image are shot by using the lens 1923 for camera (and the light 1924), the display portion 1911 is used as a finder. The operation keys 1914 are used for incoming/outgoing of phone call, inputting simple information such as e-mail, screen scrolling, moving cursor, and the like.

The housings 1901 and 1902 overlapped with each other (FIG. 19A) slide and can be developed as illustrated in FIG. 19C, so that the portable electronic device 1900 can be used as an information terminal. In that case, smooth operation with the keyboard 1921 and the pointing device 1915 can be performed. The external connection terminal 1917 can be connected to various cables such as an AC adapter or a USB cable, whereby the portable electronic device 1900 can be charged or can perform data communication with a computer or the like. Moreover, by inserting a recording medium into the external memory slot 1922, the portable electronic device 400 can deal with storing and moving data with higher capacitance. In addition to the above-described functions, a function of wireless communication by using electromagnetic waves such as infrared rays, a television receiving function, and the like may be included. According to the present invention, high-reliable and high-performance portable electronic devices can be provided.

As described above, the present invention can be widely applied to and used in electronic devices in a wide variety of fields. Note that this embodiment mode can be implemented in combination with any of Embodiment Modes 1 to 8, as appropriate.

Embodiment Mode 9

In this embodiment mode, applications of a semiconductor device, in particular, a wireless tag of the present invention will be described with reference to FIGS. 20A to 20F.

According to the present invention, a semiconductor device which functions as a wireless tag can be formed. A wireless tag can be used in a wide variety of applications, and may be used by being mounted on objects such as bills, coins, securities, bearer bonds, certificates (driver's licenses, resident cards, and the like, see FIG. 20A), containers for wrapping objects (wrapping paper, bottles, and the like, see FIG. 20C), recording media (DVD software, video tapes, and the like, see FIG. 20B), vehicles (bicycles and the like, see FIG. 20D), personal belongings (bags, glasses, and the like), foods, plants, clothes, lifestyle goods, electronic devices, and shipping tags of baggage (see FIGS. 20E and 20F). Note that the wireless tag is indicated by reference numeral 2000 in each of FIGS. 20A to 20F.

Note that the electronic device indicates a liquid crystal display device, an EL display device, a television unit (also simply referred to as a TV, a TV receiver, or a television receiver), a cellular phone, and the objects shown in Embodiment Mode 9, for example. The semiconductor device may also be mounted on animals, human body, and the like.

The wireless tag is attached to a surface of an object, or embedded to be fixed on an object. For example, the wireless tag may be embedded in paper of a book, or an organic resin of a container for wrapping an object. Counterfeits can be prevented by providing an RFID tag on the bills, coins, securities, bearer bonds, certificates, and the like. Further, by providing an RFID tag in containers for wrapping objects, recording media, personal belongings, foods, clothes, lifestyle goods, electronic devices, and the like, efficiency of an inspection system or the like can be improved. The wireless tag that can be formed according to the present invention has high reliability though it is inexpensive, and can be applied to a wide variety of objects.

When a wireless tag that can be formed according to the present invention is applied to a management system or a distribution system of articles, the system can have high functionality. For example, information which is recorded in an RFID tag provided in a shipping tag is read by a reader/writer provided near a conveyor belt, then information about a distribution process, a delivery destination, or the like is read out, and inspection of merchandise or distribution of goods can be easily carried out.

As described above, the present invention can be widely applied to and used for a wide variety of objects. Note that this embodiment mode can be implemented in combination with any of Embodiment Modes 1 to 9, as appropriate.

Embodiment Mode 11

In this embodiment mode, an example of a manufacturing method of a thin film transistor which can be used for a semiconductor device of the present invention will be described. Note that in a manufacturing method of a thin film transistor described in this embodiment mode, an opening for connection between a semiconductor layer and a wiring is formed in a self-aligned manner.

First, a semiconductor substrate manufactured by the method described in Embodiment Mode 1, or the like is prepared (not illustrated). Then, a semiconductor layer in the semiconductor substrate is patterned into an island shape to form an island-shaped semiconductor layer 2306, and then an insulating layer 2308 serving as a gate insulating layer and a conductive layer serving as a gate electrode (or a wiring) are formed in this order. In this embodiment mode, the conductive layer serving as a gate electrode is formed to have a two layer structure; however, the present invention is not limited thereto. Here, the insulating layer 2308 can be formed using a material such as silicon oxide, silicon oxynitride, silicon nitride oxide or silicon nitride by a CVD method, a sputtering method, or the like. The thickness of the insulating layer 2308 may be greater than or equal to about 5 nm and less than or equal to about 100 nm. The conductive layer can be formed using a material such as tantalum (Ta), tungsten (W), titanium (Ti), molybdenum (Mo), aluminum (Al), copper (Cu), chromium (Cr), or niobium (Nb) by a CVD method, a sputtering method, or the like. The total thickness of the two conductive layers may be greater than or equal to about 100 nm and less than or equal to about 500 nm. Note that in this embodiment mode, a case will be described in which the insulating layer 2308 is formed using silicon oxide (with a thickness of 20 nm), the conductive layer (as a lower layer) is formed using tantalum nitride (with a thickness of 50 nm) and the conductive layer (as an upper layer) is formed using tungsten (with a thickness of 200 nm).

Note that in order to control the threshold voltage of the thin film transistor, an impurity imparting a p-type conductivity, such as boron, aluminum, or gallium or an impurity imparting an n-type conductivity, such as phosphorus or arsenic, may be added into the above-described semiconductor layer. For example, in the case of adding boron as an impurity imparting p-type conductivity, boron may be added at a concentration of greater than or equal to $5 \times 10^{16}$ atoms/cm$^3$ and less than or equal to $1 \times 10^{17}$ atoms/cm$^3$. Further, hydrogenation treatment may be performed on the semiconductor layer. The hydrogenation treatment is performed for example, at 350° C. for approximately two hours in a hydrogen atmosphere.

Next, the conductive layer serving as a gate electrode is patterned. Note that in a manufacturing method of a thin film transistor in this embodiment mode, patterning is performed on the conductive layer at least twice, and here, first patterning is performed. As a result of this, a conductive layer 2310 and a conductive layer 2312 which are larger than the gate electrode which is to be formed finally are formed. Here, the phrase "larger" herein means a size with which a resist mask for forming the gate electrode in a second patterning can be formed in accordance with the position of the conductive layer 2310 and the conductive layer 2312. Note that the first patterning and the second patterning may be performed on a region overlapping with the island-shape semiconductor layer 2306 which is a conductive layer and the first patterning and the second patterning do not need to be performed on an entire surface of the conductive layer.

Figure 23A:
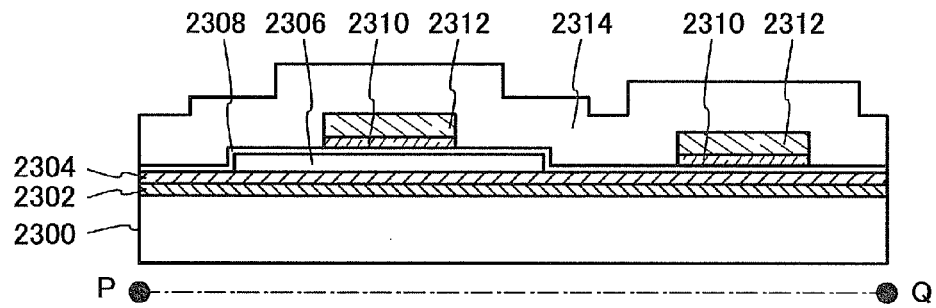
FIGS. 23A to 23D are cross-sectional views illustrating an example of a manufacturing method of a thin film transistor.
Figure 25A:
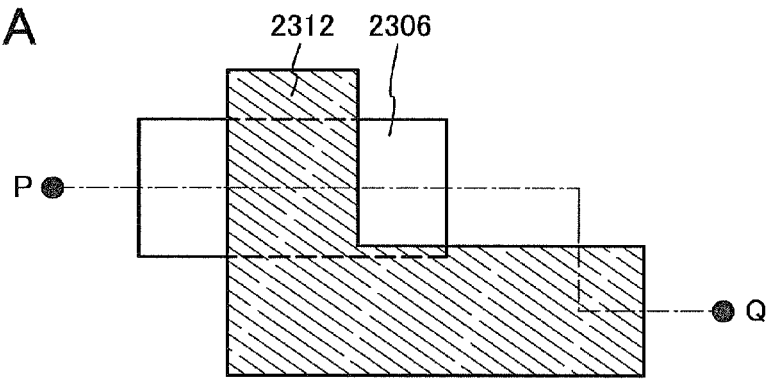
FIGS. 25A to 25D are plane views illustrating an example of a manufacturing method of a thin film transistor.

After that, an insulating layer 2314 is formed so as to cover the insulating layer 2308, the conductive layer 2310, and the conductive layer 2312 (see FIG. 23A and FIG. 25A). Here, the insulating layer 2314 can be formed using a material such as silicon oxide, silicon oxynitride, silicon nitride oxide, silicon nitride, hafnium oxide or aluminum oxide by a CVD method, a sputtering method, or the like. The thickness of the insulating layer 2314 is preferably from about 0.5 μm to about 2 μm. In this embodiment mode, as an example, a case where the insulating layer 2314 is formed using silicon oxide (with a thickness of 1 μm) will be described. Note that in this embodiment mode, description is made using a semiconductor substrate having a structure in which an insulating layer 2302, an insulating layer 2304, and the semiconductor layer are formed in this order over a base substrate 2300; however, the present invention is not construed as being limited thereto.

Figure 23B:
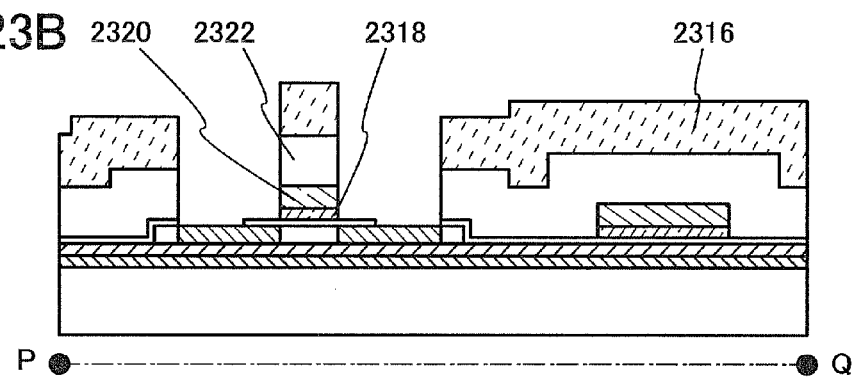
Figure 23C:
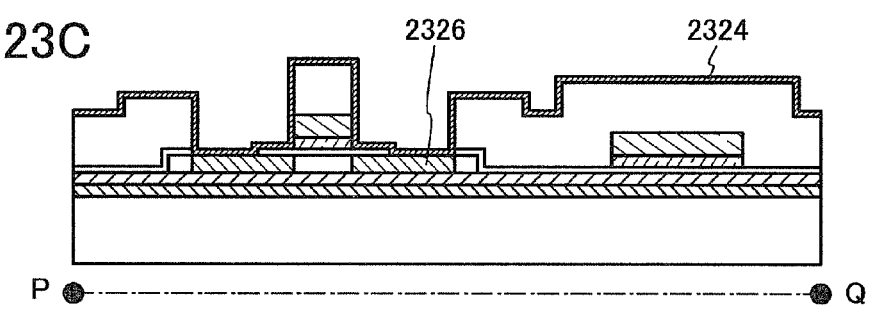
Figure 23D:
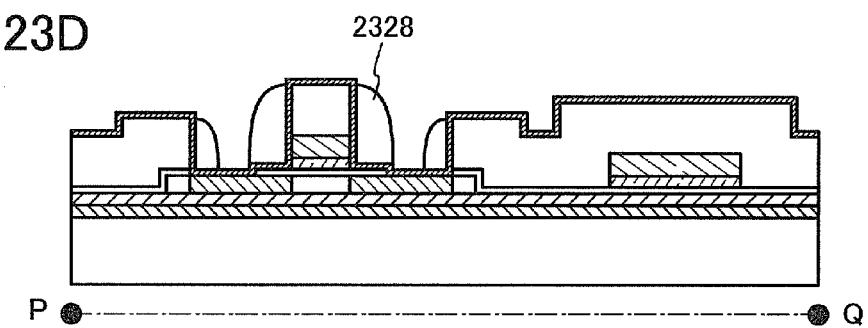
Figure 24C:
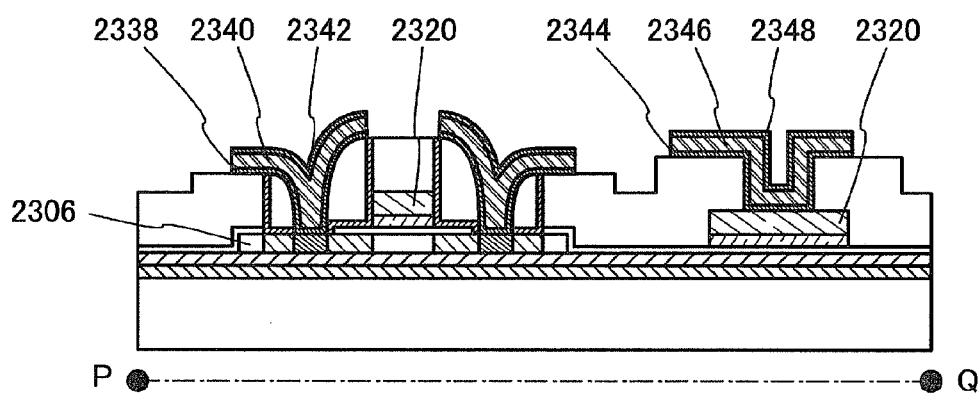
Figure 25B:
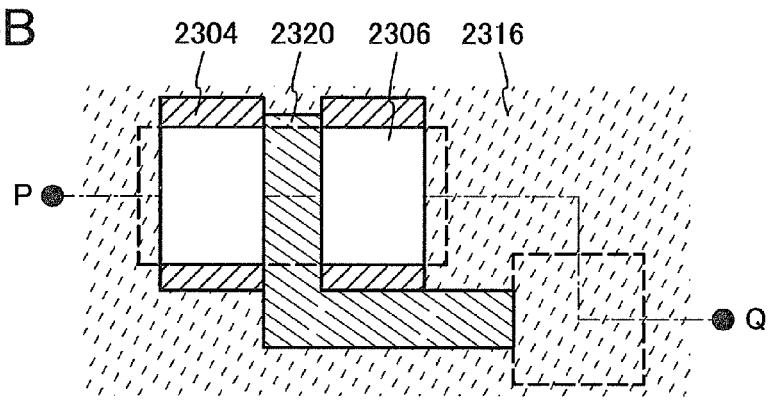

Note that FIG. 23A is a view corresponding to a cross section taken along a line P-Q of FIG. 25A which is a plane view. Similarly, FIG. 23B, FIG. 23D and FIG. 24C are views corresponding to cross sections taken along lines P-Q of FIG. 25B, FIG. 25C and FIG. 25D, respectively. In the plane views illustrated in FIG. 25A to 25D, some components in the corresponding cross-sectional views are omitted for simplicity.

Next, a resist mask 2316 for forming a gate electrode, which is used in patterning, is formed over the insulating layer 2314. The patterning corresponds to the second patterning of the first patterning and the second patterning which are performed on the conductive layer. The resist mask 2316 can be formed in such a manner that a resist material which is a photosensitive substance is applied, and then a pattern is exposed to light. After formation of the resist mask 2316, the conductive layer 2310, the conductive layer 2312 and the insulating layer 2314 are patterned with the use of the resist mask 2316. Specifically, the insulating layer 2314 is selectively etched to form an insulating layer 2322, and then the conductive layer 2310 and the conductive layer 2312 are selectively etched to form a conductive layer 2318 and a conductive layer 2320 which serve as a gate electrode (see FIG. 23B and FIG. 25B). Here, when the insulating layer 2314 is selectively etched, part of the insulating layer 2308 which serves as a gate insulating layer is also etched at the same time.

Next, the resist mask 2316 is removed, and then, an insulating layer 2324 is formed so as to cover the island-shaped semiconductor layer 2306, the insulating layer 2308, the conductive layer 2318, the conductive layer 2320, the insulating layer 2322, and the like The insulating layer 2324 serves as a barrier layer at the time of forming sidewalls later. Although the insulating layer 2324 can be formed using a material such as silicon oxide, silicon oxynitride, silicon nitride oxide, silicon nitride, hafnium oxide, aluminum oxide or tantalum oxide, it is preferable to form the insulating layer 2324 using a material having etching selectivity to a material used for the sidewalls later so that the insulating layer 2324 serves as a barrier layer. The thickness of the insulating layer 2324 may be greater than or equal to about 10 nm and less than or equal to about 200 nm. In this embodiment mode, the insulating layer 2324 is formed using silicon nitride (with a thickness of 50 nm).

After formation of the insulating layer 2324, an impurity element imparting one conductivity type is added to the island-shaped semiconductor layer 2306 using the conductive layer 2318, the conductive layer 2320, the insulating layer 2322, and the like as masks. In this embodiment mode, an impurity element imparting n-type conductivity (e.g. phosphorus or arsenic) is added to the island-shaped semiconductor layer 2306. By addition of the impurity element, impurity regions 2326 are formed in the island-shaped semiconductor layer 2306 (see FIG. 23C). Note that in this embodiment mode, after formation of the insulating layer 2324, an impurity element imparting n-type conductivity is added; however, the present invention is not limited thereto. For example, after or before removal of the resist mask, the impurity element may be added, and then the insulating layer 2324 may be formed. An impurity element to be added can also be an impurity element imparting p-type conductivity.

Figure 25C:
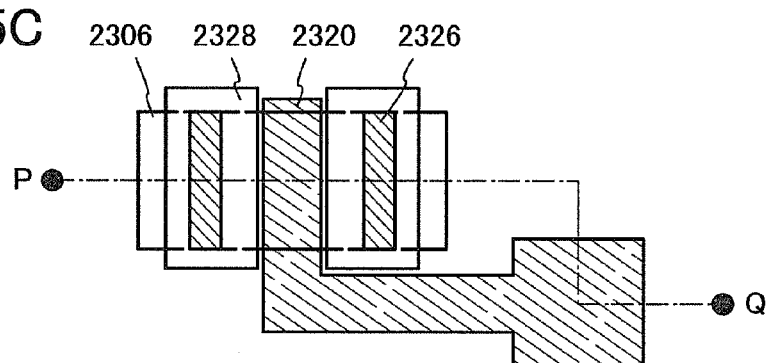

Next, sidewalls 2328 are formed (see FIG. 23D and FIG. 25C). The sidewalls 2328 can be formed in such a manner that an insulating layer is formed so as to cover the insulating layer 2324 and anisotropic etching mainly in a perpendicular direction is performed on the insulating layer. This is because the insulating layer is selectively etched by the above-described anisotropic etching. The insulating layer can be formed using a material such as silicon oxide, silicon oxynitride, silicon nitride oxide, silicon nitride, hafnium oxide, aluminum oxide or tantalum oxide by a CVD method, a sputtering method, or the like. Further, a film containing an organic material may be formed by a spin coating method, or the like. In this embodiment mode, silicon oxide is used as a material for the insulating layer. That is, the sidewalls 2328 are formed using silicon oxide. In addition, as an etching gas, a mixed gas of $CHF_3$ and helium can be used, for example. Note that the step of forming the sidewalls 2328 is not limited thereto.

Next, an impurity element imparting one conductivity type is added to the island-shaped semiconductor layer 2306 using the insulating layer 2322, the sidewalls 2328, or the like as masks. Note that the impurity element which is added to the island-shaped semiconductor layer 2306 has the same conductivity type as the impurity element which has been added in the previous step. Here, the impurity element is added to the island-shaped semiconductor layer 2306 at a higher concentration than that of the impurity element which has been added in the previous step. That is, in this embodiment mode, an impurity element imparting n-type conductivity is added.

By addition of the above-described impurity element, a channel formation region 2330, low-concentration impurity regions 2332, and high-concentration impurity regions 2334 are formed in the island-shaped semiconductor layer 2306. The low-concentration impurity regions 2332 each serve as an LDD (lightly doped drain) region and the high-concentration impurity regions 2334 each serve as a source or a drain.

Figure 24A:
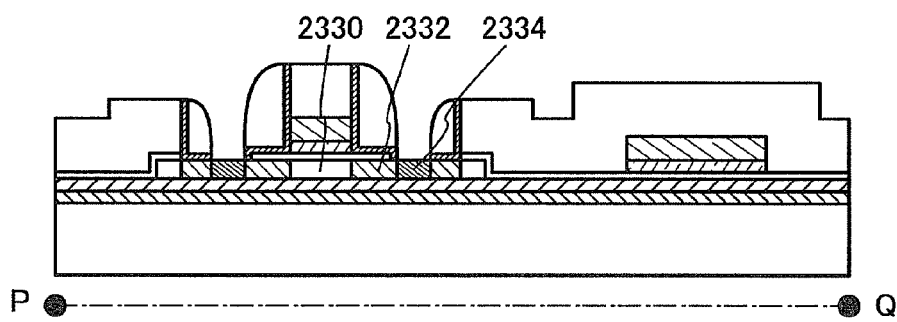
FIGS. 24A to 24C are cross-sectional views illustrating an example of a manufacturing method of a thin film transistor.

Next, the insulating layer 2324 is etched to form openings (contact holes) which reach the high-concentration impurity regions (see FIG. 24A). Since the insulating layer 2322 and the sidewalls 2328 are formed using silicon oxide and the insulating layer 2324 is formed using silicon nitride in this embodiment mode, the insulating layer 2324 can be selectively etched to form the openings.

Figure 24B:
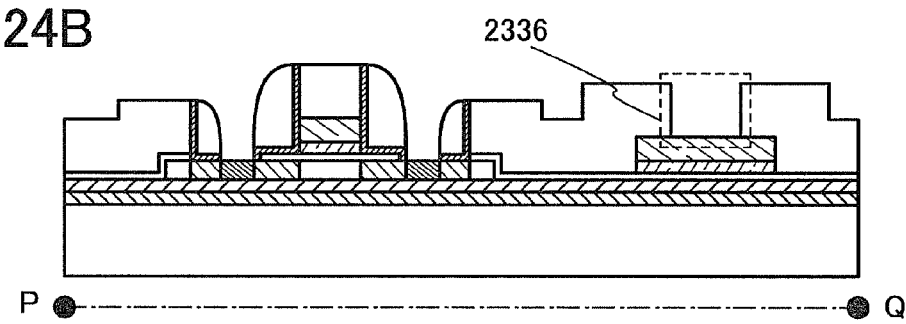

After formation of the openings which reach the high-concentration impurity regions, the insulating layer 2314 is selectively etched to form an opening 2336 (see FIG. 24B). The opening 2336 is formed larger than the opening which reaches the high-concentration impurity region. This is because a minimum line width of the opening 2336 is determined in accordance with a process rule or a design rule, while the opening which reaches the high-concentration impurity region is miniaturized by being formed in a self-aligned manner.

After that, a conductive layer which is in contact with the high-concentration impurity regions 2334 in the island-shaped semiconductor layer 2306 and the conductive layer 2320 is formed in the openings which reach the high-concentration impurity regions and the opening 2336. The conductive layer can be formed by a CVD method, a sputtering method, or the like. As a material of the conductive layer, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described metal as the main component or a compound containing the above-described metal may be used. The conductive layer may have a single-layer structure or a stacked-layer structure. In this embodiment mode, a case is described in which the conductive layer has a three-layer structure of titanium, aluminum and titanium.

Figure 25D:
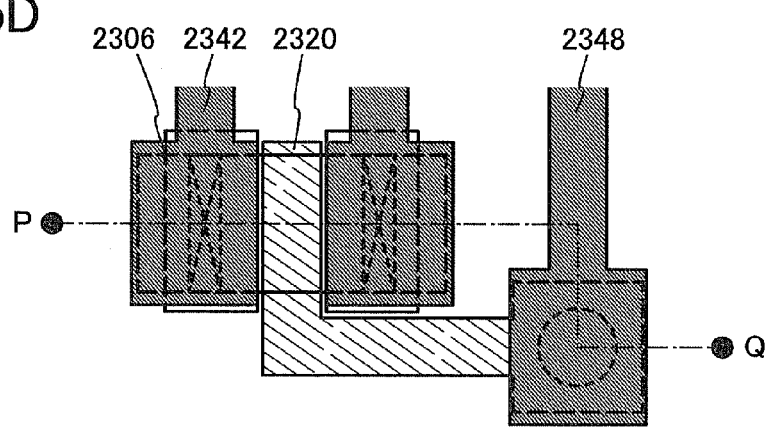

The above-described conductive layer is selectively etched to form a conductive layer 2338, a conductive layer 2340 and a conductive layer 2342 which serve as a source or drain electrode (a source or drain wiring), a conductive layer 2344, a conductive layer 2346 and a conductive layer 2348 which are connected to the conductive layer 2320 and serve as a wiring (see FIG. 24C and FIG. 25D). Through the above steps, a thin film transistor in which a connection between the island-shaped semiconductor layer 2306 and the conductive layer serving as the source or drain electrode is formed in a self-aligned manner is completed.

Since a connection relationship of the source or drain electrode can be formed in a self-aligned manner by the method described in this embodiment mode, a structure of the transistor can be miniaturized. That is, the degree of integration of semiconductor elements can be increased. Further, since a length of the channel or the low-concentration impurity region can be determined in a self-aligned manner, variation in channel resistance, which is a problem in miniaturization, can be suppressed. That is, a transistor with excellent characteristics can be provided.

This embodiment mode can be implemented in combination with any of Embodiment Modes 1 to 10, as appropriate. This application is based on Japanese Patent Application serial no. 2008-007032 filed with Japan Patent Office on Jan. 16, 2008, the entire contents of which are hereby incorporated by reference.

What is claimed is:
1. A manufacturing apparatus of a semiconductor substrate comprising:
 a substrate supporting base where a plurality of openings is provided;

a plurality of supporting mechanisms capable of supporting a first substrate having corner portions, the plurality of supporting mechanisms being provided in the plurality of openings; and a plurality of raising and lowering mechanisms which changes a distance between the first substrate and a second substrate provided over the first substrate by raising and lowering the plurality of supporting mechanisms and press the first substrate to the second substrate so that the first substrate is bonded to the second substrate, wherein the plurality of supporting mechanisms is configured to bring one of the corner portions of the first substrate into contact with the second substrate, when the first substrate and the second substrate are bonded to each other.

2. The manufacturing apparatus of a semiconductor substrate according to claim 1, further comprising a mechanism configured to perform heat treatment on the first substrate and the second substrate.

3. The manufacturing apparatus of a semiconductor substrate according to claim 1, further comprising a plurality of position control mechanisms configured to control a relative positional relationship between the first substrate and the second substrate by controlling positions of the plurality of supporting mechanisms and the plurality of raising and lowering mechanisms with respect to the substrate supporting base.

4. The manufacturing apparatus of a semiconductor substrate according to claim 1,
wherein the substrate supporting base includes a plurality of arrangement regions, and
wherein one of the plurality of arrangement regions is configured to be provided with the first substrate.

5. The manufacturing apparatus of a semiconductor substrate according to claim 1, wherein the plurality of raising and lowering mechanisms is capable of raising and lowing the plurality of supporting mechanisms provided in the plurality of openings independently.

6. The manufacturing apparatus of a semiconductor substrate according to claim 1, wherein the plurality of raising and lowering mechanisms is configured to raise and lower the plurality of supporting mechanisms with the use of pressure of gas.

7. The manufacturing apparatus of a semiconductor substrate according to claim 1, wherein portions of the plurality of supporting mechanisms which are in contact with the first substrate comprise an elastic body.

8. The manufacturing apparatus of a semiconductor substrate according to claim 1, further comprising:
a first treatment chamber where ultrasonic cleaning and treatment using a chemical solution for attaching a hydrophilic group are configured to be performed on the first substrate;
a second treatment chamber where ultrasonic cleaning and treatment using a chemical solution for attaching a hydrophilic group are configured to be performed on the second substrate;
a first transfer mechanism configured to transfer the first substrate; and
a second transfer mechanism configured to transfer the second substrate.

9. A manufacturing apparatus of a semiconductor substrate comprising:
a substrate supporting base comprising a plurality of substrate arrangement regions, the plurality of substrate arrangement regions each configured to be provided with a first substrate having corner portions;
a plurality of openings in each of the plurality of substrate arrangement regions;
a plurality of lift pins in the plurality of openings; and
a plurality of raising and lowering mechanisms configured to raise and lower the plurality of lift pins, the plurality of raising and lowering mechanisms being configured to press the first substrate to a second substrate so that the first substrate is bonded to the second substrate,
wherein the plurality of lift pins is configured to bring one of the corner portions of the first substrate into contact with the second substrate, when the first substrate and the second substrate are bonded to each other.

10. The manufacturing apparatus of a semiconductor substrate according to claim 9, further comprising a mechanism configured to perform heat treatment.

11. The manufacturing apparatus of a semiconductor substrate according to claim 9, further comprising position control mechanisms configured to control positions of the plurality of lift pins and the plurality of raising and lowering mechanisms with respect to the substrate supporting base.

12. The manufacturing apparatus of a semiconductor substrate according to claim 9, wherein the plurality of raising and lowering mechanisms is capable of raising and lowering the plurality of lift pins independently.

13. The manufacturing apparatus of a semiconductor substrate according to claim 9, wherein the plurality of raising and lowering mechanisms is configured to raise and lower the plurality of lift pins with the use of pressure of gas.

14. The manufacturing apparatus of a semiconductor substrate according to claim 9, wherein portions of the plurality of lift pins which are in contact with the first substrate comprise an elastic body.

15. The manufacturing apparatus of a semiconductor substrate according to claim 9, further comprising:
a first treatment chamber where ultrasonic cleaning and treatment using a chemical solution for attaching a hydrophilic group are configured to be performed on the first substrate;
a second treatment chamber where ultrasonic cleaning and treatment using a chemical solution for attaching a hydrophilic group are configured to be performed on the second substrate;
a first transfer mechanism configured to transfer the first substrate; and
a second transfer mechanism configured to transfer the second substrate.

16. The manufacturing apparatus of a semiconductor substrate according to claim 1, wherein the plurality of supporting mechanisms is configured to apply pressure to the one corner portion of the first substrate to bond the first substrate and the second substrate from the one corner portion of the first substrate.

17. The manufacturing apparatus of a semiconductor substrate according to claim 1, wherein the plurality of supporting mechanisms is configured to lower the second substrate with a slight inclination to bond the first substrate and the second substrate from the one corner portion of the first substrate.

18. The manufacturing apparatus of a semiconductor substrate according to claim 9, wherein the plurality of lift pins is configured to apply pressure to the one corner portion of the first substrate to bond the first substrate and the second substrate from the one corner portion of the first substrate.

19. The manufacturing apparatus of a semiconductor substrate according to claim 9, wherein the plurality of lift pins is configured to lower the second substrate with a slight inclination to bond the first substrate and the second substrate from the one corner portion of the first substrate.

\* \* \* \* \*